United States Patent
Kurokawa et al.

(10) Patent No.: US 9,083,290 B2
(45) Date of Patent: Jul. 14, 2015

(54) AMPLIFIER APPARATUS, SIGNAL PROCESSING APPARATUS, RADIO COMMUNICATION APPARATUS, CONNECTOR MOUNTING STRUCTURE, AND COAXIAL CONNECTOR

(75) Inventors: Yorinao Kurokawa, Osaka (JP); Tatsuhiro Shimura, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 443 days.

(21) Appl. No.: 13/522,470

(22) PCT Filed: Feb. 22, 2011

(86) PCT No.: PCT/JP2011/053814
§ 371 (c)(1),
(2), (4) Date: Jul. 16, 2012

(87) PCT Pub. No.: WO2011/105359
PCT Pub. Date: Sep. 1, 2011

(65) Prior Publication Data
US 2012/0294201 A1 Nov. 22, 2012

(30) Foreign Application Priority Data

Feb. 24, 2010 (JP) ................................. 2010-038276
Jul. 21, 2010 (JP) ................................. 2010-164207
Oct. 5, 2010 (JP) ................................. 2010-225927
Dec. 28, 2010 (JP) ................................. 2010-293654

(51) Int. Cl.
*H04B 1/10* (2006.01)
*H03F 3/195* (2006.01)
(Continued)

(52) U.S. Cl.
CPC ................. *H03F 3/195* (2013.01); *H01R 24/50* (2013.01); *H03F 1/0227* (2013.01);
(Continued)

(58) Field of Classification Search
CPC ............ H04B 1/30; H04B 15/06; H04B 1/18; H03F 1/08; H03F 1/16; H03F 1/3211; H03F 2200/294; H03F 2200/372; H03D 3/008; H03D 7/00; H03D 7/02; H03D 2200/009
USPC .......................... 455/310–311, 317, 300–301
See application file for complete search history.

(56) References Cited

U.S. PATENT DOCUMENTS 4,742,569 A * 5/1988 Yokoyama et al. ........... 455/301
4,991,228 A * 2/1991 Ohta et al. .................... 455/323
(Continued)

FOREIGN PATENT DOCUMENTS

JP 62-131633 A 6/1987
JP 10-223285 A 8/1998
(Continued)

OTHER PUBLICATIONS

Japanese Office Action of the corresponding Japanese Patent Application No. 2010-038276, dated Aug. 1, 2013.

*Primary Examiner* — Lana N Le
(74) *Attorney, Agent, or Firm* — Global IP Counselors, LLP

(57) ABSTRACT

There is provided an amplifier apparatus and a signal processing apparatus that reduce a delay or distortion of a power supply voltage used for drain modulation. An amplifier apparatus is an amplifier apparatus that performs drain modulation, and includes a printed circuit board having a first surface and a second surface; an amplifier circuit disposed on the first surface; and a modulation power supply circuit that supplies a variable power supply voltage for performing drain modulation, to the amplifier circuit The modulation power supply circuit has an output portion that outputs the power supply voltage. The amplifier circuit has an input portion to which the power supply voltage is supplied. The output portion is located on the side of the second principal surface of the printed circuit board and is connected to the input portion through a conductor penetrating through the printed circuit board.

13 Claims, 48 Drawing Sheets

(51) Int. Cl.
*H03F 1/02* (2006.01)
*H03F 1/32* (2006.01)
*H03F 3/24* (2006.01)
*H01R 24/50* (2011.01)
*H01R 103/00* (2006.01)

(52) U.S. Cl.
CPC ............... *H03F 1/3247* (2013.01); *H03F 3/24* (2013.01); *H01R 2103/00* (2013.01); *H03F 2200/102* (2013.01); *H03F 2200/15* (2013.01); *H03F 2200/504* (2013.01)

(56) References Cited

U.S. PATENT DOCUMENTS 5,717,688 A * 2/1998 Belanger et al. ............. 370/331
6,501,945 B1 * 12/2002 Chien .......................... 455/296
8,467,760 B2 * 6/2013 Mirzaei et al. ............... 455/293
2003/0032401 A1 * 2/2003 Woo et al. .................... 455/217

FOREIGN PATENT DOCUMENTS

| | | |
|---|---|---|
| JP | 2002-64339 A | 2/2002 |
| JP | 2003-179507 A | 6/2003 |
| JP | 2005-236512 A | 9/2005 |
| JP | 2006-156118 A | 6/2006 |
| JP | 2008-177899 A | 7/2008 |
| JP | 2008-193298 A | 8/2008 |
| JP | 2008-193633 A | 8/2008 |
| JP | 2008-288058 A | 11/2008 |
| JP | 2009-232434 A | 10/2009 |

* cited by examiner

FIG. 32
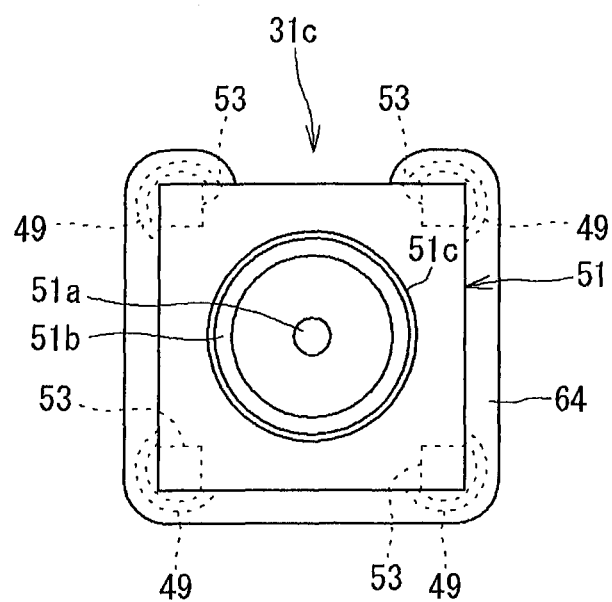

AMPLIFIER APPARATUS, SIGNAL PROCESSING APPARATUS, RADIO COMMUNICATION APPARATUS, CONNECTOR MOUNTING STRUCTURE, AND COAXIAL CONNECTOR

CROSS-REFERENCE TO RELATED APPLICATIONS

This U.S. National stage application of International Patent Application No. PCT/JP2011/053814, filed Feb. 22, 2011, which, in turn, claims priority under 35 U.S.C. §119(a) to Japanese Patent Application No. 2010-038276, filed in Japan on Feb. 24, 2010, Japanese Patent Application No. 2010-164207, filed in Japan on Jul. 21, 2010, Japanese Patent Application No. 2010-225927, filed in Japan on Oct. 5, 2010, and Japanese Patent Application No. 2010-293654, filed in Japan on Dec. 28, 2010, the entire contents of which are hereby incorporated herein by reference.

TECHNICAL FIELD

The present invention relates to an amplifier apparatus, a signal processing apparatus, a radio communication apparatus, a connector mounting structure, and a coaxial connector.

BACKGROUND ART

A device that requires a high power signal such as a transmitter used in a radio base station uses a power amplifier for signal amplification. However, a high power power amplifier has high power consumption and thus has problems such as heat generation and energy loss. Hence, to improve the efficiency of the amplifier, amplifiers (amplifier apparatuses) using drain modulation such as ET (Envelope Tracking) and EER (Envelope Elimination and Restoration) are developed.

For a modulation scheme for signals to be transmitted by the transmitter, a modulation scheme in which the amplitude of a carrier wave changes over time, such as OFDM (Orthogonal Frequency-Division Multiplexing), is used. In the transmitter that transmits such a signal in which the amplitude of a carrier wave changes by time change, if power that can amplify a transmit signal to its maximum peak value is continuously supplied to the amplifier at all times, then when a transmit signal having the maximum peak value is not required, energy loss or heat generation occurs. However, if supply of insufficient power is performed when a transmit signal having the maximum peak value is required, then the amplifier is saturated, and so forth, and thus signal amplification cannot be appropriately performed. Hence, an amplifier (amplifier apparatus) using drain modulation increases or decreases the power supply power of the amplifier according to a change in envelope component represented by an instantaneous peak value of an input signal, and thereby suppresses wasted power consumption and can perform efficient signal amplification.

Japanese Unexamined Patent Publication No. 2005-236512-A discloses an amplifier in which when an input signal is smaller than a predetermined value, signal amplification is performed by an amplifier for small signals, and when the input signal is larger than the predetermined value, signal amplification is performed by an amplifier that performs drain modulation. According to the amplifier according to the Japanese Unexamined Patent Publication No. 2005-236512-A, when dynamic range is wide and a large signal is amplified, high efficiency is obtained, and when a small signal is amplified, too, signal amplification with very little signal degradation can be performed.

SUMMARY

Technical Problem

An amplifier (amplifier apparatus) using drain modulation needs to change power supply power according to time change in envelope component represented by an instantaneous peak value of an input signal. However, a power supply path that supplies power from a power supply to the amplifier using drain modulation has an impedance component by a distributed constant, and thus, when the power supply path is unnecessarily long, it causes a delay or distortion of a power supply voltage used for drain modulation. In the amplifier using drain modulation, due to the delay or distortion of the power supply voltage, a voltage is not appropriately applied to the amplifier using drain modulation, causing a problem that appropriate operation of the amplifier is interfered with.

In addition, when the power supply path is set to be short in order to solve the problem, too, upon mounting an amplifier using drain modulation on a board, it is difficult in some cases to freely set the length of the power supply path because of design constrains such as disposition of elements or constrains in terms of a manufacturing process such as mounting of elements.

An object of the present invention as viewed from the above-described point of view (first point of view) is to provide an amplifier apparatus and a signal processing apparatus that reduce a delay or distortion of a power supply voltage used for drain modulation.

Meanwhile, a radio communication apparatus conventionally includes a supplying unit for supplying an operation clock to each unit constituting the radio communication apparatus, and is configured to allow each unit to operate at predetermined timing based on the operation clock supplied by the supplying unit (see, for example, Japanese Unexamined Patent Publication No. 2009-232434.

In recent years, with the increasing introduction of WiMAX which is a broadband wireless communication standard and a high-speed and large-capacity mobile wireless communication scheme such as LTE, due to the standards, radio communication apparatuses used for mobile phones and the like have had a tendency to require higher performance.

Hence, the inventors of the present invention have carried out development to achieve an improvement in minimum receive sensitivity among performances required for a radio communication apparatus. However, when sensitivity is improved, even very small noise which is not conventionally problematic is picked up with high sensitivity and thus there is a problem that large noise is included in a receive signal. In addition, in the first place, it is unknown where such noise comes from.

An object of the present invention as viewed from the above-described point of view (second point of view) is to reduce noise even when minimum receive sensitivity is improved in a radio communication apparatus.

(1) A first aspect of the present invention, as viewed from the first point of view, provides an amplifier apparatus performing drain modulation, the amplifier apparatus including: a board having a first principal surface and a second principal surface that face each other; an amplifier circuit disposed on the first principal surface; and a power supply circuit that supplies a variable power supply voltage for performing drain modulation, to the amplifier circuit, wherein the power supply circuit has an output portion that outputs the power supply voltage, the amplifier circuit has an input portion to which the power supply voltage is supplied, and the output portion is located on a side of the second principal surface of the board and is connected to the input portion through a conductor penetrating through the board.

Note that the conductor penetrating through the board may be a member other than the output portion or the input portion or may be a part of the output portion or a part of the input portion.

According to the amplifier apparatus according to the first aspect, the amplifier circuit is disposed on the first principal surface side of the board, and the output portion of the power supply circuit that outputs a power supply voltage is disposed on the second principal surface side of the board. Then, since the input portion of the amplifier circuit to which the power supply voltage is supplied and the output portion are connected to each other through the conductor penetrating through the board, the length of a power supply path from the power supply circuit to the amplifier circuit can be set independently of the mounting conditions of other elements disposed on the first principal surface of the board. Therefore, since an extra path of the power supply path can be reduced, irregularities in variable voltage used for drain modulation, such as a distortion, a delay, etc., caused by the influence of an impedance component present in the power supply path are reduced, making it possible to appropriately perform signal amplification using drain modulation.

(2) A second aspect of the present invention, as viewed from the first point of view, provides the amplifier apparatus particularly according to the first aspect, further including a structure having an electromagnetic cut-off function and disposed on the side of the second principal surface of the board, wherein the output portion is located in a hermetically sealed space defined by the board and the structure.

According to the amplifier apparatus according to the second aspect, since the output portion of the power supply circuit is located in the hermetically sealed space defined by the board and the structure having an electromagnetic cut-off function and disposed on the second principal surface side of the board, the output portion of the power supply circuit can be cut off from electromagnetic radiation. Therefore, an event can be prevented from occurring where a leakage signal generated from the output portion of the power supply circuit becomes a disturbing wave, resulting in elements located therearound operating erroneously.

(3) A third aspect of the present invention, as viewed from the first point of view, provides the amplifier apparatus particularly according to the first or second aspect, wherein the output portion is located immediately below a conductor connected to the input portion with the board interposed therebetween.

According to the amplifier apparatus according to the third aspect, the output portion of the power supply circuit disposed on the second principal surface side of the board is located immediately below the conductor connected to the input portion of the amplifier circuit disposed on the first principal surface side of the board with the board interposed therebetween. Hence, since there is no need to wire a power supply path on the second principal surface of the board, the length of the power supply path can be further reduced.

(4) A fourth aspect of the present invention, as viewed from the first point of view, provides a signal processing apparatus including: an amplifier apparatus according to any one of the first to third aspects; and a distortion compensating unit that corrects, based on an input signal to the amplifier apparatus and an output signal from the amplifier apparatus, the input signal.

According to the signal processing apparatus according to the fourth aspect, since the distortion compensating unit corrects, based on an input signal to an amplifier apparatus according to any one of the first to third aspects and an output signal from the amplifier apparatus, the input signal, a distortion of the output signal is compensated for, making it possible to improve input-output characteristics for a signal distortion. In addition, upon this distortion compensation, since an amplifier apparatus according to any one of the first to third aspects is used, an event can be prevented from occurring where irregularities occur in variable voltage used for drain modulation due to an impedance component present in the power supply path, resulting in the distortion compensating unit performing erroneous signal correction. Furthermore, when the output portion of the power supply circuit is disposed in the hermetically sealed space defined by the board and the structure having the electromagnetic cut-off function, a circuit, etc., used in the distortion compensating unit can be prevented from performing erroneous operation due to a disturbing wave generated from the output portion of the power supply circuit.

(5) The present invention, as viewed from the second point of view, provides a radio communication apparatus capable of receiving a radio signal, the radio communication apparatus including: a coaxial connector to which is connected a cable through which a receive signal flows; and a signal processing circuit board on which the coaxial connector is mounted. The coaxial connector includes a connector main body having an outer conductor provided on a surface thereof; and a signal terminal extending from the connector main body. The connector main body is disposed on a first surface of the signal processing circuit board and the signal terminal is inserted into a through-hole made in the signal processing circuit board. The outer conductor of the connector main body is soldered to ground formed near the connector main body, on the first surface of the signal processing circuit board.

The inventors of the present invention have carried out development to achieve an improvement in minimum receive sensitivity among required performances required for a radio communication apparatus. During the development, the inventors of the present invention have grasped that if receive sensitivity is increased to a required standard, then a harmonic of a clock oscillator for generating a reference clock is included in a receive signal of the radio communication apparatus as noise, and have identified that this noise is the cause of not being able to satisfy the minimum receive sensitivity in the required standard.

Specifically, the inventors of the present invention have found out that a harmonic of the clock oscillator which is not problematic noise in a conventional radio communication apparatus becomes an obstacle to obtaining required receive sensitivity as a result of attempting to further increase receive sensitivity.

Furthermore, in order to prevent such noise from getting on a receive signal, the inventors of the present invention have made an earnest study to identify a location where noise is likely to get on a receive signal. As a result, the inventors have succeeded in identifying the location where noise is likely to get on, thereby completing the present invention.

Here, a coaxial connector has a coaxial structure having an outer conductor outside an inner conductor through which a signal flows. In general, it is considered that the coaxial connector is resistant to noise, as with a coaxial cable. However, contrary to such common sense, surprisingly, the inventors of the present invention have found out that entry of noise into a receive signal has occurred at a location where the coaxial connector is mounted on the circuit board.

That is, in the case of a coaxial connector of a type (so-called a "DIP type") in which a signal terminal extending from a connector main body disposed on the board is inserted into a through-hole of the board, there is a very small gap (an area where there is no conductive material) between the board and the connector main body. It is estimated that noise entering through this very small gap reaches the signal terminal extending from the connector main body, whereby noise gets on a receive signal.

Hence, as in the above-described invention, by soldering the outer conductor of the connector main body to the ground formed on the board, at least a part of a gap between the connector main body and the first surface of the signal processing circuit board can be filled, making it possible to suppress the influence of noise.

(6) It is advantageous to adopt the present invention as viewed from the second point of view, since, in the case of the radio communication apparatus in which at least one of frequencies that are integer multiples of an oscillation frequency of an oscillator included in the radio communication apparatus is in a range of a frequency band of the radio signal, a frequency (harmonic) that is integer multiples of an oscillation frequency of an oscillator becomes noise.

(7) It is advantageous to adopt the present invention as viewed from the second point of view, since, in the case of the oscillator provided on the first surface of the signal processing circuit board, the oscillator and the connector main body are present on the same first surface, thereby to allow the frequency (harmonic) which is integer multiples of an oscillation frequency of an oscillator to easily enter as a noise.

(8) It is advantageous to adopt the present invention as viewed from the second point of view, since, in the case of at least a part of the connector main body being disposed on a resist formed on a surface of the first surface of the signal processing circuit board, the resist is an insulator and thus noise easily enters from a resist portion.

(9) It is preferred that a signal line connected to the signal terminal be formed on a second surface of the signal processing circuit board, the second surface being a back surface of the first surface. In the case where the signal line is provided on the second surface, noise entry is difficult to occur at a signal line location as compared with the case where the signal line is provided on the first surface, and thus noise entry location is limited to the location of the coaxial connector, whereby it is advantageous to adopt the present invention as viewed from the second point of view.

(10) In the case where an amplifier that amplifies the receive signal guided through the connector is connected to the signal line connected to the signal terminal, a very weak signal before amplified by the amplifier flows through a signal terminal of the connector. Accordingly, the signal terminal of the connector is greatly influenced by the noise as compared with the signal line through which the signal after amplified by the amplifier flows. By this, it is advantageous to adopt the present invention, as viewed from the second point of view in which the noise can be suppressed.

(11) It is preferred that the soldering of the outer conductor to the ground on the first surface be performed such that solder surrounds the signal terminal. By the solder surrounding the signal terminal, the noise is hard to enter into the signal terminal, whereby noise influence can be minimized.

(12) The present invention, as viewed from the second point of view, provides a radio communication apparatus capable of receiving a radio signal, the radio communication apparatus including: a coaxial connector to which is connected a cable through which a receive signal flows; and a signal processing circuit board on which the coaxial connector is mounted, wherein the coaxial connector includes: a connector main body of a coaxial structure having an inner conductor and an outer conductor; and a through-hole insertion terminal extending from the inner conductor of the connector main body, the through-hole insertion terminal extending from the inner conductor of the connector main body is inserted in a through-hole made in the signal processing circuit board, and an outer conductor of the connector main body does not have a through-hole insertion terminal extending from the outer conductor, and is surface-mounted on the circuit board.

(13) It is preferred that the outer conductor of the connector main body have a surface mounting terminal surface in a shape surrounding a perimeter of the through-hole insertion terminal extending from the inner conductor.

(14) It is preferred that the surface mounting terminal surface be formed to be flat all around on a bottom surface of the connector main body. In this case it is easy to solder the entire perimeter of a looplike surface mounting terminal surface.

(15) Another aspect of the present invention, as viewed from the second point of view, provides a mounting structure of a coaxial connector on a circuit board, wherein the coaxial connector includes a connector main body having an outer conductor provided on a surface thereof; and a signal terminal extending from the connector main body, and the connector main body is disposed on a first surface of the circuit board and the signal terminal is inserted into a through-hole made in the circuit board, and the outer conductor of the connector main body is soldered to ground formed near the connector main body, on the first surface of the circuit board.

(16) Still another aspect of the present invention, as viewed from the second point of view, provides a radio communication apparatus including a voltage controlled oscillator; and an amplifier that amplifies a receive signal, wherein a frequency that is an integer multiple of an oscillation frequency of the voltage controlled oscillator is included in a used frequency band, the radio communication apparatus including a shield that shields a path up to a point where a receive signal is inputted to the amplifier, from the voltage controlled oscillator.

In the radio communication apparatus configured in the above-described manner, a path up to the point where a very weak receive signal is inputted to the amplifier is a part vulnerable to noise. However, by providing a shield that shields the path from the voltage controlled oscillator, a harmonic of a frequency that is an integer multiple of an oscillation frequency radiated from the voltage controlled oscillator can be prevented from entering the input side of the amplifier.

(17) Further, in the radio communication apparatus according to the above-described (16), the shield may cover at least an input side of the amplifier.

In this case, by providing a shield that covers the input side of the amplifier which is a part vulnerable to noise, entry of noise can be surely prevented.

(18) Further, the radio communication apparatus according to the above-described (17) includes a duplexer for sharing an antenna between transmission and reception, wherein the amplifier is provided in a case of the duplexer, whereby the case may serve as the shield.

In this case, by the radio communication apparatus having the duplexer including the amplifier, a shield is integrated with a component, resulting in a simple configuration. In addition, since the manual operation of separately providing a shield is not necessary, the manufacturing process is also simple, making it possible to reduce overall cost. Moreover, even if a harmonic leaks from somewhere in the circuit instead of from the voltage controlled oscillator itself, the harmonic can be surely prevented from entering the amplifier. Note that since the duplexer is a component closest to the antenna side, the amplifier is also present on the antenna side, and thus, a distance from the voltage controlled oscillator is easily kept, which point is also advantageous to prevent entry of noise.

(19) Further, in the radio communication apparatus according to the above-described (16), the shield may be a cover that covers the voltage controlled oscillator.

In this case, radiation of a harmonic of a frequency that is an integer multiple of an oscillation frequency from the voltage controlled oscillator can be directly suppressed (a noise source is shielded and isolated).

(20) Further, in the radio communication apparatus according to the above-described (18) or (19), a board having the voltage controlled oscillator mounted thereon and an antenna-side component may be connected to each other by a cable, and a connector of the cable may be present on the board.

In this case, since resists which are an insulating material are provided on the surfaces of the board, there are circumstances in which noise easily enters through a resist present in a gap between the connector and the board. However, even under such circumstances, if, for example, the amplifier is present in the case of the duplexer, then a harmonic can be prevented from becoming noise.

(21) Further, in the radio communication apparatus according to the above-described (20), the connector and the voltage controlled oscillator may be provided on a same surface of the board.

In this case, a situation occurs where noise easily enters through, in particular, a resist present in a gap between the connector and the board. However, even in such a situation, if, for example, the amplifier is present in the case of the duplexer, then a harmonic can be prevented from becoming noise.

(22) Further, in the radio communication apparatus according to the above-described (20), the amplifier is provided closer to an antenna side than the connector, and the shield may cover at least an input side of the amplifier.

In this case, by providing a shield that covers the input side of the amplifier which is a part vulnerable to noise, entry of noise can be surely prevented. In addition, since the connector is present on the output side of the amplifier, such a low-level harmonic as a harmonic of the voltage controlled oscillator is not particularly problematic as noise.

BRIEF DESCRIPTION OF DRAWINGS

FIG. 32 is a plan view showing a mounting structure of a coaxial connector according to a second variant.

Figure 38A:
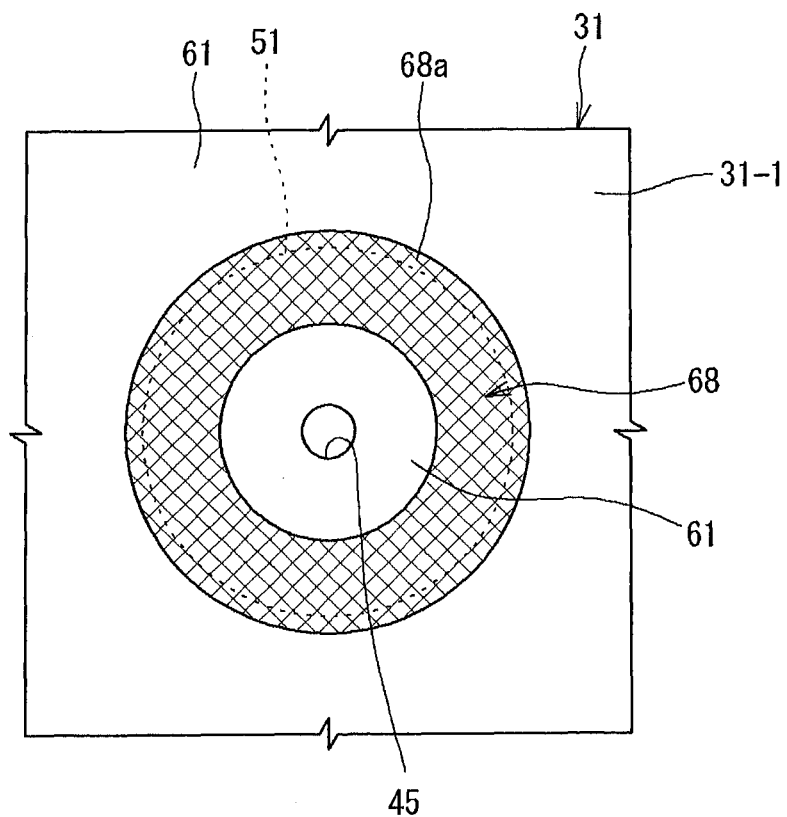
Figure 38B:
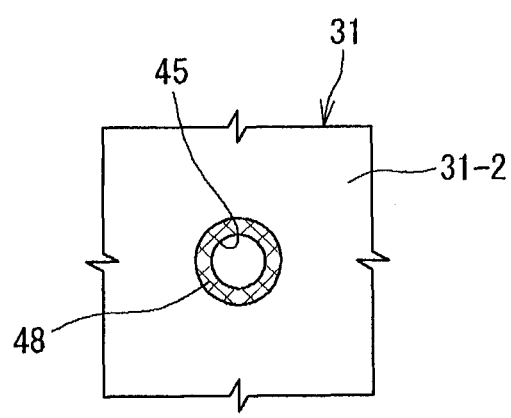

(a) of FIG. 38 is a plan view showing a through-hole and a land (a first surface of a board) in the fourth variant and is a plan view showing a through-hole and a land (a second surface of the board) in the fourth variant.

Figure 39:
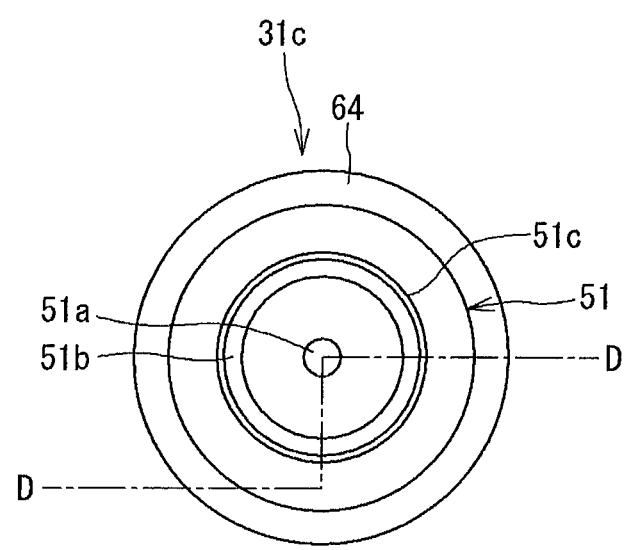

FIG. 39 is a plan view showing a mounting structure of the coaxial connector according to the fourth variant.

Figure 40:
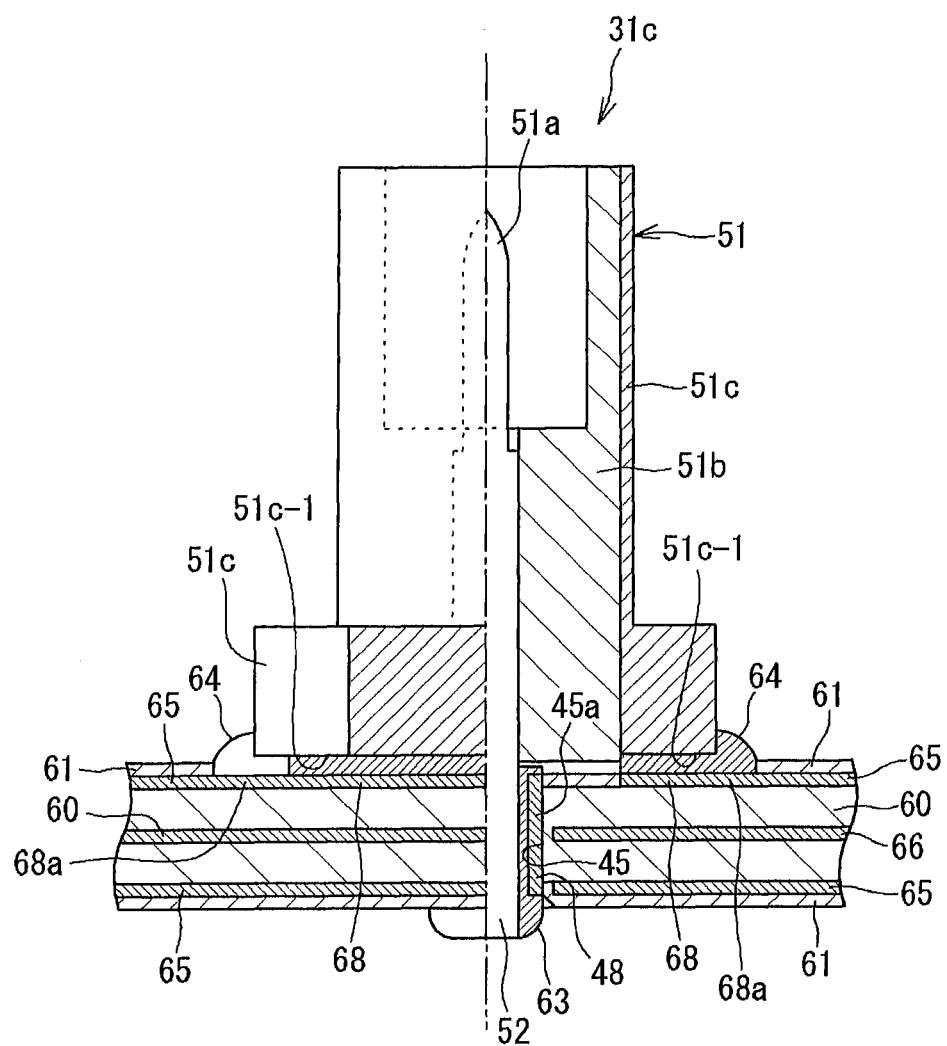

FIG. 40 is a cross-sectional view along line D-D of FIG. 39.

Figure 41:
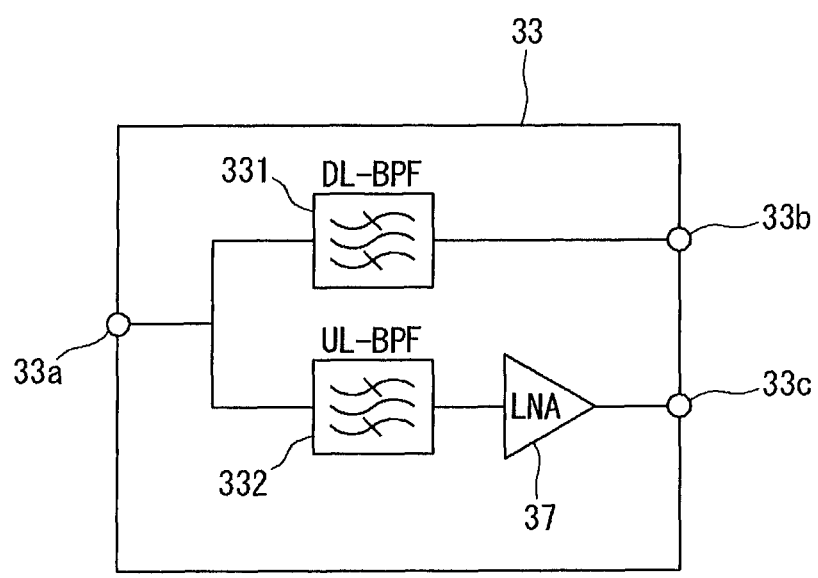

FIG. 41 is a diagram showing a part of an internal circuit of a duplexer in chapter 3.

Figure 42:
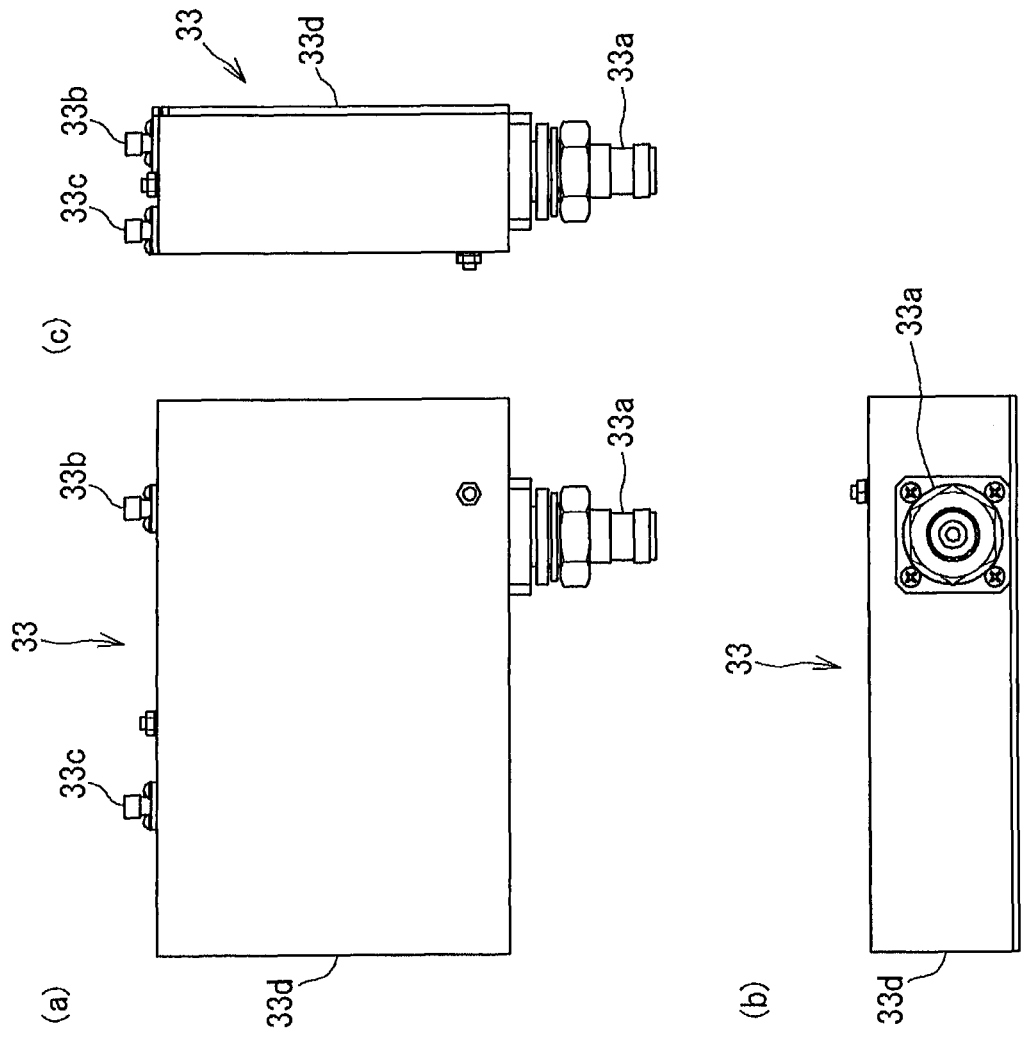

FIG. 42 is a diagram showing three-side external appearances of the duplexer which is an example of an actual product, and when (a) of FIG. 42 is a front view, (b) of FIG. 42 is a bottom view and (c) of FIG. 42 is a side view.

Figure 43:
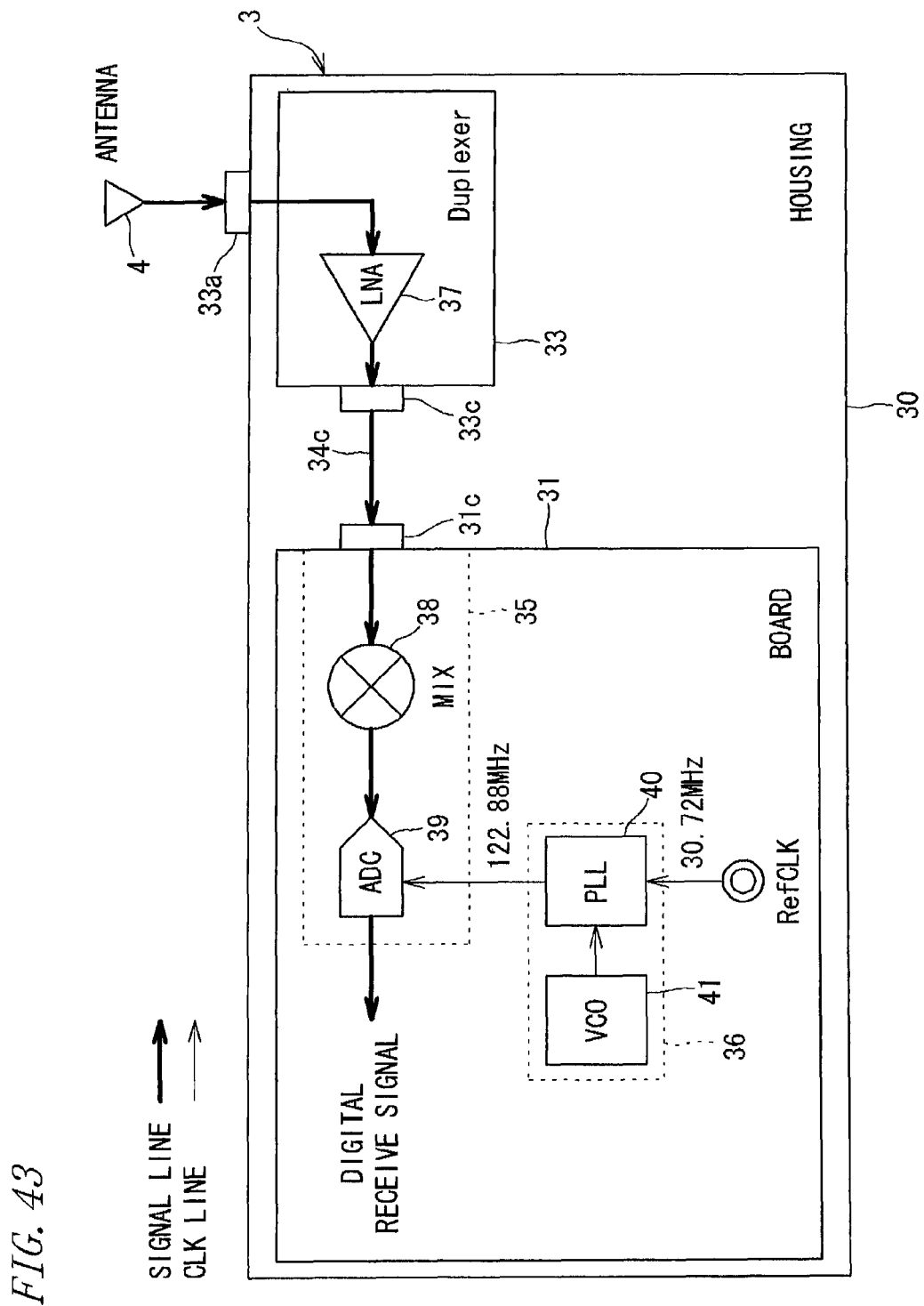

FIG. 43 is a diagram showing a circuit configuration of a receiving system of radio equipment in a radio communication apparatus according to a first embodiment in chapter 3.

Figure 44:
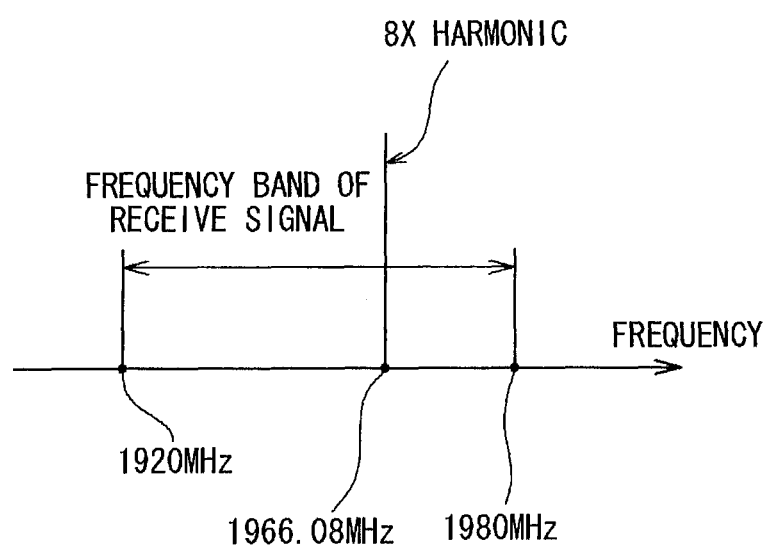

FIG. 44 is a diagram showing a state in which an 8× wave of an oscillation frequency (245.76 MHz) outputted from a voltage controlled oscillator is included in the range of 1920 MHz to 1980 MHz which is the frequency band of a receive signal.

Figure 45:
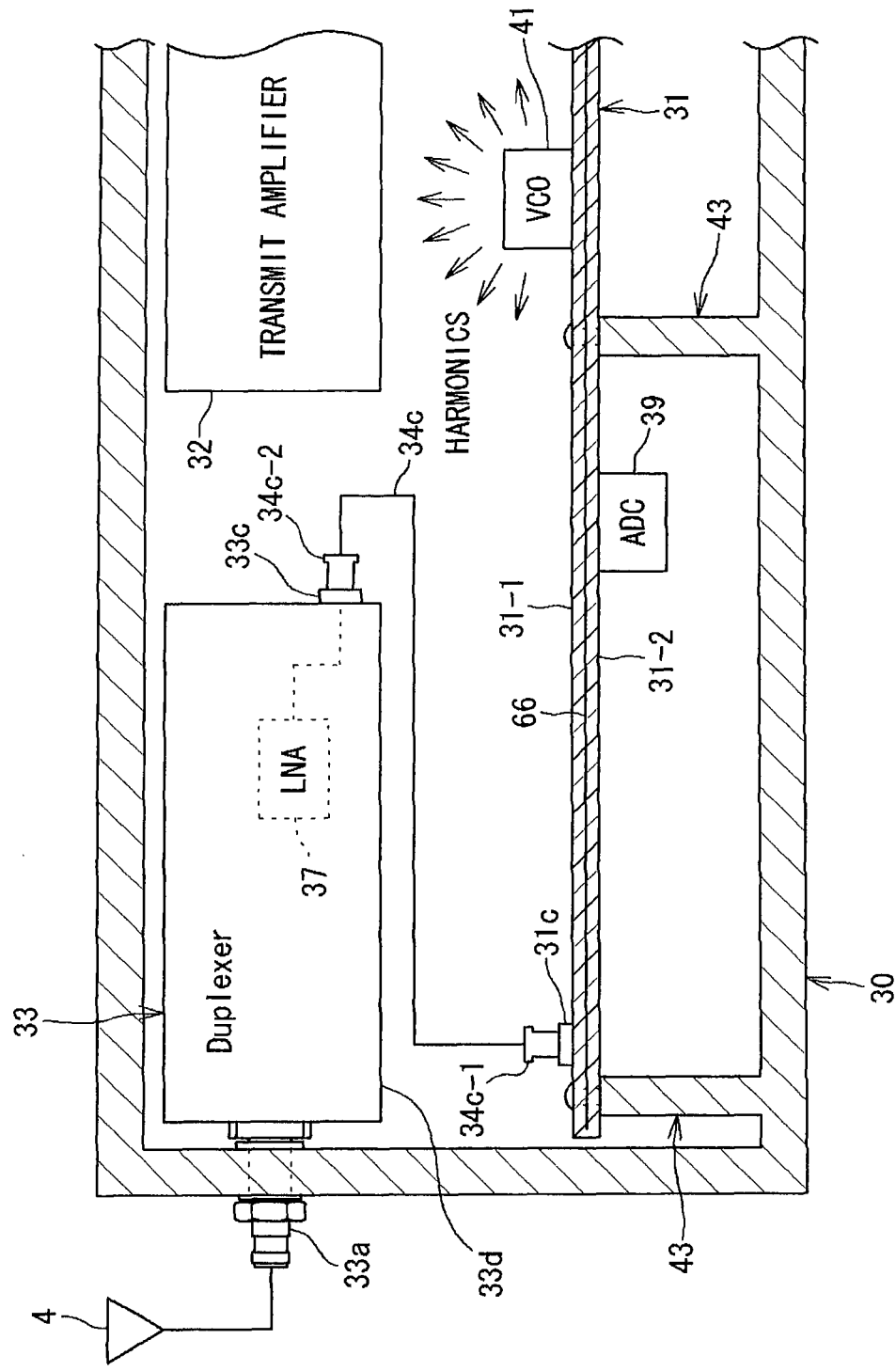

FIG. 45 is a cross-sectional view showing disposition of main components in a housing of the radio equipment which is a part of the radio communication apparatus according to the first embodiment in chapter 3, and disposition of circuit components, etc., provided on a board.

Figure 46:
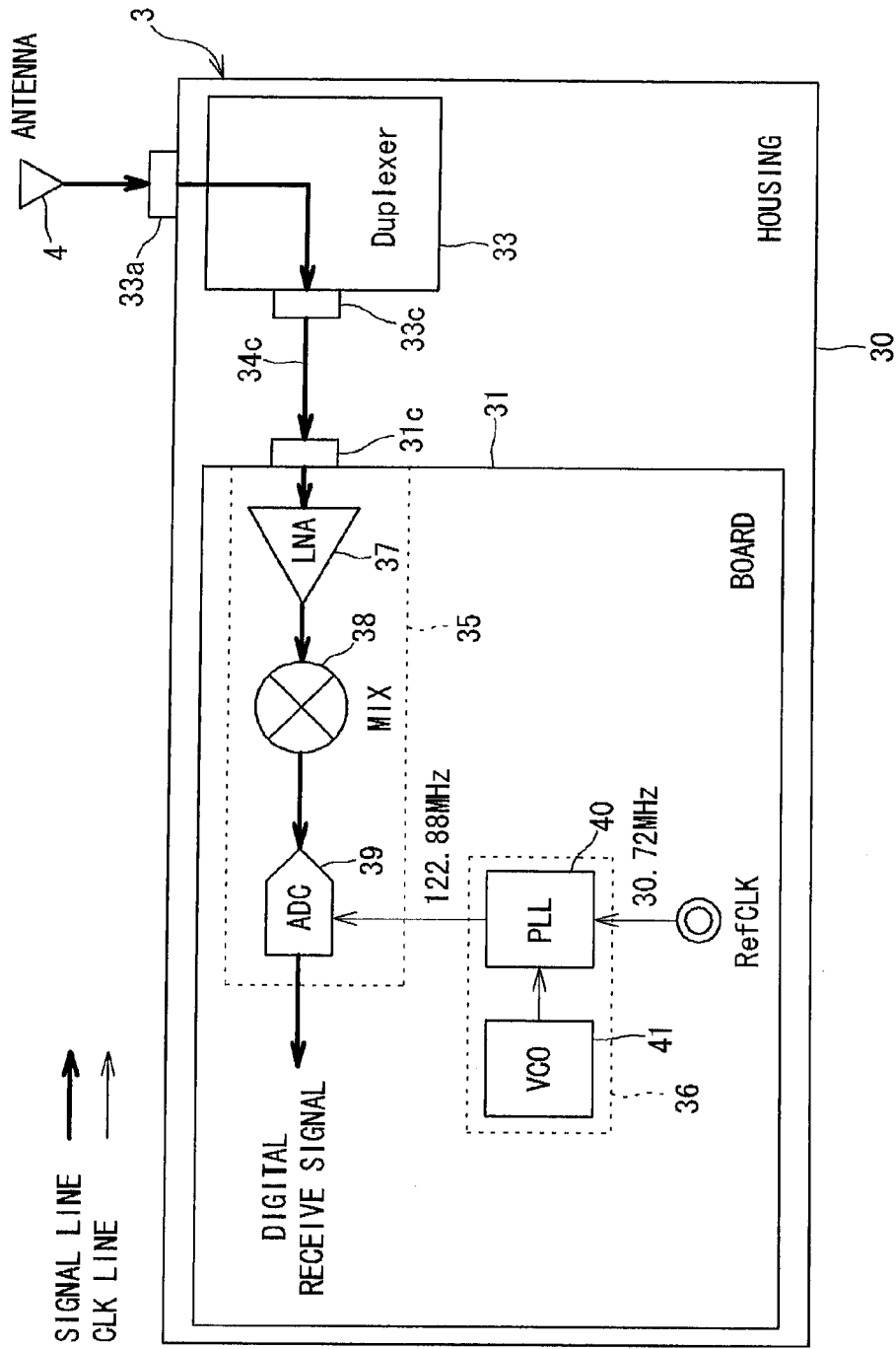

FIG. 46 is a diagram of a comparative example corresponding to FIG. 43.

Figure 47:
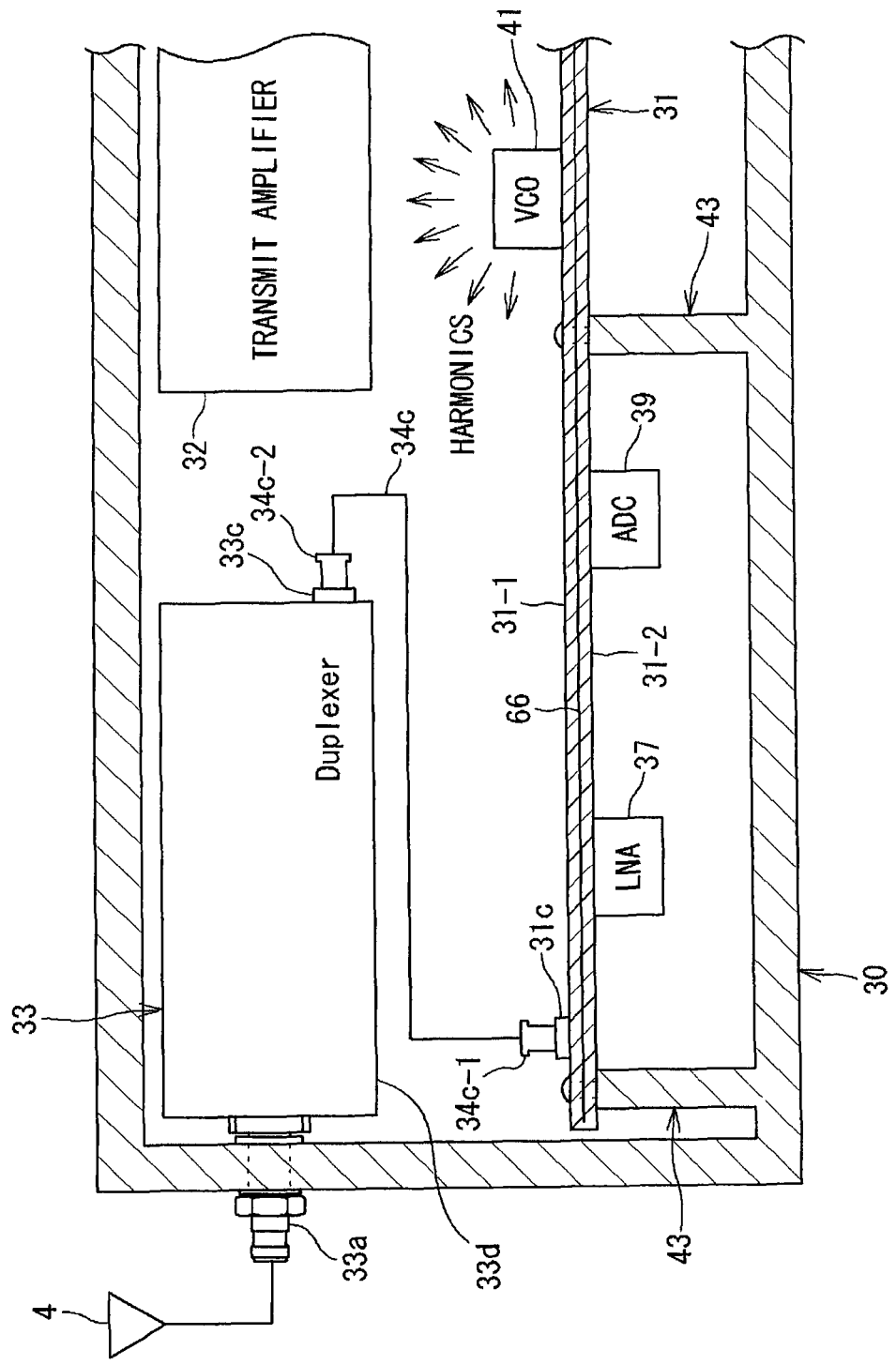

FIG. 47 is a diagram of the comparative example corresponding to FIG. 45.

Figure 48:
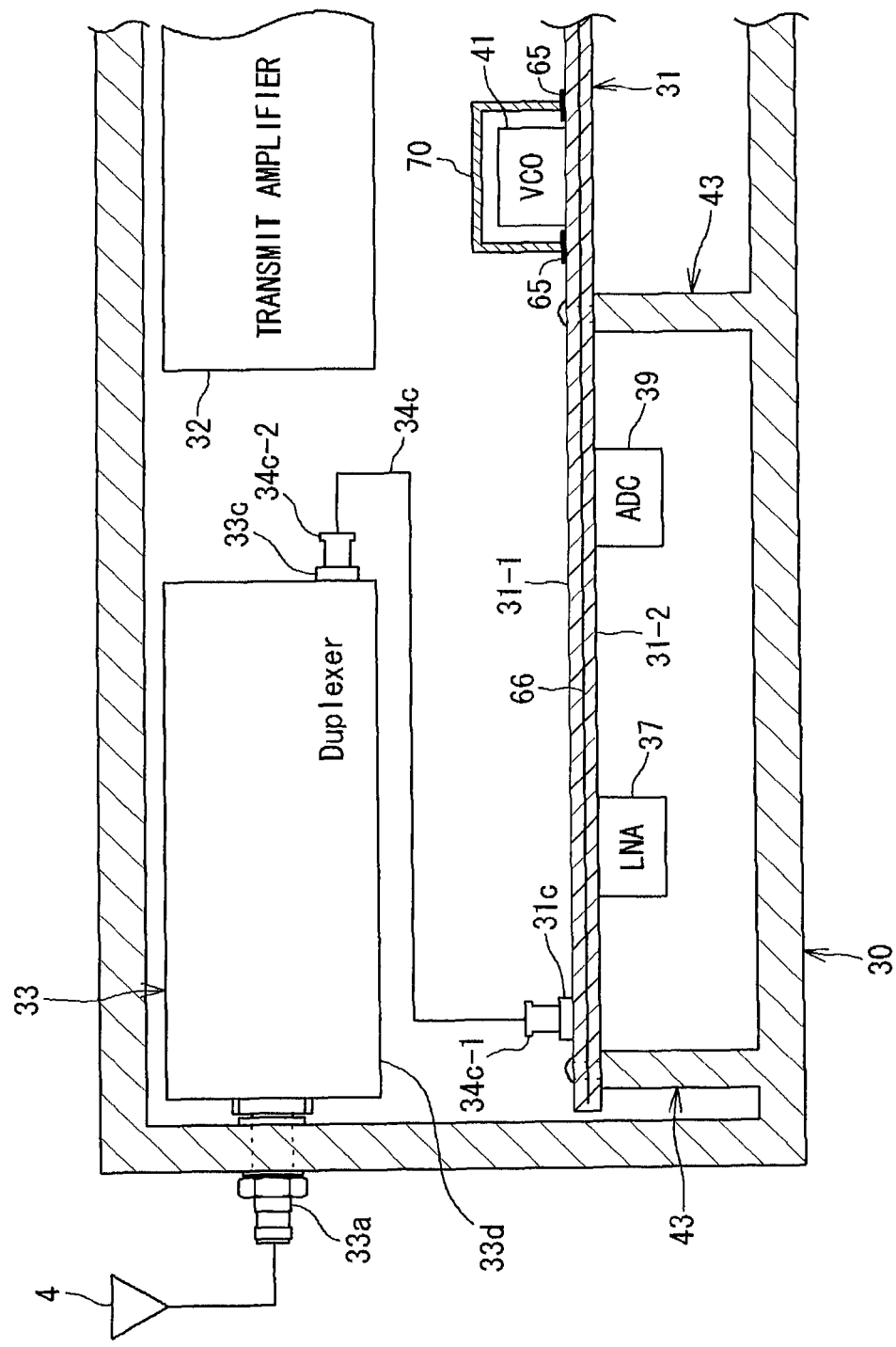

FIG. 48 is a cross-sectional view showing disposition of main components in a housing of radio equipment which is a part of a radio communication apparatus according to a second embodiment in chapter 3, and disposition of circuit components, etc., provided on a signal processing circuit board.

DETAILED DESCRIPTION OF EMBODIMENTS

Embodiments of the present invention will be described below using the drawings. Note that those components denoted by the same reference numerals in different drawings indicate the same or corresponding components.

[Chapter 1 Mounting Structure of an Amplifier Apparatus Performing Drain Modulation]

Figure 1:
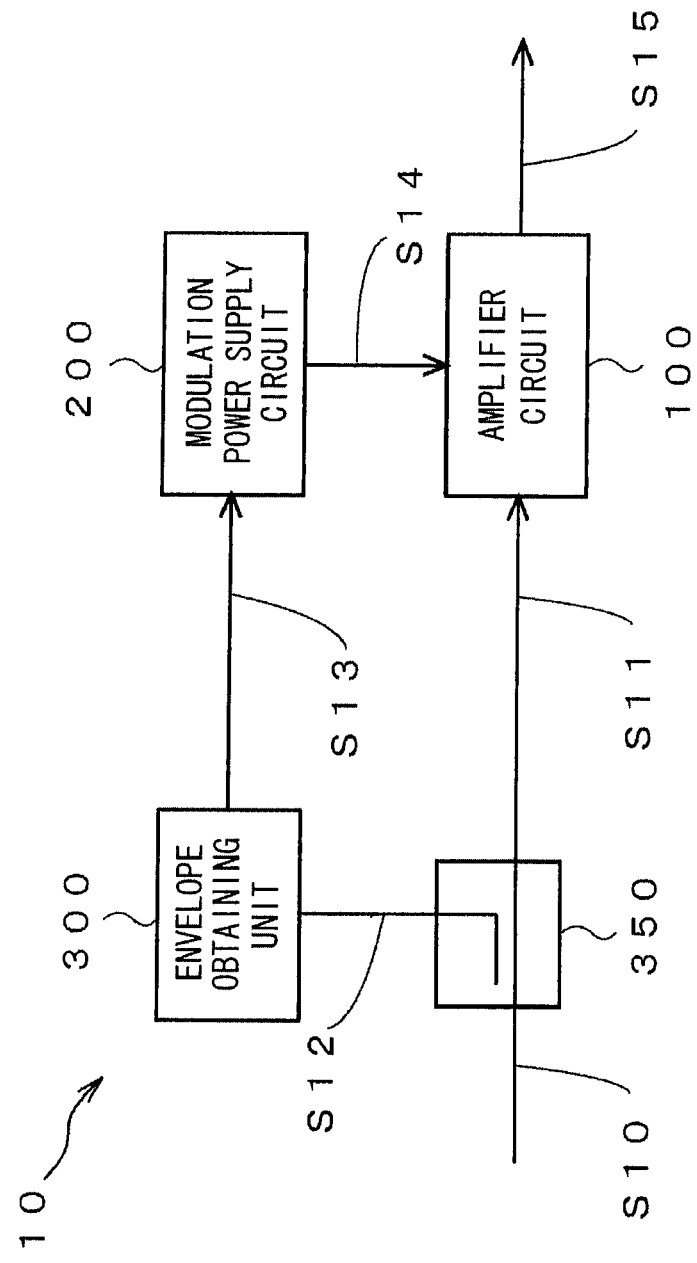
FIG. 1 is a block diagram schematically showing a configuration of an amplifier according to an embodiment of the present invention in chapter 1.

In chapter 1, an amplifier apparatus 10 according to an embodiment of the present invention is an amplifier apparatus using drain modulation such as ET (Envelope Tracking) or EER (Envelope Elimination and Restoration). FIG. 1 is a block diagram schematically showing a configuration of the amplifier apparatus 10.

The amplifier apparatus 10 is used as, for example, a part of a transmitting circuit of a radio base station apparatus (radio communication apparatus) and amplifies a transmit signal. The radio base station apparatus (radio communication apparatus) also includes a receiving circuit, etc. Note that the configurations of radio base station apparatuses (radio communication apparatuses) shown in chapters 2 and 3 are incorporated in chapter 1.

The amplifier apparatus 10 includes an amplifier circuit 100, a modulation power supply circuit 200 that supplies a variable power supply voltage for performing drain modulation, an envelope obtaining unit 300, and a coupler 350. The amplifier circuit 100 is a high power amplifier. An input signal S10 inputted to the amplifier apparatus 10 is inputted to the coupler 350. The coupler 350 splits the input signal S10, and inputs a signal S11 to the amplifier circuit 100 and inputs a signal S12 to the envelope obtaining unit 300. An envelope information signal S13 which is output from the envelope obtaining unit 300 is inputted to the modulation power supply circuit 200. A drain modulation voltage S14 which is output from the modulation power supply circuit 200 is inputted to the amplifier circuit 100. An output signal S15 which is output from the amplifier circuit 100 serves as output from the amplifier apparatus 10.

Next, the basic operation of the amplifier apparatus 10 will be described. An input signal S10 inputted to the amplifier apparatus 10 is split by the coupler 350 into a signal S11 to be inputted to the amplifier circuit 100 and a signal S12 to be inputted to the envelope obtaining unit 300. The envelope obtaining unit 300 obtains, from a change in signal instantaneous peak value included in the signal S12, an envelope component thereof and outputs the envelope component to the modulation power supply circuit 200 as an envelope information signal S13. The modulation power supply circuit 200 changes the voltage value of a drain modulation voltage S14 to be outputted, based on the envelope information signal S13. The amplifier circuit 100 amplifies the signal S11 using the drain modulation voltage S14 as a power supply voltage. The signal amplification function of the amplifier apparatus 10 such as that described above may be the same as the signal amplification function of a general amplifier apparatus using drain modulation.

Figure 2:
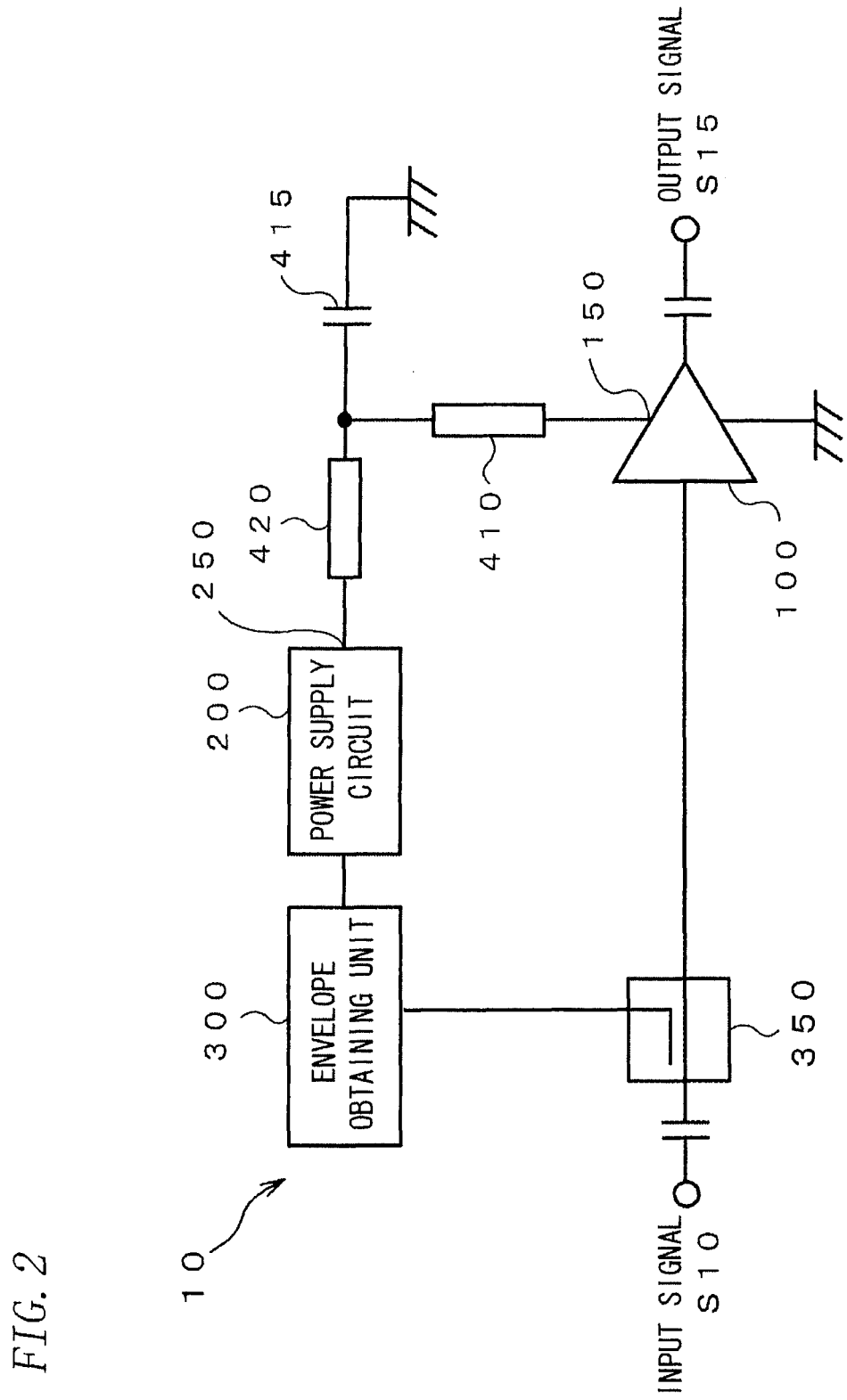
FIG. 2 is a diagram schematically showing an example of an electric circuit of an amplifier apparatus according to the embodiment of the present invention used in a radio frequency circuit.

FIG. 2 is a diagram schematically showing an example of an electric circuit of the amplifier apparatus 10 used in a radio frequency circuit. In FIG. 2, a power supply path from the modulation power supply circuit 200 to the amplifier circuit 100 includes a quarter wavelength path 410 and an extra path 420. The modulation power supply circuit 200 outputs power supply power from an output portion 250 toward the power supply path, and the power supply power supplied from the power supply path is inputted to the amplifier circuit 100 from an input portion 150. In addition, a capacitor 415 is connected to an end of the quarter wavelength path 410 and the power supply path is grounded through the capacitor 415.

The amplifier apparatus 10 used in a radio frequency circuit in FIG. 2 obtains an envelope component of an instantaneous peak value of a carrier wave amplitude included in the input signal S10 which is an RF signal, and performs signal amplification using a drain voltage based on the envelope component. At this time, by setting the length of the quarter wavelength path 410 to a value corresponding to one-quarter of the wavelength of a carrier wave included in the input signal S10 and appropriately setting the impedance between the quarter wavelength path 410 and the capacitor 415, the power supply path as viewed from the side of the amplifier circuit 100 is made open (an infinite impedance) at the frequency of a carrier wave of a signal to be amplified by the amplifier circuit 100. Accordingly, the signal amplified by the amplifier circuit 100 can be prevented from exerting an influence on the side of the modulation power supply circuit 200. On the other hand, the drain modulation voltage S14 inputted to the power supply path from the modulation power supply circuit 200 includes a sufficiently lower frequency component than the frequency of the carrier wave included in the input signal S10. In a frequency band included in the drain modulation voltage S14, the length of the quarter wavelength path 410 is so short as to be negligible, but if the power supply path becomes longer than the quarter wavelength path 410 and the extra path 420 becomes long, then the drain modulation voltage S14 may cause irregularities due to a delay, a distortion, etc., caused by an impedance component of the extra path 420.

Hence, when mounting the amplifier apparatus 10 on a board, the amplifier circuit 100 is disposed on a front surface (the side of a first principal surface 400a) of a board 400 and the output portion 250 of the modulation power supply circuit 200 is disposed on a back surface (the side of a second principal surface 400b) of the board. By disposing the amplifier circuit 100 and the output portion 250 on different surfaces of the board, a power supply path can be wired on the board with flexibility without being hindered by other elements mounted on the board. Therefore, a power supply path can be set such that the extra path 420 is made as short as possible (there may be no extra path 420).

Figure 3:
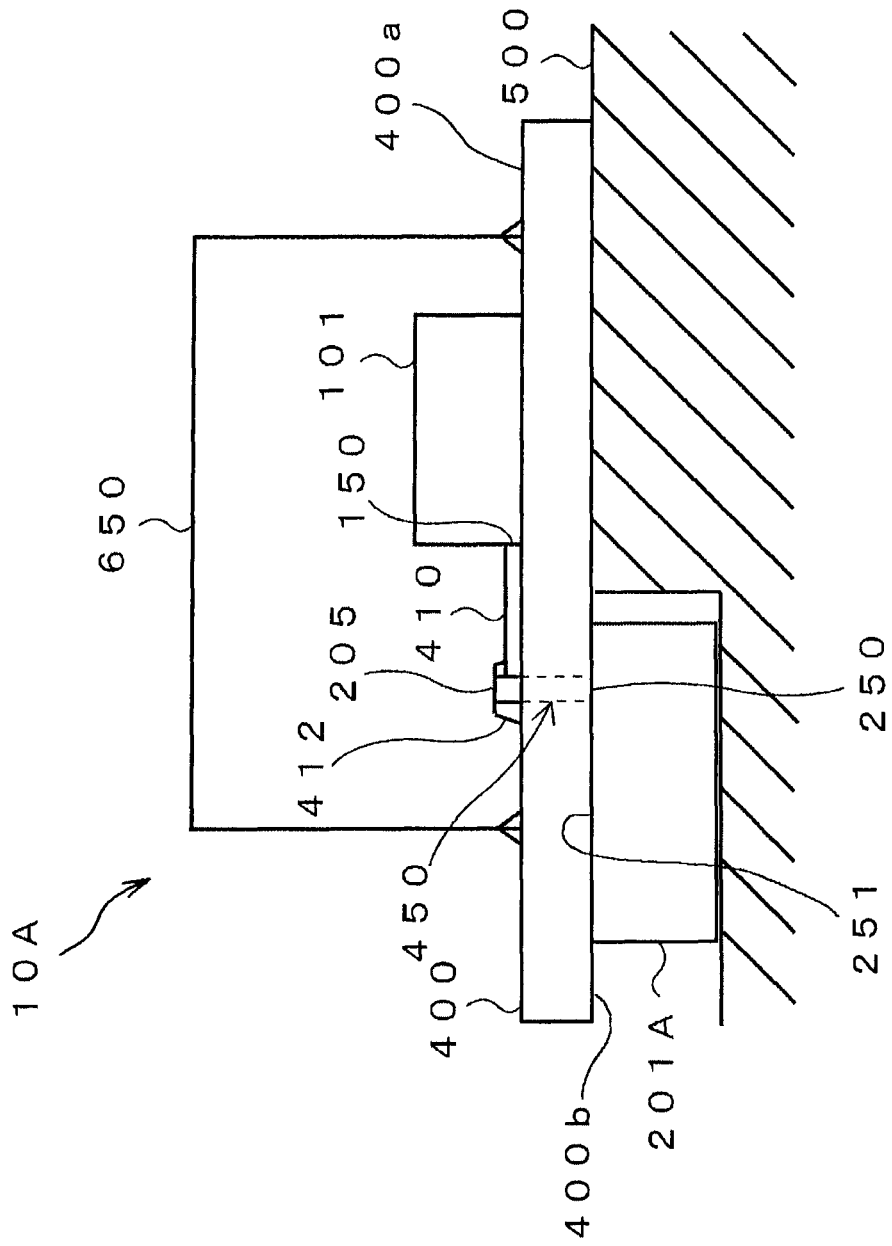
FIG. 3 is a cross-sectional view schematically showing an example of mounting, on a board, an amplifier apparatus using a power supply unit with vertical power supply terminals.

Next, there are shown below examples of mounting, on a board, amplifier apparatuses 10A to 10I1 which are amplifier apparatuses 10 and have different methods of disposition of components on the board. FIG. 3 is a cross-sectional view schematically showing an example of mounting, on a board, an amplifier apparatus 10A using a power supply unit 201A with vertical power supply terminals. The amplifier apparatus 10A includes an amplifier unit 101 including therein an amplifier circuit 100; the power supply unit 201A including therein a modulation power supply circuit 200; a printed circuit board 400; a metal chassis 500; and a shield 650. The amplifier apparatus 10A also has, though not shown, other components required for the operation of the amplifier apparatus 10A. In addition, the printed circuit board 400 has a quarter wavelength path 410 which is a conductor path wired on the board, and through-holes 450.

Figure 4:
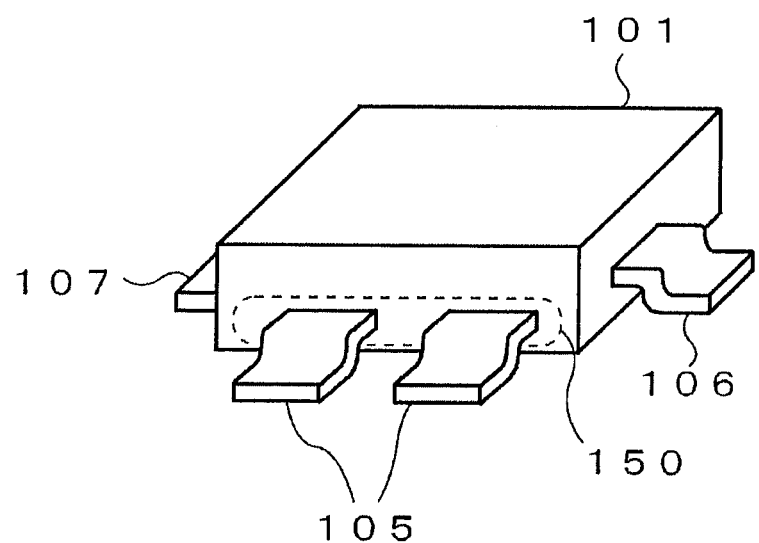
FIG. 4 is a diagram schematically showing a structure of an input portion of an amplifier unit where an amplifier circuit is packaged in a unit.

FIG. 4 is a diagram schematically showing a structure of an input portion 150 of the amplifier unit 101 where the amplifier circuit 100 is packaged in a unit. The amplifier unit 101 includes therein the amplifier circuit 100. The amplifier unit 101 has, on a surface thereof, the input portion 150 to which power supply power is supplied; and power supply input terminals 105 to be connected to the input portion 150, and operates using, as its power supply, a drain modulation voltage S14 to be applied to the power supply input terminals 105. The amplifier unit 101 further has a signal input terminal 106 and a signal output terminal 107. When a signal S11 is inputted to the signal input terminal 106, the amplifier unit 101 performs signal amplification using drain modulation and outputs an output signal S15 from the signal output terminal 107.

The metal chassis 500 is to support the amplifier apparatus 10A. The metal chassis 500 shown in the drawing can be configured as a housing that accommodates the amplifier apparatus 10A and other circuits used in the radio communication apparatus.

The shield 650 is provided on the board 400 so as to cover the amplifier circuit 100. The shield 650 is for shielding electromagnetic waves and prevents an electromagnetic wave leaking from the high power amplifier circuit 100 from adversely affecting other circuit elements (in particular, a receiving circuit). Note, however, that the power supply circuit 200 (power supply unit 201A) which is a part of the amplifier apparatus is located outside the shield 650.

Figure 5:
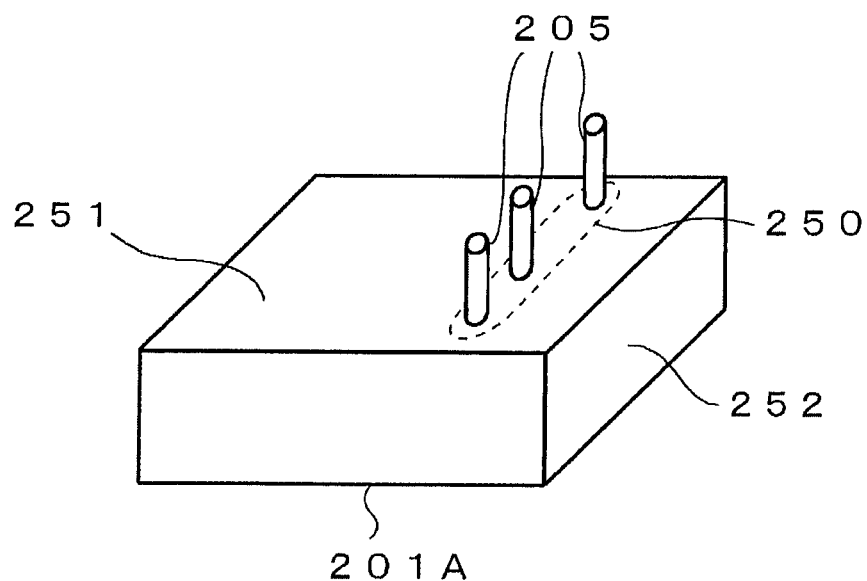
FIG. 5 is a diagram schematically showing a structure of an output portion of the power supply unit with vertical power supply terminals.

FIG. 5 is a diagram schematically showing a structure of an output portion 250 of the power supply unit 201A with vertical power supply terminals. The power supply unit 201A includes therein the modulation power supply circuit 200. When an envelope information signal S13 based on a signal S12 is inputted to the power supply unit 201A, the power supply unit 201A outputs a drain modulation voltage S14 which is used for drain modulation of the amplifier circuit 100. In addition, the power supply unit 201A has, on a surface thereof, the output portion 250 that outputs power supply power, and outputs the drain modulation voltage S14 to a power supply path from the output portion 250 through power supply terminals 205. The output portion 250 and the power supply terminals 205 are normally provided on a surface 251 that is oriented in a vertical direction when the power supply unit 201 is mounted. In other words, the output portion 250 and the power supply terminals 205 of the power supply unit 201 are provided on the surface 251 facing the board 400.

Note that in the present embodiment a power supply unit 201 whose output portion 250 is thus provided on a surface (facing surface) 251 oriented in the vertical direction of the power supply unit 201 is referred to as a "vertical power supply unit", and in contrast a power supply unit 201 whose output portion 250 is provided on a surface (side surface) 252 oriented in the horizontal direction of the power supply unit 201 is referred to as a "horizontal power supply unit".

As shown in the mounting example of FIG. 3, the amplifier apparatus 10A is such that the amplifier unit 101 is disposed on the front surface (first principal surface 400a) of the printed circuit board 400, and the power supply unit 201A is disposed on the back surface (second principal surface 400b) of the printed circuit board 400. Then, the power supply terminals 205 of the power supply unit 201A penetrate through to the front surface side of the printed circuit board 400 through the through-holes 450 made in the printed circuit board 400, and are soldered by solder 412 to an end of the quarter wavelength path 410. Thus, in the amplifier apparatus 10A, the power supply terminals 205 included in the power supply unit 201A serve as conductors penetrating through the printed circuit board 400 and connecting the output portion 250 to the input portion 150.

Figure 6:
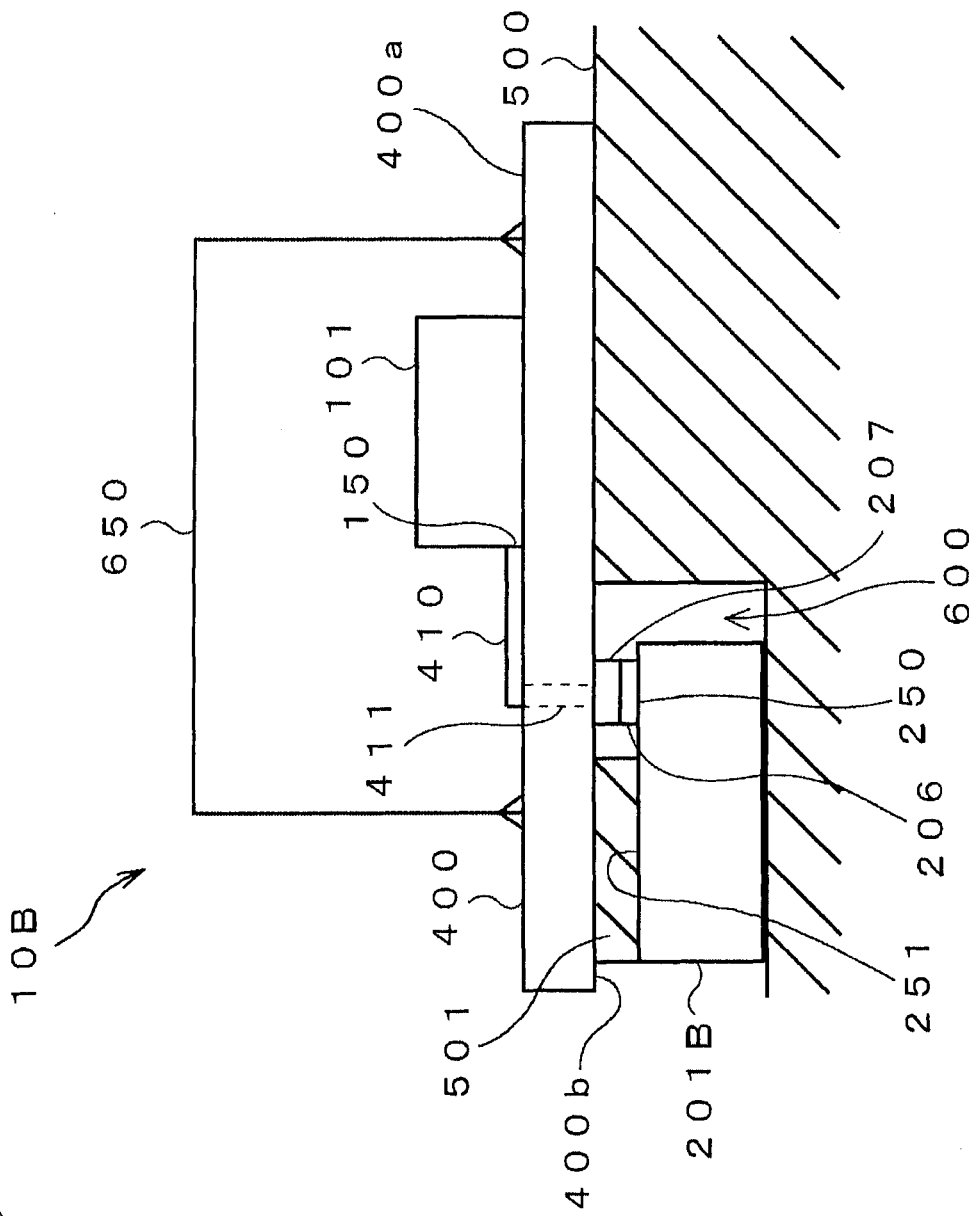
FIG. 6 is a cross-sectional view schematically showing an example of mounting, on a board, an amplifier apparatus using a power supply unit with a vertical power supply connector.

FIG. 6 is a cross-sectional view schematically showing an example of mounting, on a board, an amplifier apparatus 10B using a power supply unit 201B with a vertical power supply connector. The amplifier apparatus 10B includes an amplifier unit 101 including therein an amplifier circuit 100; the power supply unit 201B including therein a modulation power supply circuit 200; a printed circuit board 400; a metal chassis 500; and a shield 650. The amplifier apparatus 10B also has, though not shown, other components required for the operation of the amplifier apparatus 10B. In addition, the printed circuit board 400 has a quarter wavelength path 410 which is a conductor path wired on the board, and a conductor 411 penetrating through the printed circuit board 400 from a front surface 400a to a back surface 400b thereof. A board side connector 207 for connecting the power supply unit 201B is provided on the back surface 400b.

Figure 7:
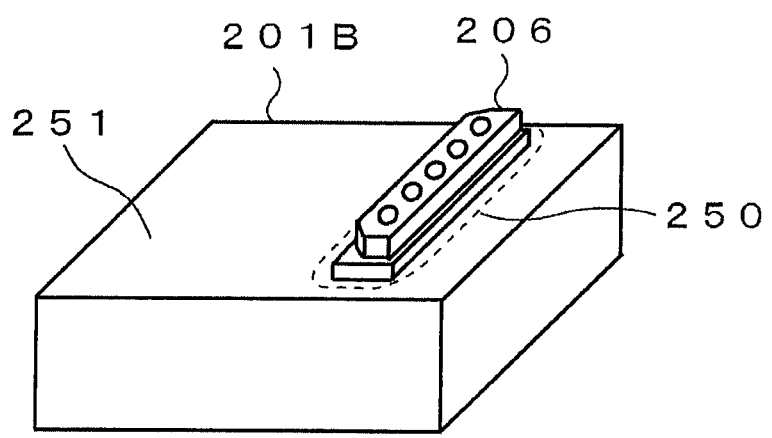
FIG. 7 is a diagram schematically showing a structure of an output portion of the power supply unit with a vertical power supply connector.

FIG. 7 is a diagram schematically showing a structure of an output portion 250 of the power supply unit 201B with a vertical power supply connector. The operation for the power supply unit 201B to output a drain modulation voltage S14 through the output portion 250 is the same as that for the power supply unit 201A, but the power supply unit 201B outputs the drain modulation voltage S14 to a power supply path from the output portion 250 through a power supply connector 206 to be connected to the board side connector 207. FIG. 7 is an exemplification and thus the power supply connector 206 may be a male or female connector as long as the connector can be connected to the board side connector 207.

As shown in the mounting example of FIG. 6, the amplifier apparatus 10B is such that the amplifier unit 101 is disposed on the front surface (first principal surface 400a) of the printed circuit board 400, and the power supply unit 201B is disposed on the back surface (second principal surface 400b) of the printed circuit board 400. In addition, the board side connector 207 is mounted on the back surface 400b of the printed circuit board 400 and is connected to an end of the quarter wavelength path 410 through the conductor 411. Then, the power supply connector 206 of the power supply unit 201B is connected to the board side connector 207.

Figure 8:
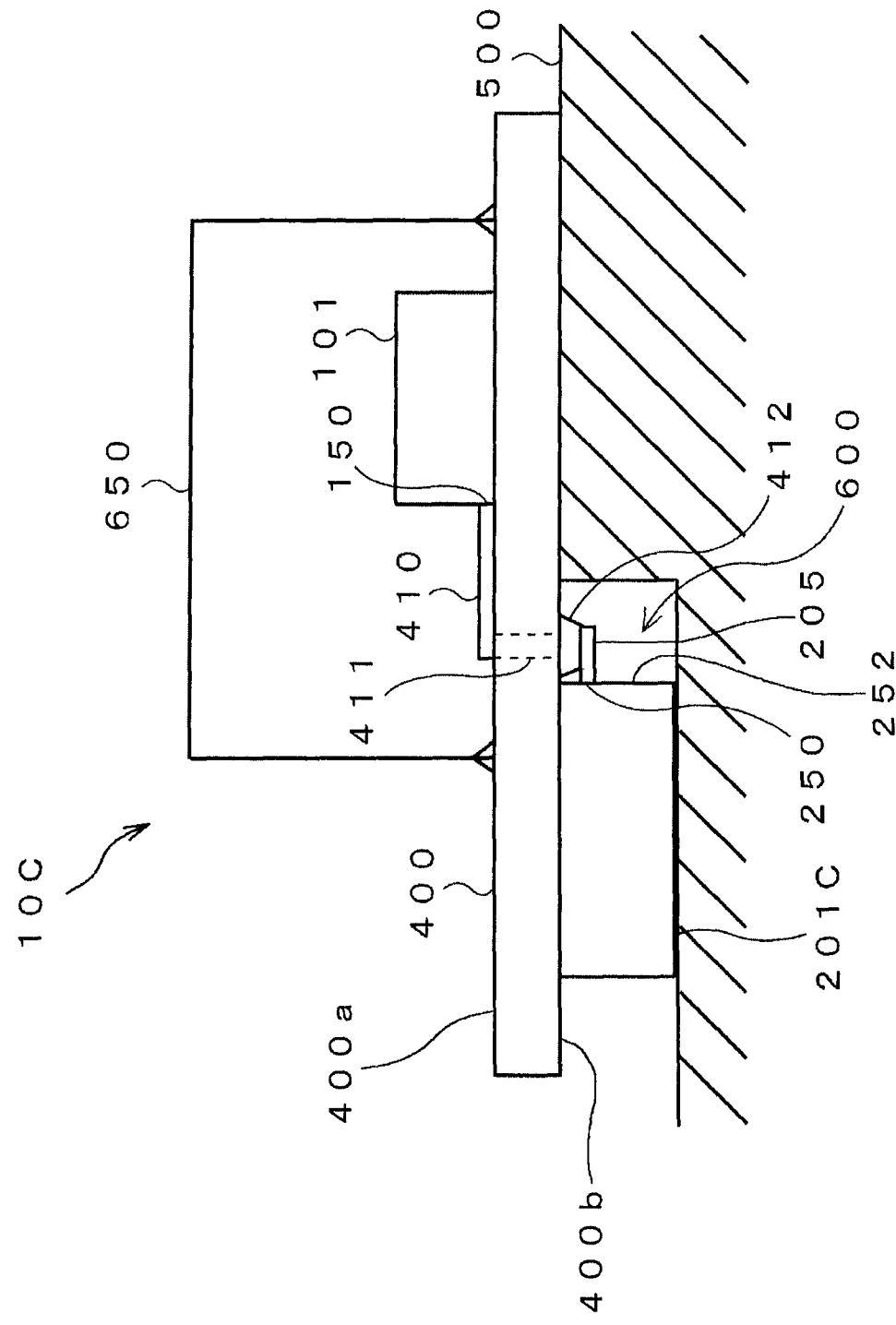
FIG. 8 is a cross-sectional view schematically showing an example of mounting, on a board, an amplifier apparatus using a power supply unit with horizontal power supply terminals.

FIG. 8 is a cross-sectional view schematically showing an example of mounting, on a board, an amplifier apparatus 10C using a power supply unit 201C with horizontal power supply terminals. The amplifier apparatus 10C includes an amplifier unit 101 including therein an amplifier circuit 100; the power supply unit 201C including therein a modulation power supply circuit 200; a printed circuit board 400; a metal chassis 500; and a shield 650. The amplifier apparatus 10C also has, though not shown, other components required for the operation of the amplifier apparatus 10C. In addition, the printed circuit board 400 has a quarter wavelength path 410 which is a conductor path wired on the board, and conductors 411 penetrating through the printed circuit board 400 from the front surface to back surface thereof.

Figure 9:
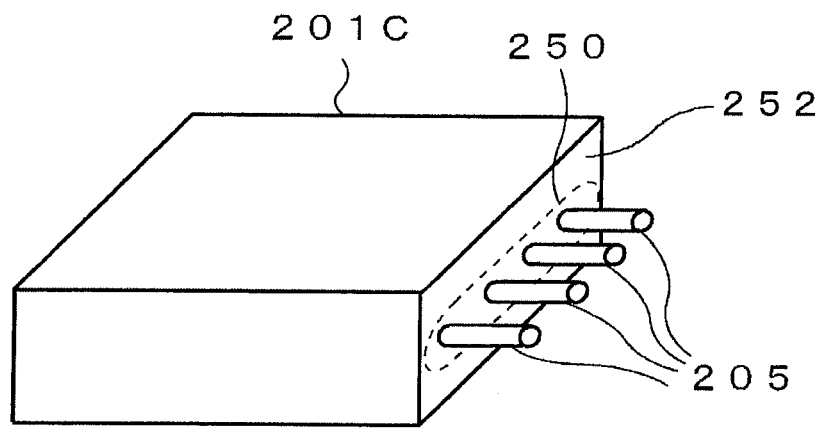
FIG. 9 is a diagram schematically showing a structure of an output portion of the power supply unit with horizontal power supply terminals.

FIG. 9 is a diagram schematically showing a structure of an output portion 250 of the power supply unit 201C with horizontal power supply terminals. The operation for the power supply unit 201C to output a drain modulation voltage S14 through the output portion 250 is the same as that for the power supply unit 201A, but the output portion 250 that outputs the drain modulation voltage S14 and the power supply terminals 205 are disposed on a side surface portion 252 of a housing of the power supply unit 201C.

As shown in the mounting example of FIG. 8, the amplifier apparatus 10C is such that the amplifier unit 101 is disposed on the front surface (first principal surface 400a) of the printed circuit board 400, and the power supply unit 201C is disposed on the back surface (second principal surface 400b) of the printed circuit board 400. In addition, the power supply terminals 205 of the power supply unit 201C are soldered by solder 412 to the conductors 411 penetrating through the printed circuit board 400 from the front surface 400a to back surface 400b thereof, and are connected to an end of the quarter wavelength path 410 through the conductors 411.

Figure 10:
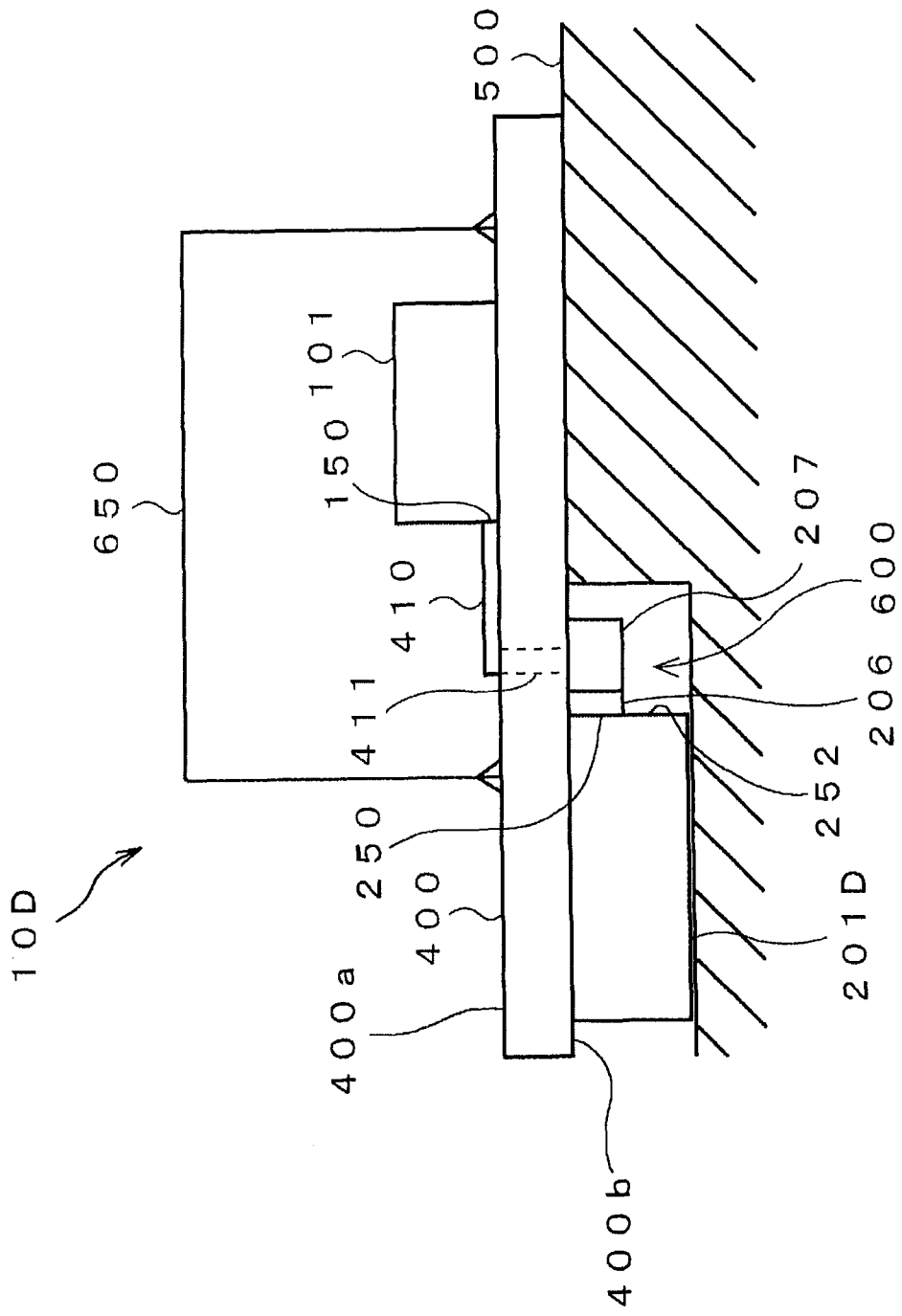
FIG. 10 is a cross-sectional view schematically showing an example of mounting, on a board, an amplifier apparatus using a power supply unit with a horizontal power supply connector.

FIG. 10 is a cross-sectional view schematically showing an example of mounting, on a board, an amplifier apparatus 10D using a power supply unit 201D with a horizontal power supply connector. The amplifier apparatus 10D includes an amplifier unit 101 including therein an amplifier circuit 100; the power supply unit 201D including therein a modulation power supply circuit 200; a printed circuit board 400; a metal chassis 500; and a shield 650. The amplifier apparatus 10D also has, though not shown, other components required for the operation of the amplifier apparatus 10D. In addition, the printed circuit board 400 has a quarter wavelength path 410 which is a conductor path wired on the board, and a conductor 411 penetrating through the printed circuit board 400 from a front surface to a back surface thereof. A board side connector 207 for connecting the power supply unit 201D is mounted on the back surface.

Figure 11:
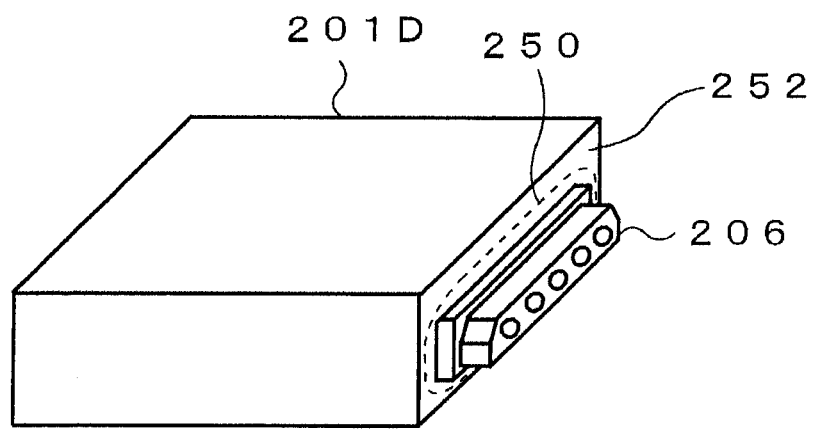
FIG. 11 is a diagram schematically showing a structure of an output portion of the power supply unit with a horizontal power supply connector.

FIG. 11 is a diagram schematically showing a structure of an output portion 250 of the power supply unit 201D with a horizontal power supply connector. In the power supply unit 201D, the output portion 250 that outputs a drain modulation voltage S14 and a power supply connector 206 are disposed on a side surface portion of a housing of the power supply unit 201D. The operation for the power supply unit 201D to output the drain modulation voltage S14 through the output portion 250 is the same as that for the power supply unit 201A, but the power supply unit 201D outputs the drain modulation voltage S14 to a power supply path from the output portion 250 through the power supply connector 206 connected to the board side connector 207. FIG. 11 is an exemplification and thus the power supply connector 206 may be a male or female connector as long as the connector can be connected to the board side connector 207.

As shown in the mounting example of FIG. 10, the amplifier apparatus 10D is such that the amplifier unit 101 is disposed on the front surface (first principal surface 400a) of the printed circuit board 400, and the power supply unit 201D is disposed on the back surface (second principal surface 400b) of the printed circuit board 400. In addition, the board side connector 207 is mounted on the back surface 400b of the printed circuit board 400 and is connected to an end of the quarter wavelength path 410 through the conductor 411. Then, the power supply connector 206 of the power supply unit 201D is connected to the board side connector 207.

Figure 12:
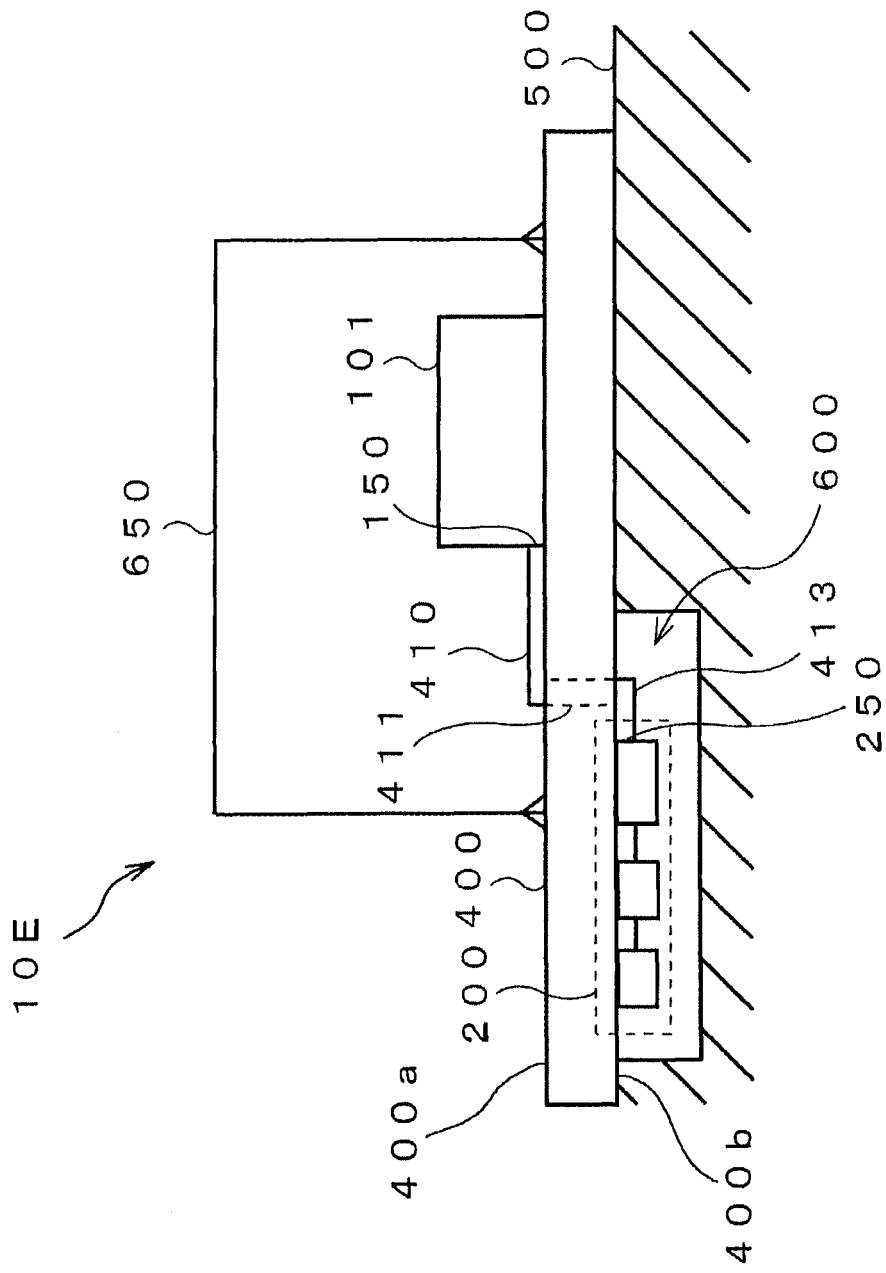
FIG. 12 is a cross-sectional view schematically showing an example of mounting, on a board, an amplifier apparatus in which elements constituting a modulation power supply circuit are mounted on a back surface of the board.

In an amplifier apparatus 10 according to the embodiment of the present invention, an amplifier circuit 100 and a modulation power supply circuit 200 each do not necessarily need to be packaged in a unit. FIG. 12 is a cross-sectional view schematically showing an example of mounting, on a board, an amplifier apparatus 10E in which elements constituting a modulation power supply circuit 200 are mounted on a back surface of the board. In this case, of the elements constituting the modulation power supply circuit 200, an output terminal of an element that outputs a drain modulation voltage S14 serves as an output portion 250 of the modulation power supply circuit 200. A conductor path 413 is formed on a back surface 400b of a printed circuit board 400, and the output portion 250 is connected to the conductor path 413. The conductor path 413 is connected to an end of a quarter wavelength path 410 through a conductor 411 penetrating through the printed circuit board 400 from a front surface 400a to the back surface 400b thereof. Then, the conductor path 413, the conductor 411, and the quarter wavelength path 410 serve as a power supply path from the output portion 250 to an input portion 150 (at this time, the conductor path 413 is an extra path 420).

Figure 13:
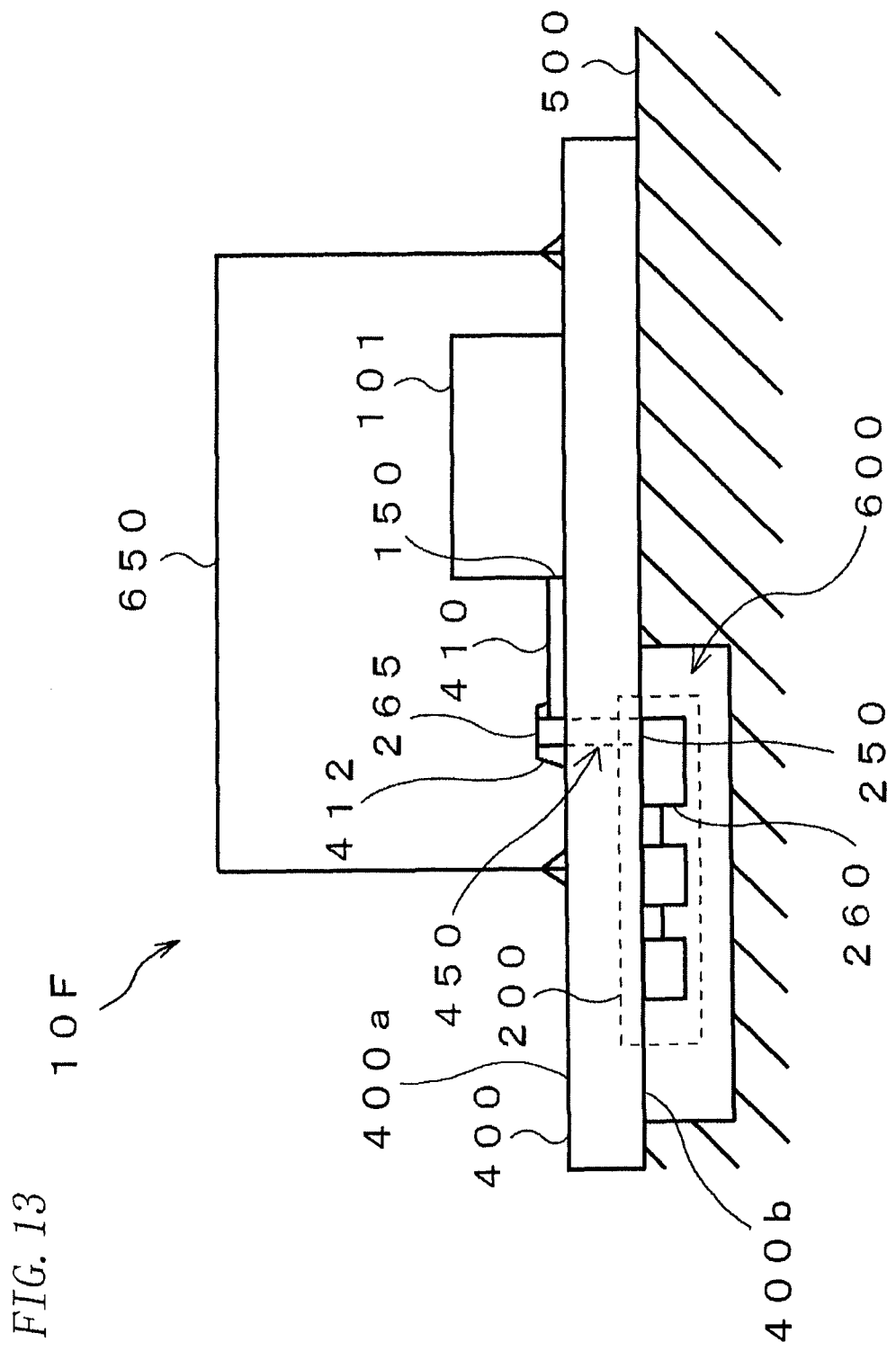
FIG. 13 is a cross-sectional view schematically showing an example of mounting an amplifier apparatus in which an output terminal of a power supply IC used in a modulation power supply circuit is mounted to penetrate through a board.

Note that in the case of mounting, on a board, elements used in a modulation power supply circuit 200, an element that outputs a drain modulation voltage S14 may be an element such as an IC (Integrated Circuit) having an output terminal of a metal conductor. FIG. 13 is a cross-sectional view schematically showing an example of mounting an amplifier apparatus 10F in which a power supply terminal 265 of a power supply IC 260 used in a modulation power supply circuit 200 is mounted to penetrate through a board 400. In the amplifier apparatus 10F, elements constituting the modulation power supply circuit 200 and including the power supply IC 260 are mounted on a back surface (second principal surface 400b) of the printed circuit board 400. The power supply terminal 265 of the power supply IC 260 penetrates through to the side of a front surface 400a of the printed circuit board 400 through a through-hole 450 made in the printed circuit board 400. Then, the power supply terminal 265 is soldered by solder 412 to an end of a quarter wavelength path 410, on the front surface side of the printed circuit board 400. The power supply IC 260 applies a drain modulation voltage S14 to the quarter wavelength path 410 from an output portion 250 which is an output terminal through the power supply terminal 265. Thus, in the amplifier apparatus 10F, the power supply terminal 265 of the power supply IC 260 serves as a conductor penetrating through the printed circuit board 400 and connecting the output portion 250 to an input portion 150.

Figure 14:
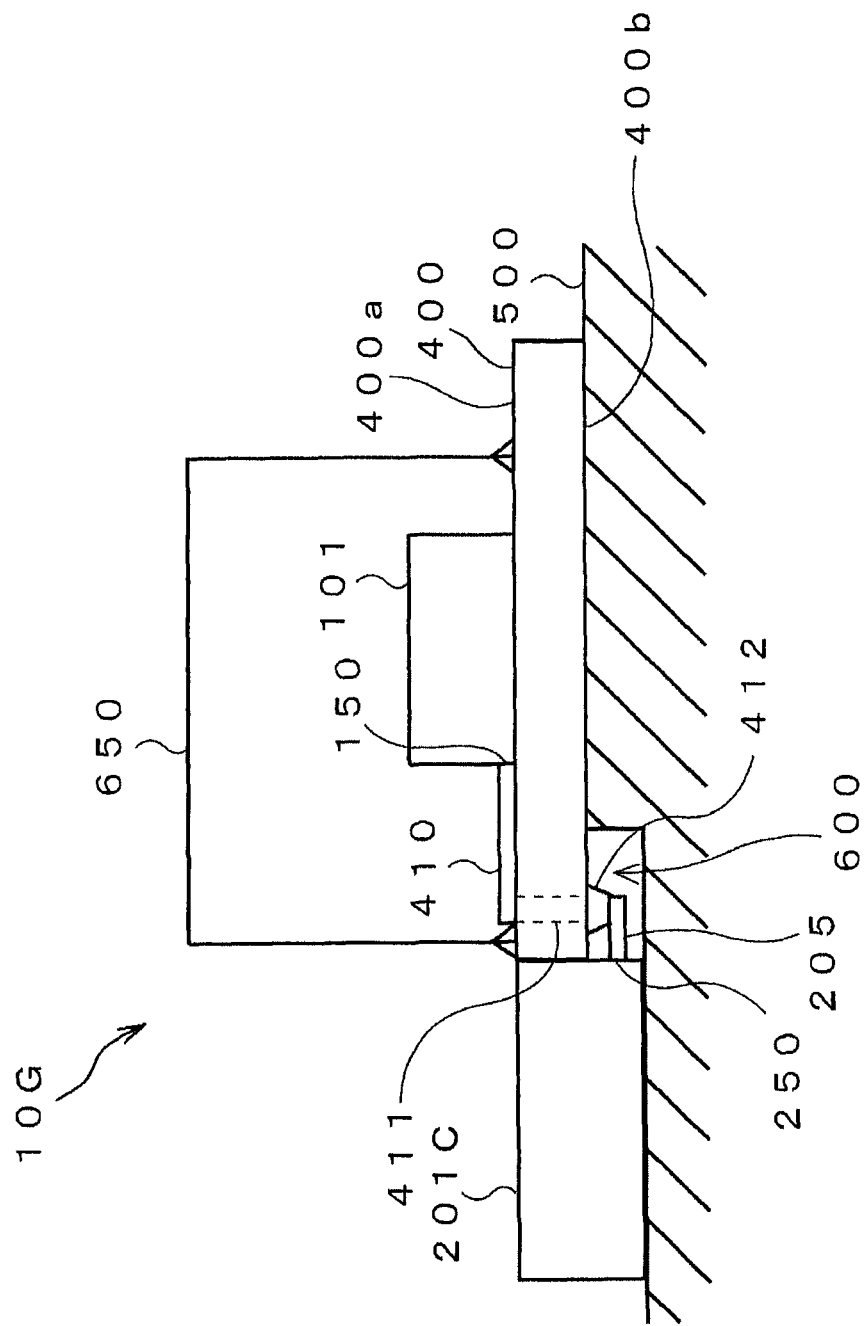
FIG. 14 is a cross-sectional view schematically showing an example of mounting an amplifier apparatus in the case where a power supply unit with horizontal power supply terminals is not provided on a back surface of a board.
Figure 15:
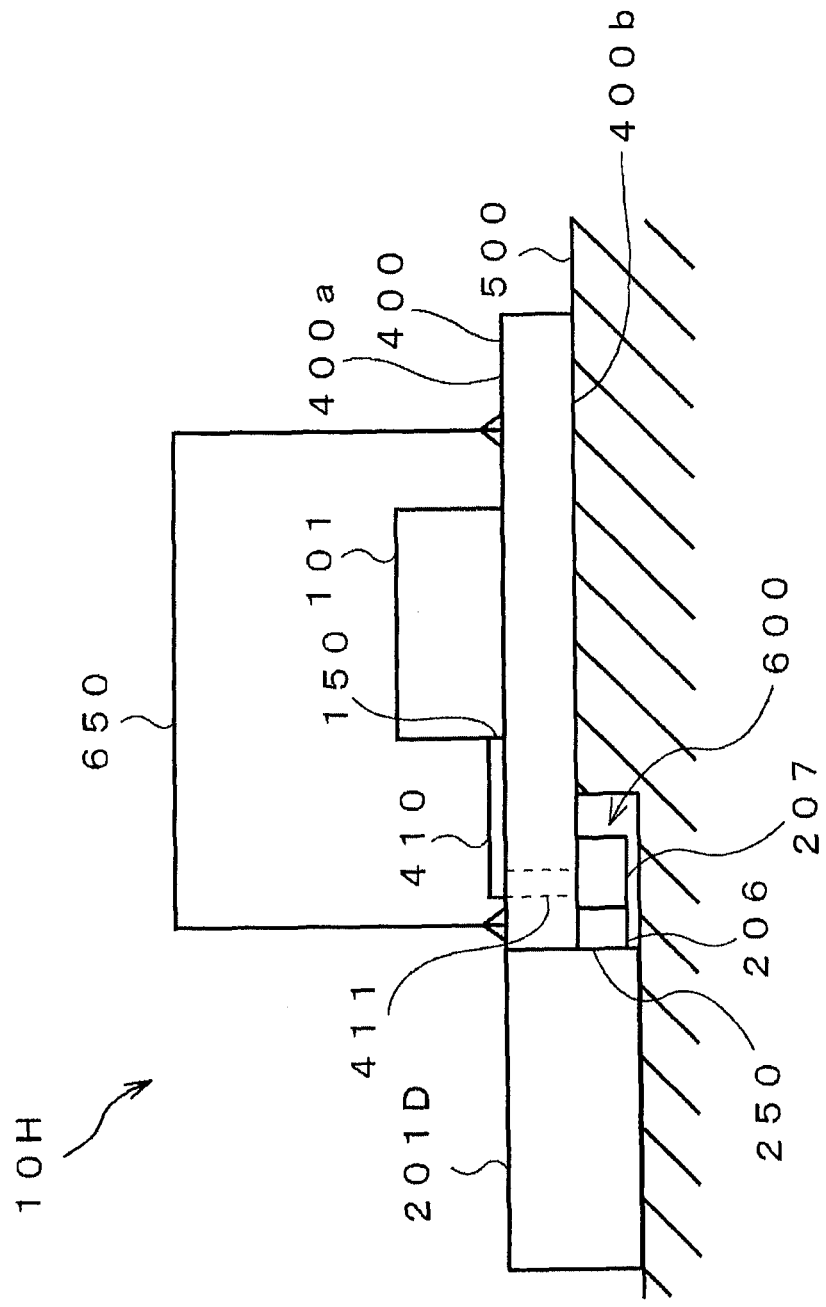
FIG. 15 is a cross-sectional view schematically showing an example of mounting an amplifier apparatus in the case where a power supply unit with a horizontal power supply connector is not provided on a back surface of a board.

Furthermore, in an amplifier apparatus 10 according to the embodiment of the present invention, a modulation power supply circuit 200 (or a power supply unit 201 including the modulation power supply circuit 200) itself does not need to be disposed on a back surface 400b of a printed circuit board 400, but an output portion 250 of the modulation power supply circuit 200 (or the power supply unit 201 including the modulation power supply circuit 200) needs to be disposed on the back surface 400b of the printed circuit board 400. FIG. 14 is a cross-sectional view schematically showing an example of mounting an amplifier apparatus 10G in the case where a power supply unit 201C with horizontal power supply terminals is not provided on a back surface 400b of a printed circuit board 400. FIG. 15 is a cross-sectional view schematically showing an example of mounting an amplifier apparatus 10I1 in the case where a power supply unit 201D with a horizontal power supply connector is not provided on a back surface 400b of a printed circuit board 400. In the amplifier apparatus 10G and the amplifier apparatus 10I1, although the main bodies of the power supply unit 201C and the power supply unit 201D are not mounted on their respective printed circuit boards 400, an output portion 250 and the power supply terminals 205 or power supply connector 206 of the power supply unit 201 are disposed on the back surface 400b of the printed circuit board 400.

In addition, the printed circuit board 400, the metal chassis 500, the shield 650, and the housings of the units 101 and 201 are structures having an electromagnetic cut-off function. These structures cut off electromagnetic radiation by hermetically sealing the amplifier circuit 100, input portion 150, modulation power supply circuit 200, output portion 250, and conductor connecting the input portion 150 to the output portion 250 (power supply path) of each of the amplifier apparatuses 10A to 10H. In each of the amplifier apparatuses 10A to 10H (see FIGS. 3, 6, 8, 10, and 12 to 15), the output portion 250 is located in a hermetically sealed space 600 defined by the metal chassis 500, the printed circuit board 400, and the power supply unit 201, thereby preventing an electromagnetic wave emitted from the output portion 250 from leaking outside the hermetically sealed space (shielding space) 600. Specifically, the metal chassis 500, together with the board 400 (and the power supply unit 201 if necessary), is formed in a shape surrounding the output portion 25.

Note, however, that for the amplifier apparatus 10A shown in FIG. 3, the output portion 250 is hermetically sealed by bringing the printed circuit board 400 and the power supply unit 201A into intimate contact with each other, and a contact surface between the printed circuit board 400 and the power supply unit 201A serves as a hermetically sealed space 600.

For the amplifier apparatus 10B shown in FIG. 6, a filling member 501 which is formed as a part of the metal chassis 500 or which is a different component than the metal chassis 500 is provided in a space between the printed circuit board 400 and the power supply unit 201B. The filling member 501 is also used to partition a hermetically sealed space (shielding space) 600 surrounding an output portion 25.

Furthermore, the above-described filing member 501 may be provided between the printed circuit board 400 and the power supply unit 201C in FIG. 8, between the printed circuit board 400 and the power supply unit 201D in FIG. 10, between (an end surface) of the printed circuit board 400 and the power supply unit 201C in FIG. 14, or between (an end surface) of the printed circuit board 400 and the power supply unit 201D in FIG. 15.

As described above, according to an amplifier apparatus 10 according to the embodiment of the present invention, an amplifier circuit 100 (or an amplifier unit 101 including the amplifier circuit 100) is disposed on a front surface (first principal surface 400a) of a printed circuit board 400, an output portion 250 of a modulation power supply circuit 200 (or a power supply unit 201 including the modulation power supply circuit 200) is disposed on a back surface (second principal surface 400b) of the printed circuit board 400, and an input portion 150 and the output portion 250 are wired through a conductor(s) (power supply terminal(s) 205 or 265 or a conductor 411) penetrating through the printed circuit board 400, whereby a power supply path can be wired with flexibility regardless of the mounting conditions of other elements on the printed circuit board 400. Accordingly, the length of a quarter wavelength path 410 which is a power supply path can be appropriately set and an extra path 420 which is a redundant path is reduced, whereby irregularities in drain modulation voltage S14 such as a distortion or delay caused by an impedance component of the extra path 420 are reduced, making it possible to appropriately perform signal amplification using drain modulation.

Furthermore, in the amplifier apparatuses 10A, 10B, and 10F (see FIGS. 3, 6, and 13), the output portion 250 of each of the power supply units 201A and 201B and the power supply IC 260 is located immediately below the conductor (quarter wavelength path 410) connected to the input portion 150 of the amplifier unit 101 with the printed circuit board 400 interposed therebetween. At this time, since the end of the quarter wavelength path 410 and the output portion 250 are disposed close to each other with the printed circuit board 400 interposed therebetween, the extra path 420 of the power supply path can be reduced (or the extra path 420 can be eliminated). Therefore, irregularities in drain modulation voltage S14 such as a distortion or delay caused by an impedance component of the extra path 420 can be effectively reduced.

Note that the reason that the output portion 250 of the modulation power supply circuit 200 (or the power supply unit 201 including the modulation power supply circuit 200) is placed to be immediately below the conductor (quarter wavelength path 410) connected to the input portion 150 of the amplifier circuit 100 (or the amplifier unit 101 including the amplifier circuit 100) with the printed circuit board 400 interposed therebetween is to effectively reduce irregularities in drain modulation voltage S14 such as a distortion or delay caused by an impedance component of the extra path 420. Therefore, in the present invention, the output portion 250 of the modulation power supply circuit 200 (or the power supply unit 201 including the modulation power supply circuit 200) does not necessarily need to be placed to be immediately below the conductor (quarter wavelength path 410) connected to the input portion 150 of the amplifier circuit 100 (or the amplifier unit 101 including the amplifier circuit 100) with the printed circuit board 400 interposed therebetween.

When signal amplification using drain modulation is performed in the amplifier apparatus 10, disturbing waves such as leakage signals may be emitted from the amplifier circuit 100 (or the amplifier unit 101 including the amplifier circuit 100), the modulation power supply circuit 200 (or the power supply unit 201 including the modulation power supply circuit 200), and the like. Disturbing waves such as electromagnetic waves emitted from the amplifier unit 101 and the power supply unit 201 whose circuits are packaged in a unit and which are surrounded by their respective unit housings undergo electromagnetic cut-off by the unit housings and thus are reduced, but in that case, too, it is considered that disturbing waves may be emitted from the terminals or connectors of the unit housings. The disturbing waves may adversely affect other elements such as a receiving circuit.

Hence, the amplifier circuit 100, the input portion 150, the modulation power supply circuit 200, the output portion 250, and the conductor (power supply path) connecting the input portion 150 to the output portion 250 are hermetically sealed by the printed circuit board 400, the metal chassis 500, the shield 650, the unit housings, etc., which are structures having the electromagnetic cut-off function, whereby disturbing waves emitted from the amplifier apparatus 10 undergo electromagnetic cut-off, making it possible to prevent erroneous operation of the amplifier apparatus 10 and elements located around the amplifier apparatus 10.

Moreover, a first hermetically sealed space (shielding space) formed by the shield 650 and the printed circuit board 400 is formed on the side of the front surface 400a of the board 400, and a second hermetically sealed space (shielding space) formed by the printed circuit board 400, the metal chassis 500, the unit housings, etc., is formed on the side of the back surface 400b of the board 400.

Since the second hermetically sealed space (shielding space) is formed, even if the power supply circuit 200 (power supply unit 201) is disposed outside the first hermetically sealed space covering the amplifier circuit 100 (amplifier unit 10), leakage signals can be prevented from becoming disturbing waves.

In addition, since the printed circuit board 400 and the metal chassis 500 have excellent heat conduction, heat can be dissipated by thermal contact. Thus, even if the amplifier circuit 100 (or the amplifier unit 101 including the amplifier circuit 100) and the modulation power supply circuit 200 (or the power supply unit 201 including the modulation power supply circuit 200) are located in hermetically sealed spaces 600 defined by structures having the electromagnetic cut-off function, by bringing them into thermal contact with the printed circuit board 400 and the metal chassis 500, heat emitted upon operation can be dissipated.

Note that performing electromagnetic cut-off of the output portion 250 is a precaution against the case of the occurrence of disturbing waves such as leakage signals, and in the present invention the output portion 250 of the modulation power supply circuit 200 (or the power supply unit 201 including the modulation power supply circuit 200) does not necessarily need to be located in the hermetically sealed space 600 defined by structures having the electromagnetic cut-off function.

<Variant>

Figure 16:
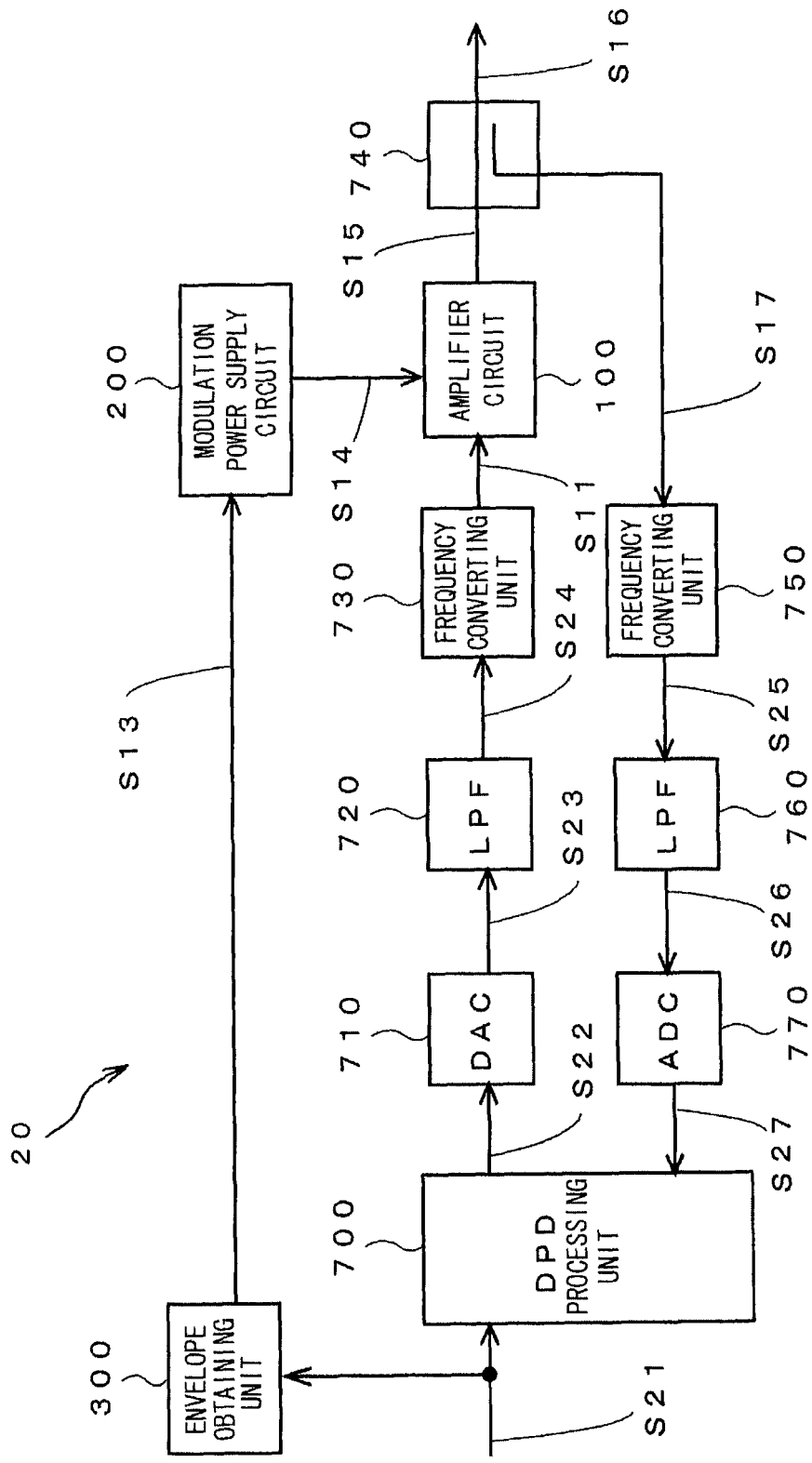
FIG. 16 is a block diagram schematically showing a configuration of a signal processing apparatus according to a variant of the present invention.

A signal processing apparatus 20 according to a variant of the present invention is an amplifier apparatus that performs distortion compensation of input-output characteristics of the amplifier apparatus by DPD (Digital Pre-Distortion) when performing signal amplification using drain modulation. FIG. 16 is a block diagram schematically showing a configuration of the signal processing apparatus 20. The signal processing apparatus 20 includes an amplifier circuit 100; a modulation power supply circuit 200 which is a power supply circuit that supplies a variable power supply voltage for performing drain modulation; an envelope obtaining unit 300; a DPD processing unit 700 which is a distortion compensating unit; a DAC (Digital to Analog Converter) 710; an LPF (Low Pass Filter) 720; a frequency converting unit 730; a coupler 740; a frequency converting unit 750; an LPF 760; and an ADC (Analog to Digital Converter) 770.

Next, the operation of the signal processing apparatus 20 will be described. An input signal S21 being a digital signal is inputted to the envelope obtaining unit 300 and the DPD processing unit 700. The envelope obtaining unit 300 obtains an envelope component of the input signal S21 and inputs the envelope component to the modulation power supply circuit 200 as an envelope information signal S13. Based on the inputted envelope information signal S13, the modulation power supply circuit 200 inputs a drain modulation voltage S14 which is a variable power supply voltage for performing drain modulation, to the amplifier circuit 100. The amplifier circuit 100 performs signal amplification using drain modulation, using the inputted drain modulation voltage S14.

Furthermore, the DPD processing unit 700 performs distortion correction on the input signal S21 and outputs a signal S22. Distortion correction performed by the DPD processing unit 700 will be described later. The DAC 710 to which the signal S22 has been inputted converts the signal S22 being a digital signal into a signal S23 being an analog signal and outputs the signal S23. The LPF 720 performs an unnecessary wave reduction process on the inputted signal S23 and outputs a baseband signal S24. The frequency converting unit 730 converts the frequency of the inputted signal S24 and outputs a signal S11 having a target frequency of the signal processing apparatus 20. The amplifier circuit 100 performs signal amplification using drain modulation, on the inputted signal S11 and outputs a signal S15. The coupler 740 splits the inputted signal S15 into an output signal S16 and a feedback signal S17. Then, the output signal S16 serves as output from the signal processing apparatus 20.

The feedback signal S17 split by the coupler 740 is inputted to the frequency converting unit 750. The frequency converting unit 750 converts the frequency of the feedback signal S17 and outputs a signal S25 having a baseband frequency. The LPF 760 performs an unnecessary wave reduction process on the inputted signal S25 and outputs a signal S26. The ADC 770 converts the signal S26 being an inputted analog signal into a signal S27 being a digital signal and outputs the signal S27 to the DPD processing unit 700.

Next, distortion correction performed by the DPD processing unit 700 will be described. The signal S27 inputted to the DPD processing unit 700 includes a signal distortion component of the signal S15 which is an output signal from the amplifier circuit 100. The DPD processing unit 700 obtains a distortion component included in the signal S27 and provides the input signal S21 with an inverse distortion having an inverse characteristic to the distortion component and thereby cancels out the distortion of the signal S15 by the inverse distortion provided by the DPD processing unit 700, correcting the distortion of the signal. Since the circuit that corrects the distortion is a feedback loop, the distortion characteristic of the output signal S16 is reduced by a feedback process.

The amplifier circuit 100, modulation power supply circuit 200, and envelope obtaining unit 300 of the signal processing apparatus 20 are the same as those of an amplifier apparatus 10 according to the embodiment of the present invention, and the amplifier circuit 100 is disposed on a front surface of a board and an output portion 250 of the modulation power supply circuit 200 is disposed on a back surface (second principal surface 400b) of the board. Then, an input portion 150 of the amplifier circuit 100 and the output portion 250 of the modulation power supply circuit 200 are wired by a conductor 411 penetrating through the printed circuit board 400, whereby a power supply path can be appropriately set, making it possible to reduce the influence of an impedance component by a distributed constant caused by the power supply path while performing signal amplification using drain modulation. In addition, by hermetically sealing the amplifier circuit 100, the input portion 150, the modulation power supply circuit 200, the output portion 250, and a conductor (power supply path) connected to the input portion 150 and the output portion 250 by structures having the electromagnetic cut-off function, erroneous operation caused by disturbing waves such as leakage signals can be prevented.

Then, the signal processing apparatus 20 corrects, by DPD, the signal distortion of the amplified signal S15 outputted from the amplifier circuit 100. Therefore, the signal processing apparatus 20 can perform distortion compensation of input-output characteristics while performing signal amplification using drain modulation.

In such a circuit having a feedback loop that performs distortion compensation of input-output characteristics, if the distortion component of the signal S27 inputted to the DPD processing unit 700 which is a distortion compensating unit is a distortion occurring due to a cause other than the distortion component of the signal S15, then it is difficult to perform normal distortion correction. In particular, when signal amplification using drain modulation is performed, if there is a delay or distortion in the drain modulation voltage S14 outputted from the modulation power supply circuit 200, then the signal-amplified signal S15 turns out to have a distortion caused by the drain modulation voltage S14 and thus distortion correction of input-output characteristics may not be able to be appropriately performed. Hence, by using the signal processing apparatus 20 according to the variant of the present invention, irregularities in drain modulation voltage S14 from the modulation power supply circuit 200 such as a delay or distortion are reduced, making it possible to appropriately perform distortion compensation of input-output characteristics while performing signal amplification using drain modulation.

It is assumed that the signal processing apparatus 20 according to the variant of the present invention is used to amplify a signal to the transmit output of a transmitter such as a radio base station. Signal amplification of the transmit output of the transmitter may require leakage power control with a very high degree of accuracy (e.g., a spurious disturbance ratio of −50 dBc). When transmitting such a highly accurate signal, signal distortion compensation needs to be appropriately performed. Thus, by using the signal processing apparatus 20 capable of reducing the influence of an impedance component by a distributed constant caused by the power supply path while performing amplification using drain modulation, leakage power of the transmit signal can be suppressed.

Furthermore, when signal amplification of transmit output is performed in a radio base station, etc., in many cases, a transmitting system circuit and a receiving system circuit are adjacent to each other. In such a case, a disturbing wave generated from the transmitting system that has high power may wrap around the receiving system, which may cause erroneous operation. Even in such a case, since the signal processing apparatus 20 provides electromagnetic shielding to the amplifier circuit 100, the input portion 150, the modulation power supply circuit 200, the output portion 250, and the conductor (power supply path) connected to the input portion 150 and the output portion 250 which are disturbing wave generation portions, erroneous operation caused by a wraparound signal can be prevented.

Note that the "amplifier apparatus" in chapter 1 may be simply represented by the term "amplifier". Alternatively, the "amplifier circuit" in chapter 1 may be represented by the term "amplifier".

In the following chapters 2 and 3, a component corresponding to the "amplifier circuit" in chapter 1 is represented by the term "amplifier".

[Chapter 2 Mounting Structure of Connectors of a Receive Signal Cable]

Figure 17:
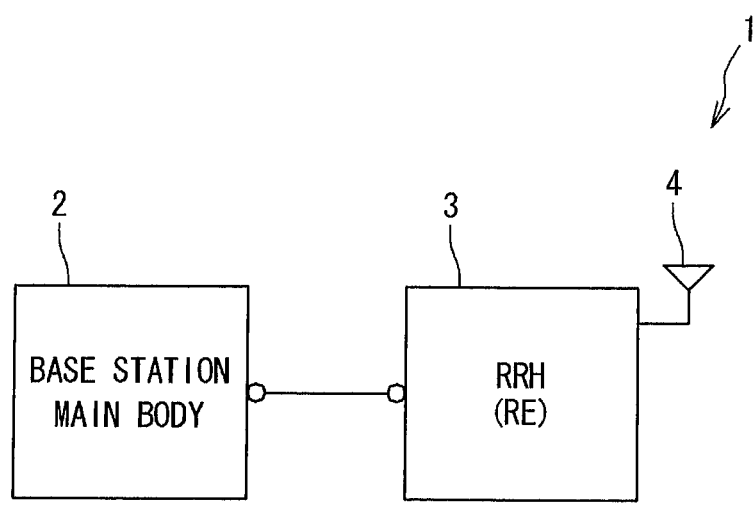
FIG. 17 is a block diagram showing an overall configuration of a radio base station apparatus (radio communication apparatus) according to a first embodiment of the present invention in chapter 2.

FIG. 17 is a block diagram showing an overall configuration of a radio base station apparatus (radio communication apparatus) 1 according to a first embodiment of the present invention in chapter 2. The radio base station apparatus 1 is, for example, a base station apparatus used in a system for mobile radio terminals, such as mobile phones, to which LTE (Long Term Evolution) is applied, and performs communication conforming to LTE with other base station apparatuses and terminal apparatuses. Note that the communication standard to which the radio communication apparatus conforms is not limited to LTE and other communication standards may be used.

The frequencies used for LTE are broadly divided into the 800 MHz band, the 1.5 GHz band, the 1.7 GHz band, and the 2 GHz band, and furthermore, from among them frequencies with a bandwidth of several tens of MHz are allocated as a used frequency band for each carrier.

In LTE, a Frequency Division Duplex (FDD) scheme can be adopted. In the radio communication apparatus 1 of the present embodiment, description is made assuming that the communication system adopts the FDD scheme and the frequency band of a receive signal thereof is set, for example, to 1920 MHz to 1980 MHz belonging to the 2 GHz band.

The radio base station apparatus 1 is configured such that Radio Equipment (RE) 3 is connected by an optical fiber or electrical cable to a base station main body 2 having a baseband processing unit (radio equipment control unit). An antenna 4 for transmission and reception is connected to the radio equipment 3. The antenna 4 is installed on a mast or on top of a building. As shown in FIG. 17, the radio equipment 3 separated from the base station main body 2 is referred to as an "RRH (Remote Radio Head)".

Note that the radio base station apparatus 1 may be such that the base station main body 2 and the radio equipment 3 are integrally formed.

The base station main body 2 mainly performs a baseband signal processing on a radio signal in the digital domain and controls the radio equipment 3. The radio equipment 3 includes a radio transmitter and a radio receiver and performs transmission and reception of radio signals with mobile radio terminals.

Figure 18:
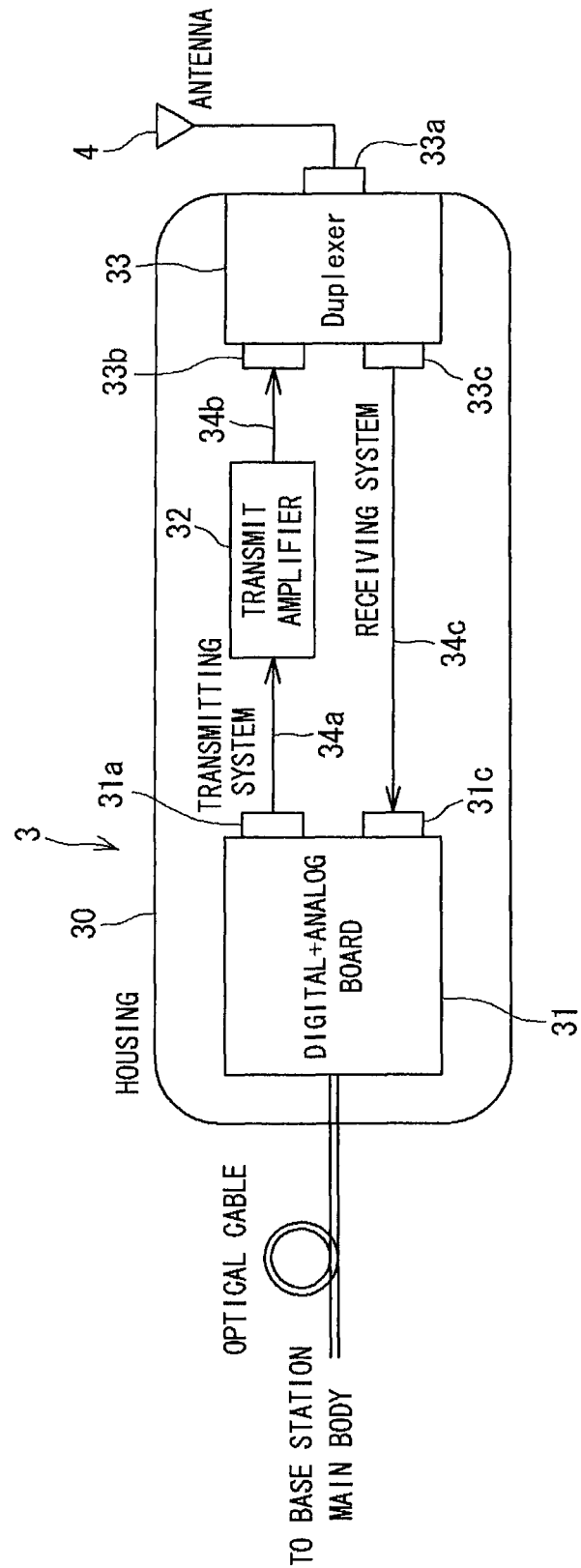
FIG. 18 is a configuration diagram of a circuit in a housing of radio equipment 3.

As shown in FIG. 18, the radio equipment 3 is configured to accommodate, in a housing 30, various circuit components 31, 32, and 33 for allowing the radio equipment 3 to function as the radio equipment 3. The housing 30 accommodates therein circuit components such as the signal processing circuit board (digital+analog board) 31 that performs digital signal processing and analog signal processing, the transmit amplifier 32, and the duplexer (antenna sharing device) 33, and cables 34*a*, 34*b*, and 34*c* that connect these circuit components.

The duplexer 33 includes a first connector 33*a* to which a cable (coaxial cable) extending to the antenna 4 is connected; a second connector 33*b* to which a transmit signal is inputted; and a third connector 33*c* from which a receive signal is outputted. The cable (coaxial cable) 34*b* of a transmitting system is connected to the second connector 33b, and the cable (coaxial cable) 34c of a receiving system is connected to the third connector 33c.

The signal processing circuit board 31 includes a connector 31a to which the cable (coaxial cable) 34a of the transmitting system is connected; and a connector 31c to which the cable (coaxial cable) 34c of the receiving system is connected.

A digital transmit signal provided to the radio equipment 3 from the base station main body 2 is converted by the signal processing circuit board 31 into an analog transmit signal, and the analog transmit signal is further amplified by the transmit amplifier 32 and the amplified transmit signal is thereafter outputted from the antenna 4 via the duplexer 33.

When a radio signal from a mobile radio terminal is received by the antenna 4, the receive signal is provided to the board 31 through the duplexer 33. The board 31 performs analog signal processing on the receive signal and converts the analog receive signal into a digital signal and outputs the digital signal to the base station main body 2.

Figure 19:
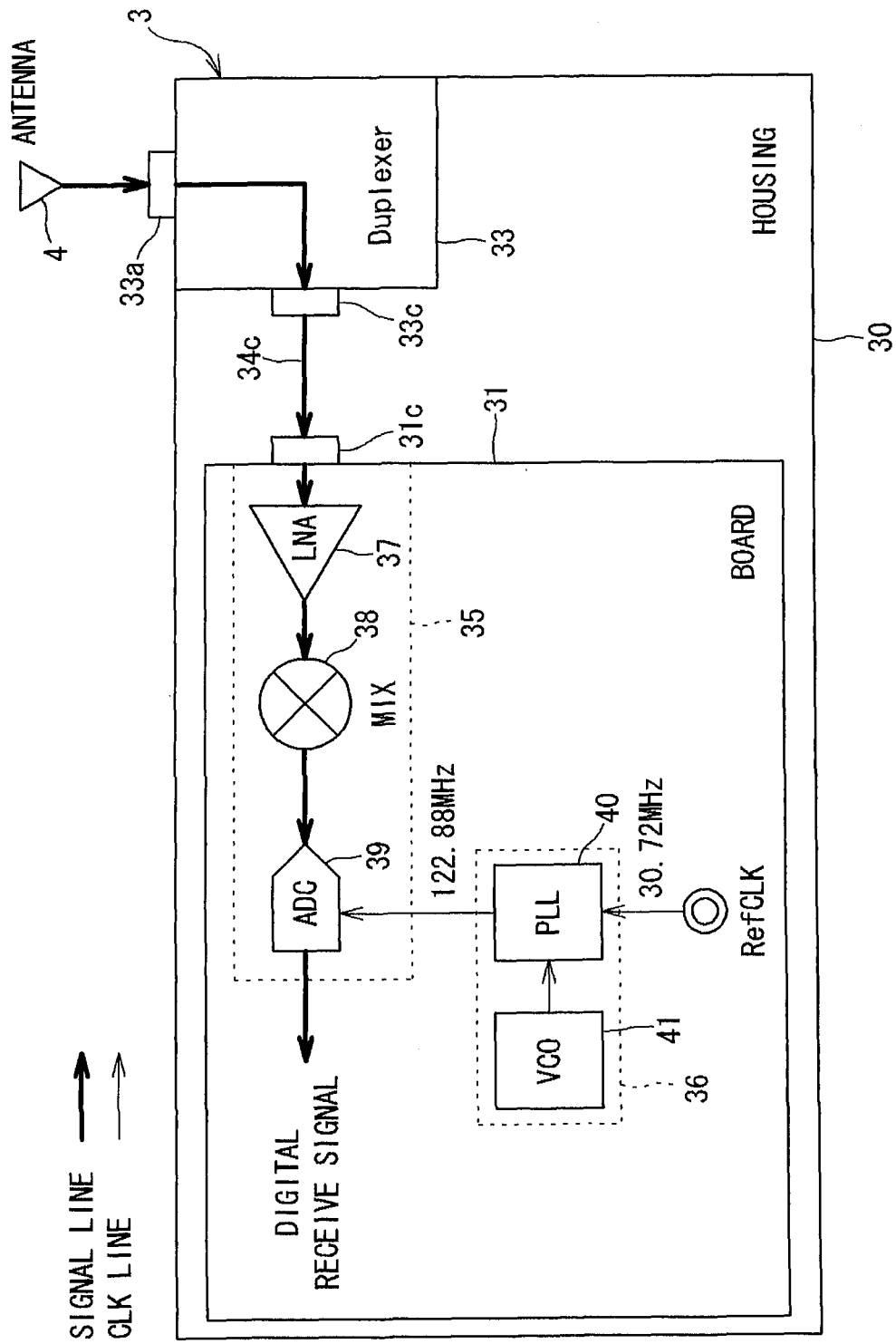
FIG. 19 is a circuit diagram showing a receiver and a clock circuit of the radio equipment 3.

FIG. 19 shows main configurations of a receiver (analog signal processing unit) 35 and a clock circuit 36 on the signal processing circuit board 31.

The receiver 35 includes an amplifier 37, a mixer 38, and an A/D converter (ADC) 39. The amplifier 37 is configured by a low-noise amplifier (LNA) and amplifies a receive signal flowing through the connector 31c. The mixer 38 performs frequency conversion of the receive signal amplified by the LNA 37. The A/D converter 39 converts the analog receive signal provided from the mixer 38 into a digital signal. The receive signal converted by the A/D converter 39 into the digital signal is outputted to the base station main body 2 (FIG. 17) through a digital signal processing unit (not shown) provided on the board 31.

The A/D converter 39 is connected to a PLL 40 which will be described later, and samples an analog receive signal based on an operation clock provided from the PLL 40 and outputs the receive signal having been converted into a digital signal.

In addition, the signal processing circuit board 31 includes, as the clock circuit 36, the PLL (Phase Lock Loop) 40 and an oscillator 41.

The PLL 40 is to allow free-running oscillation output from the oscillator 41 to achieve phase synchronization with a reference clock (RefCLK). Output from the PLL 40 is supplied to the A/D converter 39, etc., as an operation clock. The oscillator 41 provides a reference clock which serves as a reference operation clock, to the PLL 40.

For the PLL 40, for example, an integer frequency division type PLL can be adopted. The integer frequency division type PLL 40 frequency-divides, by a frequency divider included in the PLL 40, clock output provided from the oscillator 41 into the same clock frequency as the reference clock, and compares the phase difference between the frequency-divided clock and the reference clock. The PLL 40 provides the phase difference component to the oscillator 41 as a control signal for synchronization.

The oscillator 41 is configured by a Voltage Controlled Oscillator (VCO). The voltage controlled oscillator 41 has the function of controlling, based on a control signal, a clock oscillated thereby such that the clock and the reference clock have a constant phase difference.

In the present embodiment, the above-described reference clock is at 30.72 MHz and the oscillation frequency of a clock which is free-running oscillated by the oscillator 41 is 245.76 MHz.

Note that the A/D converter 39 of the present embodiment operates by being provided with an operation clock of 122.88 MHz. Hence, the output from the PLL 40 is frequency-divided into 122.88 MHz by the frequency divider not shown, and is then supplied to the A/D converter 39 as an operation clock.

In the oscillator 41, in addition to an oscillation frequency (245.76 MHz) to be outputted essentially, a harmonic that is an integer multiple of the oscillation frequency may be generated as noise. The inventors of the present invention have found that, though the intensity of the harmonic is not so high, as a result of improving receive sensitivity, for a receive signal with a relatively low intensity the intensity becomes a non-negligible level. Therefore, if a harmonic generated from the oscillator 41 is included in the range of the frequency band of a receive signal, then the harmonic becomes noise, adversely affecting reception.

Figure 20:
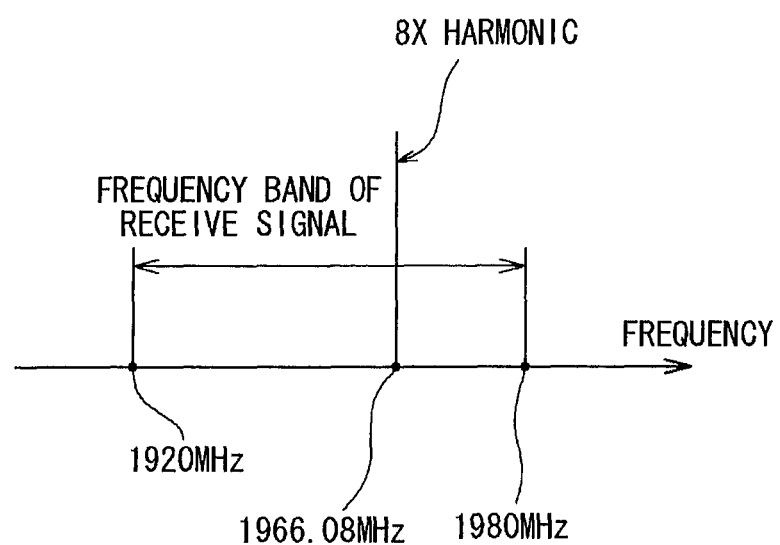
FIG. 20 is a diagram showing a certain harmonic of an oscillator included in the range of the frequency band of a receive signal.

FIG. 20 shows a state in which an 8× wave of an oscillation frequency (245.76 MHz) outputted from the oscillator 41 is included in the range of 1920 MHz to 1980 MHz which is the frequency band of a receive signal. Note that for harmonics from the oscillator 41, frequencies that are other integer multiples than 8× are also present, but harmonics out of the frequency band of the receive signal do not become noise. Note that to avoid a harmonic from the oscillator 41 from becoming noise, it is considered to select the oscillation frequency of the oscillator 41 such that all of the harmonics of the oscillation frequency outputted from the oscillator 41 are frequencies out of the frequency band of the receive signal, but in that case, flexibility in the selection of the oscillation frequency of the oscillator 41 decreases.

Even if a harmonic of the oscillation frequency (245.76 MHz) outputted from the oscillator 41 is included in the range of the frequency band of the receive signal, to reduce the influence of the harmonic on receive sensitivity, there is a need to prevent as much as possible the harmonic from getting on the receive signal.

However, the inventors of the present invention have found that just taking general measures against noise, such as using a coaxial cable as the cable 34c through which a signal received by the antenna is transmitted or using the coaxial connectors 31c and 33c as connectors that connect the coaxial cable 34c, does not prevent a harmonic from the oscillator 41 from getting on a receive signal at the location of the connector 31c provided on the board 31.

Figure 21:
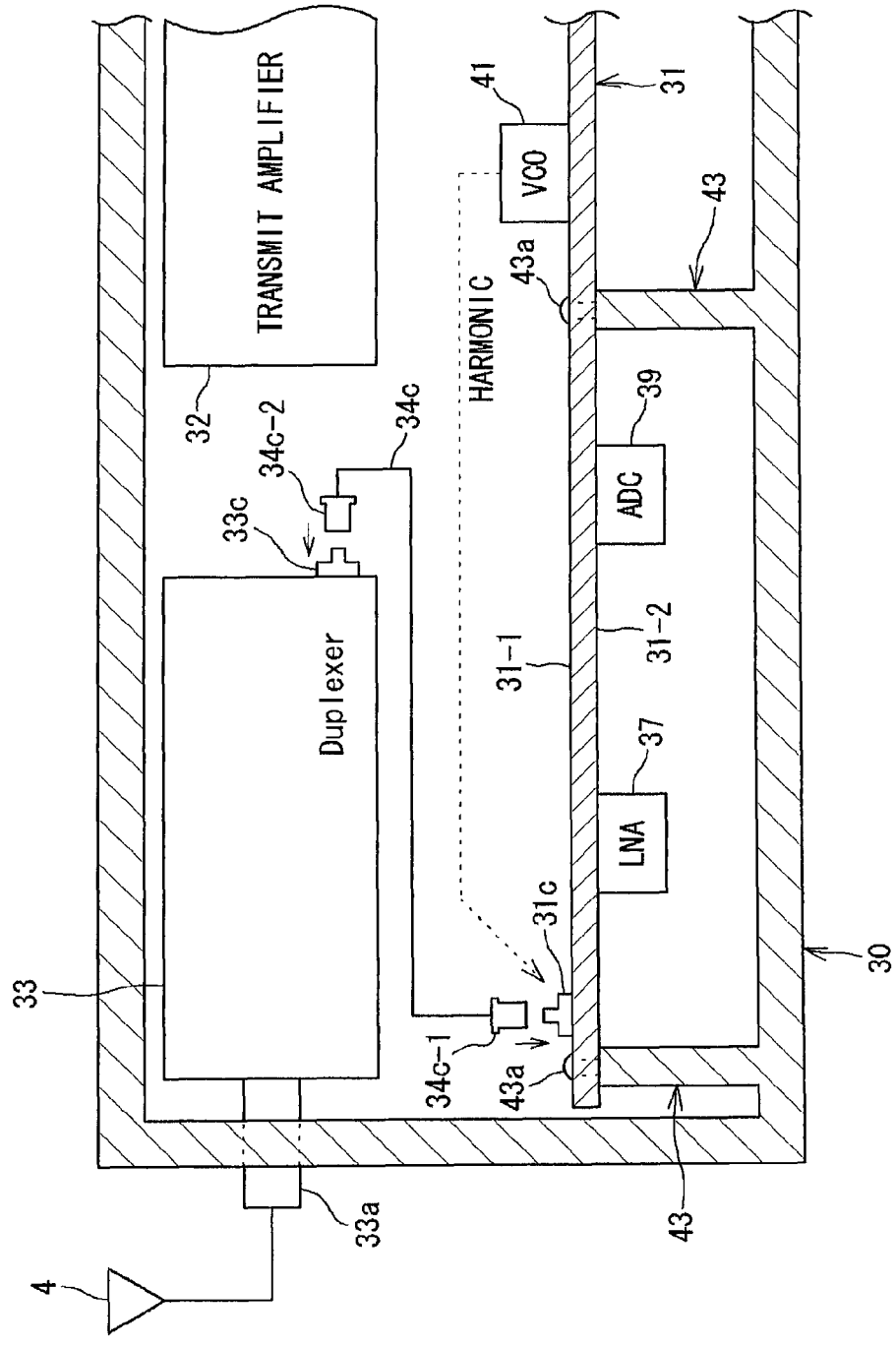
FIG. 21 is a diagram of disposition of the circuit in the housing of the radio equipment 3.

FIG. 21 shows disposition of the circuit components 31, 32, and 33 around the connector 31c provided on the signal processing circuit board 31 in the housing 30 of the radio equipment 3. Circuit components such as the board 31, the transmit amplifier 32, and the duplexer 33 are accommodated in the housing 30 made of a conductive material. Note that the components constituting the duplexer 33 are housed in a duplexer housing made of a conductive material.

Figure 23:
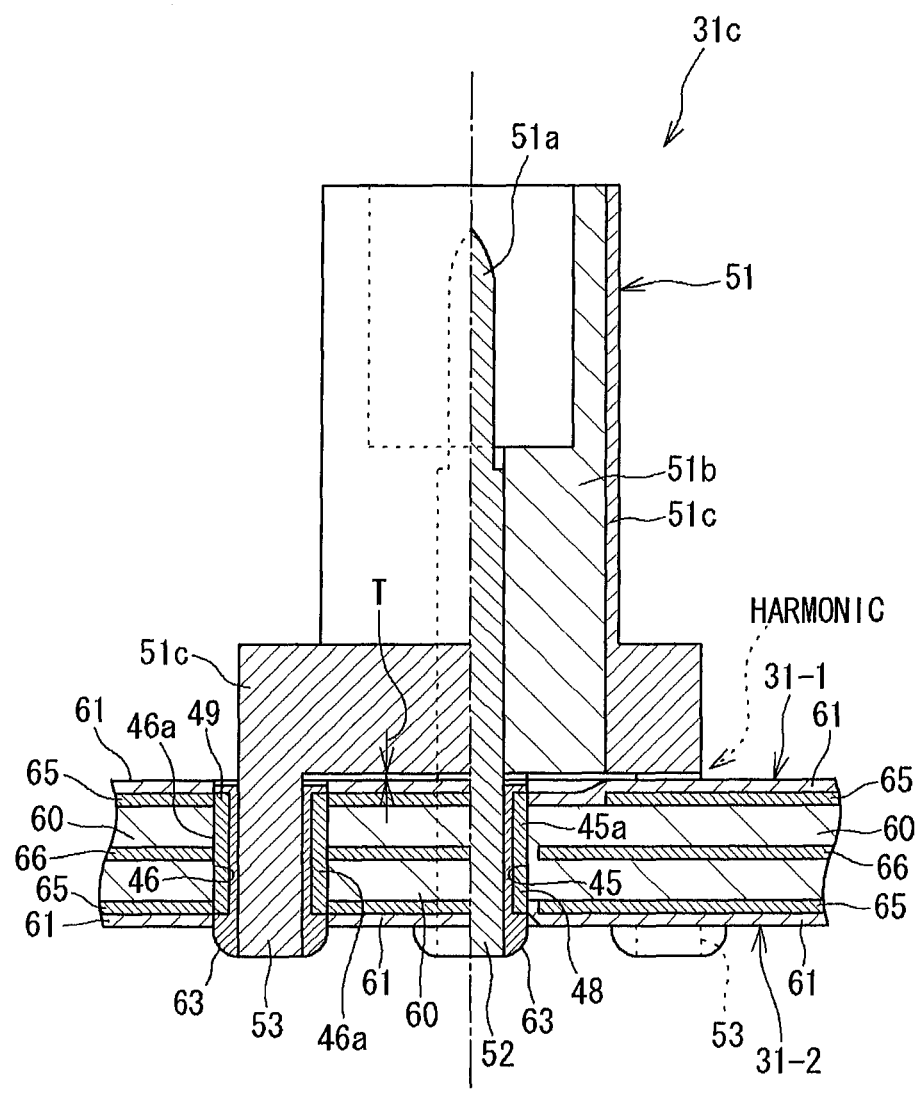
FIG. 23 is a cross-sectional view along line A-A of FIG. 22.

The board 31 according to the present embodiment is a multi-layer board in which conductive circuit patterns (ground patterns 65 or signal line patterns) are formed on both sides of an insulating substrate, and as shown in FIG. 23, an intermediate layer (ground plane layer) 66 is formed in the middle in a thickness direction of the board 31. Hence, the board 31 has a structure that makes it difficult for noise to pass through the board 31 in the thickness direction. The board 31 has resists (solder resists) 61 formed on both sides thereof. The resists are coatings made of an insulating material (resin). By forming the resists, portions of the conductive circuit patterns that require soldering, etc., are exposed, but other portions (circuit patterns or insulating substrate) are covered by the insulating material.

The above-described clock circuit 36 is provided on a first surface 31-1 of the board 31. That is, the oscillator 41 is provided on the first surface 31-1 of the board 31. In addition, (a connector main body 51 of) the coaxial connector 31c is mounted on the first surface 31-1. The connector 31c is mounted on the board 31 such that a signal terminal is inserted into a through-hole penetrating through the board 31 and is soldered on the side of a second surface 31-2 of the board 31.

To the connector 31c is connected the coaxial cable 34c that connects the connector 31c to the third connector 33c provided on the housing of the duplexer 33. Note that plug connectors (coaxial connectors) 34c-1 and 34c-2 are provided at the respective ends of the cable 34c, and the plug connectors 34c-1 and 34c-2 are respectively connected to the connector 31c on the board 31 and the third connector 33c of the duplexer 33.

The receiver (analog signal processing unit) 35 is provided on the second surface 31-2 of the board 31. That is, circuit elements constituting the receiver 35 such as the LNA 37 and the A/D converter 39 are provided on the second surface 31-2 of the board. A signal line pattern (not shown) extending from the through-hole into which the signal terminal of the connector 31c is inserted is formed on the second surface 31-2 of the board 31, and the LNA 37, the A/D converter 39, etc., are disposed on the signal line pattern.

In addition, in order to suppress noise from getting on the signal line pattern, etc., formed on the second surface 31-2 of the board 31, an electromagnetic shield 43 that covers the analog signal processing unit of the receiver 35 is provided on the second surface 31-2 of the board 31. The electromagnetic shield 43 uses a part of the housing 30. That is, the housing 30 itself and wall portions vertically provided from the inner surfaces of the housing 30 cover the analog signal processing unit, thereby forming the electromagnetic shield 43 that prevents entry of noise from the outside of the shield. Note that the wall portions 43 and the board 31 are secured by screws 43a.

By the electromagnetic shield 43 and the board 31 that is difficult for noise to be transmitted therethrough, noise is prevented from getting on the signal line pattern extending from the through-hole into which the signal terminal of the connector 31c is inserted, on the second surface 31-2 of the board 31. Note that when noise gets on a receive signal, it is particularly problematic when noise gets on a path up to the amplifier (LNA 37) that performs first amplification in the receiver 35. That is, since a receive signal before amplification is very weak, even if noise is very weak, the adverse influence of the noise becomes relatively great. Therefore, the electromagnetic shield 43 is sufficient if it can cover a portion of the signal line pattern on the second surface 31-2 of the board 31 from the through-hole into which the signal terminal of the connector 31c is inserted to the amplifier (LNA 37) that performs first amplification.

From a general point of view, the structure shown in FIG. 21 can be evaluated as taking sufficient measures against noise. That is, the antenna 4 and the duplexer 33 are connected to each other by a coaxial cable and the inside of the duplexer 33 is protected by the duplexer housing (electromagnetic shield). Furthermore, the duplexer 33 and the board 31 are connected to each other by a coaxial cable, and the signal line pattern on the second surface 31-2 of the board 31 is protected by the electromagnetic shield 43. Hence, it is generally considered that there is no room for a harmonic and other noise from the oscillator 41 to enter the path up to the LNA 37.

However, as a result of an actual investigation by the inventors of the present invention, noise corresponding to a harmonic of the oscillator 41 has gotten on a receive signal. The inventors of the present invention have estimated that noise from the oscillator 41 enters at the location of the coaxial connector 31c on the board 31 and estimated that the noise enters between the coaxial connector 31c and the board 31. The inventors of the present invention have verified the correctness of such estimation by experiment (details will be described later).

Note that since the third connector (coaxial connector) 33c of the duplexer 33 is firmly mounted on the duplexer housing made of a conductive material by a screw clamp, etc., entry of noise between the third connector 33c and the duplexer housing is not problematic.

Figure 22:
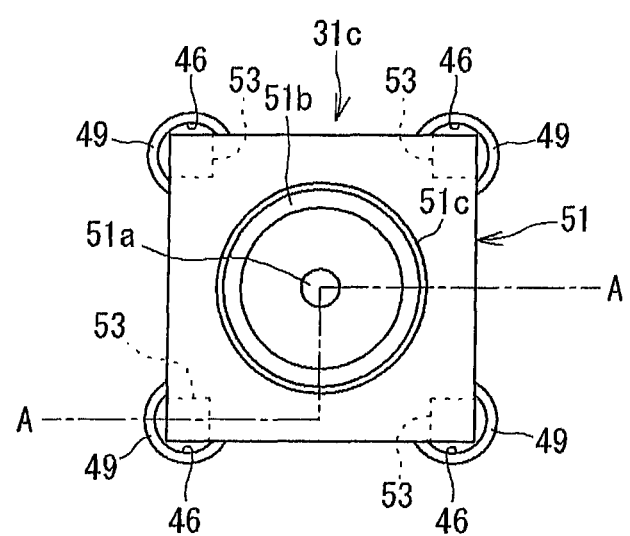
FIG. 22 is a plan view of a coaxial connector (no soldering on the first surface side).
Figure 24:
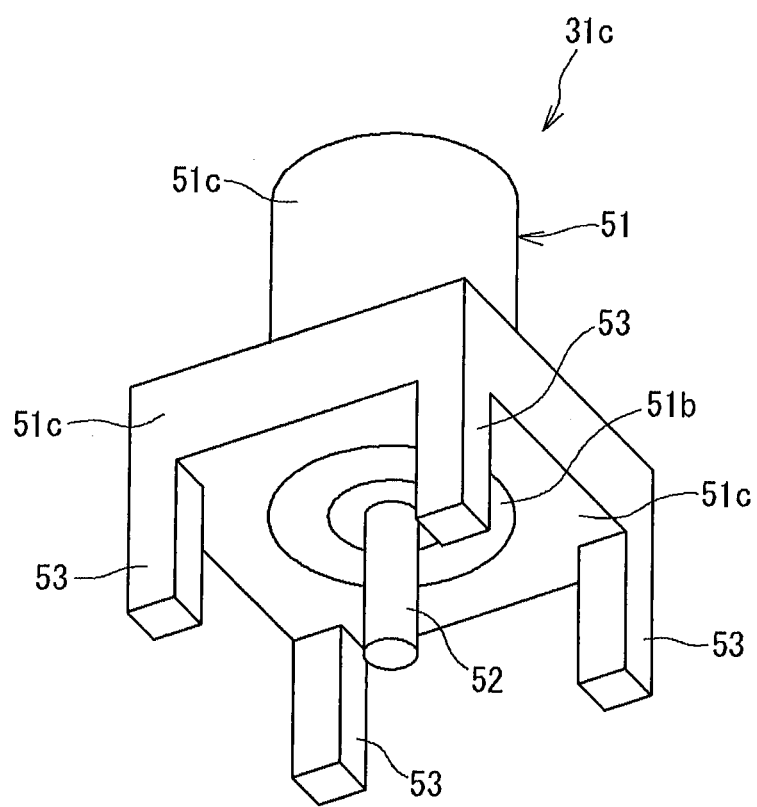
FIG. 24 is a perspective view of the coaxial connector.
Figure 25:
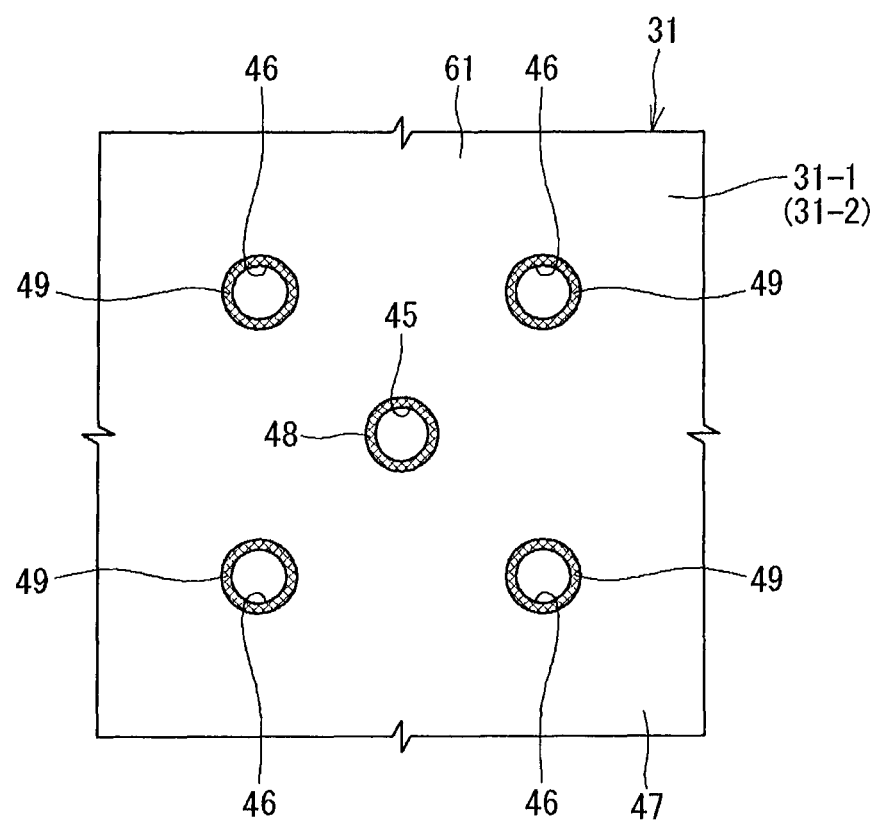
FIG. 25 is a plan view showing through-holes and lands (a first surface and a second surface of a board).

FIGS. 22 to 24 show the coaxial connector 31c mounted on the board 31 and FIG. 25 shows through-holes 45 and 46 made in the board 31. The through-holes 45 and 46 allow terminals (pins) 52 and 53 of the coaxial connector 31c to be inserted thereinto.

As shown in FIG. 24, the coaxial connector 31c is configured such that a single signal terminal (signal pin) 52 and four (a plurality of) ground terminals (ground pins) 53 extend on the connector main body 51 of a coaxial structure to which the connector 34c-1 on the side of the cable 34c is connected. The signal terminal 52 is a terminal extending from an inner conductor (signal line) 51a of the connector main body 51 of a coaxial structure. The ground terminals 53 are terminals extending from an outer conductor (ground) 51c of the connector main body 51 of a coaxial structure. The outer conductor 51c is formed on the side and bottom surfaces of the connector main body 51, and the ground terminals 53 extend from the outer conductor 51c on the bottom surface of the connector main body 51. Note that the connector main body 51 includes an insulator 51b between the inner conductor 51a and the outer conductor 51c.

The signal terminal 52 is inserted into the signal terminal through-hole 45 from the side of the first surface 31-1 of the board 31. Likewise, the ground terminals 53 are inserted into each of the ground terminal through-holes 46 from the side of the first surface 31-1 of the board 31.

As shown in FIG. 23, the inner peripheries of the through-holes 45 and 46 are coated with conductive materials (copper) 45a and 46a. As also shown in FIG. 25, on the first surface 31-1 and second surface 31-2 of the board 31, exposed portions (lands) 48 and 49 where the conductive materials 45a and 46a are exposed to the surfaces of the board 31 (which are not covered with the resists) are formed around the perimeters of the through-holes 45 and 46.

On the second surface 31-2 of the board 31 are formed a signal line pattern (not shown) formed to be connected to the exposed portion 48 of the signal terminal through-hole 45 and a ground pattern 65 formed to be connected to the ground terminal through-holes 46.

Note that on each of the surfaces 31-1 and 31-2 of the board 31 portions where the conductive material (circuit pattern) is not exposed (portions of the circuit pattern that are not exposed or portions on the board substrate 60 where the circuit pattern is not formed) are covered with the resist 61.

The terminals 52 and 53 of the connector 31c inserted into the through-holes 45 and 46 from the side of the first surface 31-1 of the board 31 are soldered by solder 63 on the side of the second surface 31-2. That is, the connector 31c is configured as a so-called DIP type connector in which the terminals 52 and 53 of the connector 31c are mounted by being soldered on the opposite side (second surface 31-2) of the connector placement side (first surface 31-1). Note that when the amount of the solder 63 on the side of the second surface 31-2 is large, as shown in FIG. 23, the solder 63 even enters the through-holes 45 and 46.

As shown in FIG. 23, a gap T is created between the bottom surface of the connector main body 51 and the first surface 31-1 of the board 31. This is because since the terminals 52 and 53 of the connector 31*c* are soldered on the side of the second surface 31-2 with the terminals 52 and 53 inserted into the through-holes 45 and 46 of the board 31 and temporarily secured, it is difficult to completely bring the connector main body 51 and the board 31 into intimate contact with each other.

The gap T is the location where noise enters a signal line (52 and 51*a*) from the outside of the connector 31*c*. In addition, even if the gap between the connector main body 51 and the board 31 is very small, the portions of the resists 61 on the surfaces of the board 31 are also the locations where noise enters.

Figure 26:
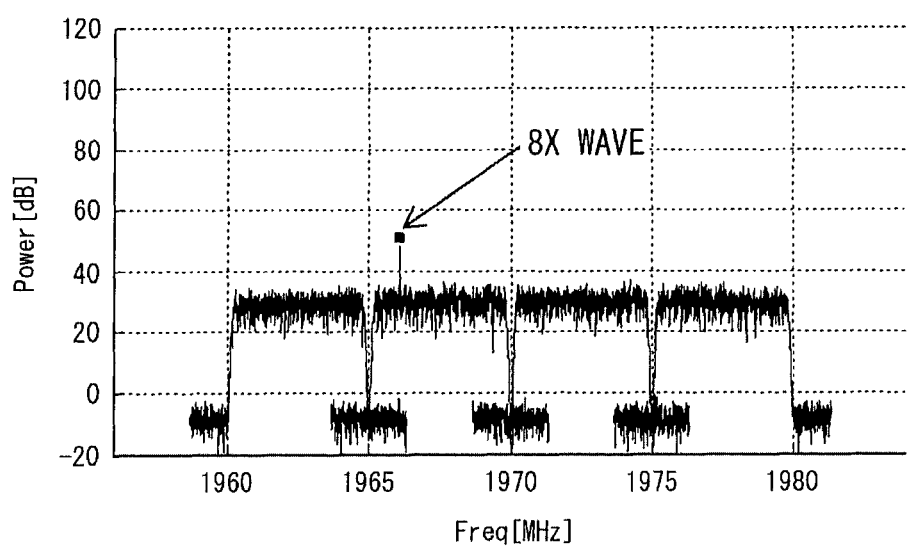
FIG. 26 is a diagram showing a frequency spectrum obtained with a mounting structure of FIG. 23.

FIG. 26 shows a frequency spectrum of a receive signal for the case of mounting the connector 31*c* as shown in FIG. 23 (the case of mounting the connector 31*c* by a normal mounting method). It can be seen from FIG. 26 that noise occurs at 1966.08 MHz corresponding to an 8× wave of the oscillation frequency of the oscillator 41.

Figure 27:
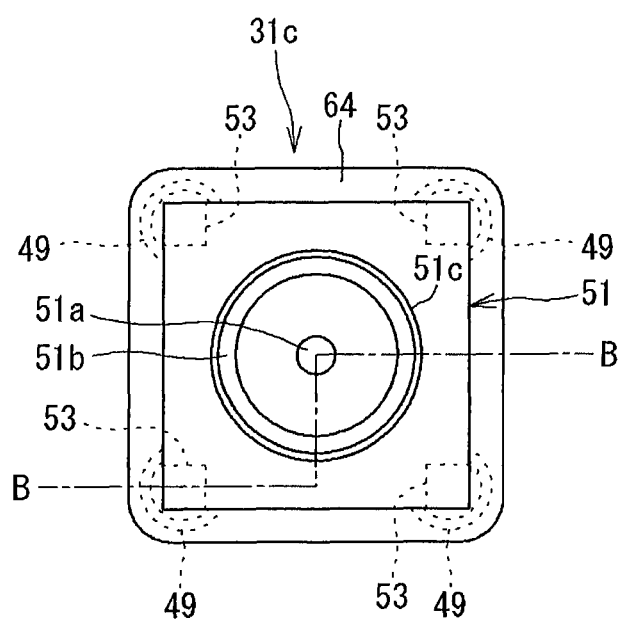
FIG. 27 is a plan view showing a mounting structure of a coaxial connector according to an embodiment.
Figure 28:
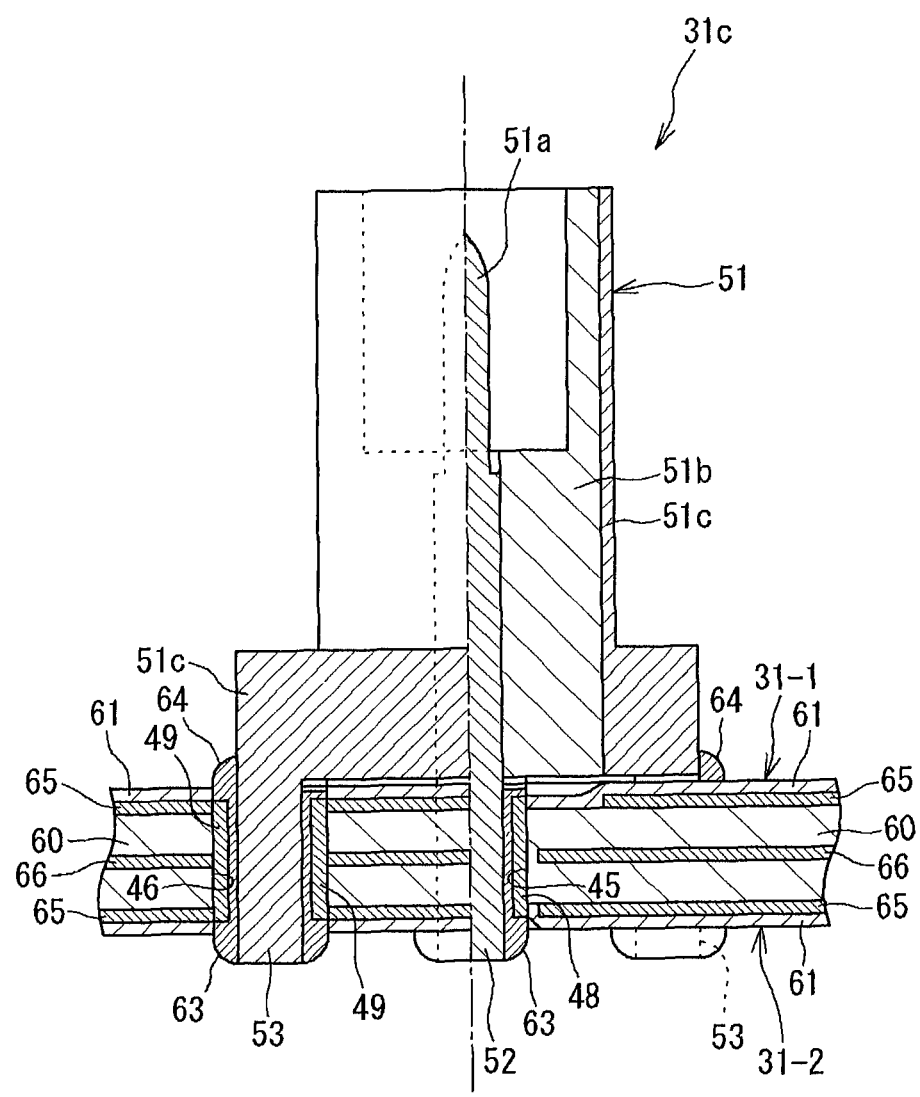
FIG. 28 is a cross-sectional view along line B-B of FIG. 27.

FIGS. 27 and 28 show a connector mounting structure that prevents a harmonic from the oscillator 41 from entering as noise. The mounting structure of FIGS. 27 and 28 differs from the structure of FIG. 23 in that the entire perimeter of a connector main body 51 located on the side of a first surface 31-1 is soldered by solder 64 to the first surface 31-1 of a board 31. Note that in the following for the points, the description of which is omitted in FIGS. 27 and 28, description made for FIGS. 22 to 24 is applied.

The solder 64 is formed on the first surface 31-1 separately from solder 63 formed on a second surface 31-2 of the board 31. The solder 64 is formed around the perimeter (entire perimeter) of the connector main body 51 on the board 31 so as to come into contact with exposed portions (lands) 49 near the location where the connector main body 51 is mounted. By this, the solder 64 electrically connects an outer conductor 51*c* on a surface of the connector main body 51 to the exposed portions 49 on the side of the first surface 31-1 of ground terminal through-holes 46. The exposed portions 49 of the ground terminal through-holes 46 are electrically connected to a ground pattern 65 provided on the second surface 31$^{-2}$ or a ground pattern 65 provided on the first surface 31-1 and thus have a ground potential.

Therefore, the solder 64 formed around the perimeter of the connector main body 51 has a ground potential and thus electromagnetically shields, together with the outer conductor 51*c* of the connector main body 51, a signal line (52 and 51*a*) which is an inner conductor. As a result, even if there is a gap T between the connector main body 51 and the board 31, entry of noise can be prevented.

Note that the solder 64 on the side of the first surface 31-1 consequently acts to connect the connector main body 51 to the circuit pattern (ground pattern 65) on the side of the first surface 31-1. That is, it can be said that in the connector mounting structure of the present embodiment shown in FIGS. 27 and 28, a signal terminal 52 is mounted on the board 31 by a DIP type scheme in which the signal terminal 52 is mounted using a through-hole, and ground terminals 53 are mounted on the board 31 by a surface mounting scheme in which the ground terminals 53 are mounted on the side of the connector main body 51.

Figure 29:
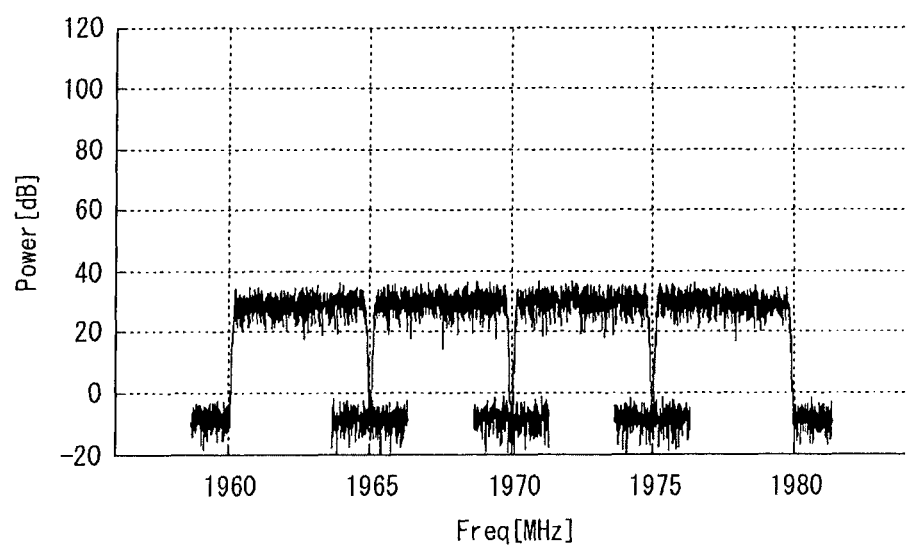
FIG. 29 is a diagram showing a frequency spectrum obtained with the mounting structure of FIGS. 27 and 28.

FIG. 29 shows a frequency spectrum of a receive signal for the case of soldering the entire perimeter of the connector main body 51 without any gap as shown in FIGS. 27 and 28. It can be seen from FIG. 29 that noise corresponding to an 8× wave of the oscillation frequency of the oscillator 41 is not present. Note that the results shown in FIGS. 26 and 29 also prove the correctness of the estimation that a harmonic of the oscillator 41 enters at the location of the connector 31*c* as noise.

Figure 30:
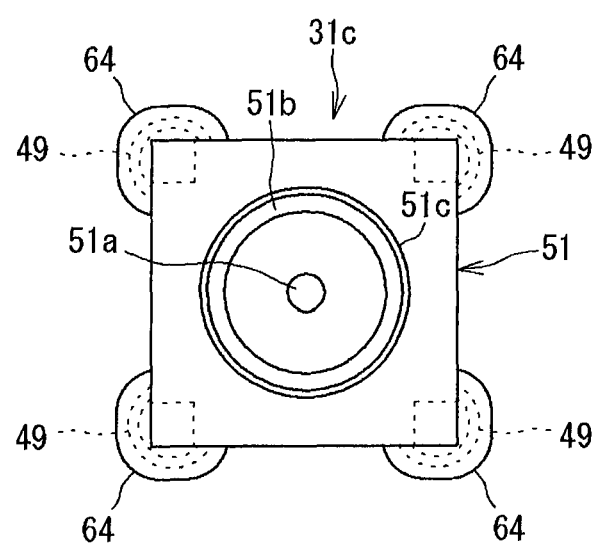
FIG. 30 is a plan view showing a mounting structure of a coaxial connector according to a first variant.

FIG. 30 shows a first variant of the solder mounting structure of FIGS. 27 and 28. While in FIG. 27 the solder 64 is formed around the entire outer periphery of the connector main body 51 without any gap, in FIG. 30 solder 64 is partially formed around the perimeter of a connector main body 51 to fill only a part of a gap T between the connector main body 51 and a board 31. More specifically, in FIG. 30 soldering is performed only at four corners of the connector main body 51 where there are exposed portions 49.

Figure 31:
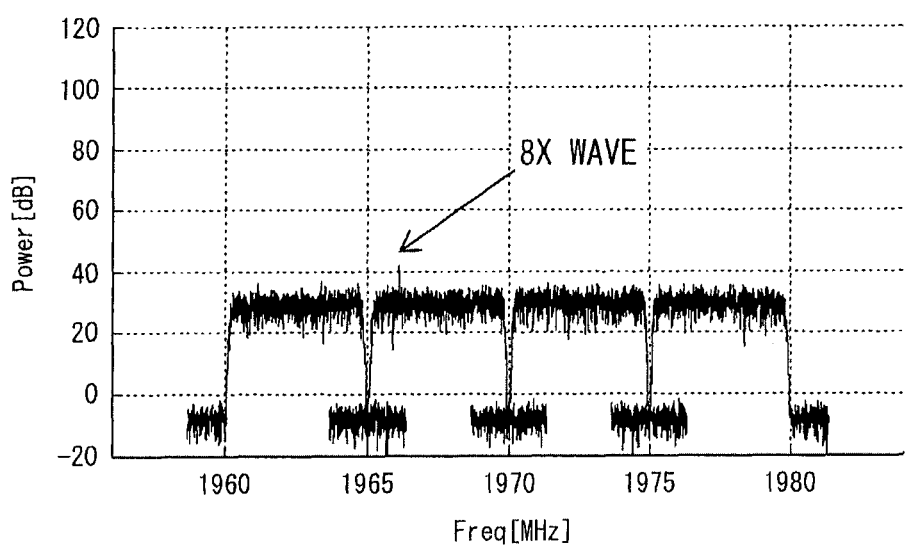
FIG. 31 is a diagram showing a frequency spectrum obtained with the mounting structure of FIG. 30.

FIG. 31 shows a frequency spectrum of a receive signal for the case of performing soldering as shown in FIG. 30. Although in FIG. 31 noise corresponding to an 8× wave of the oscillation frequency of the oscillator 41 is generated, the intensity of the noise is lower than that of FIG. 26 and thus it can be seen that a noise suppression effect is brought about by the solder 64. Therefore, when the intensity of noise is not so high, a sufficient noise suppression effect can be obtained even by partial soldering as shown in FIG. 30.

FIG. 32 shows a second variant of the solder mounting structure of FIGS. 27 and 28. In FIG. 32, instead of performing soldering on the entire perimeter (all four sides) of a rectangular connector main body 51, soldering is performed on some sides (three sides) and the remaining side (one side) is left as it is without performing soldering. In FIG. 32, the side on which soldering is not performed is a side on the opposite side from a direction in which the oscillator 41 is located. Even by such partial soldering, since the amount of a gap T between the connector main body 51 and a board 31 is reduced, the noise suppression effect is higher than those of the mounting structures of FIGS. 22 and 30.

FIGS. 33 to 36 show a third variant of the coaxial connector and the solder mounting structure.

Figure 33:
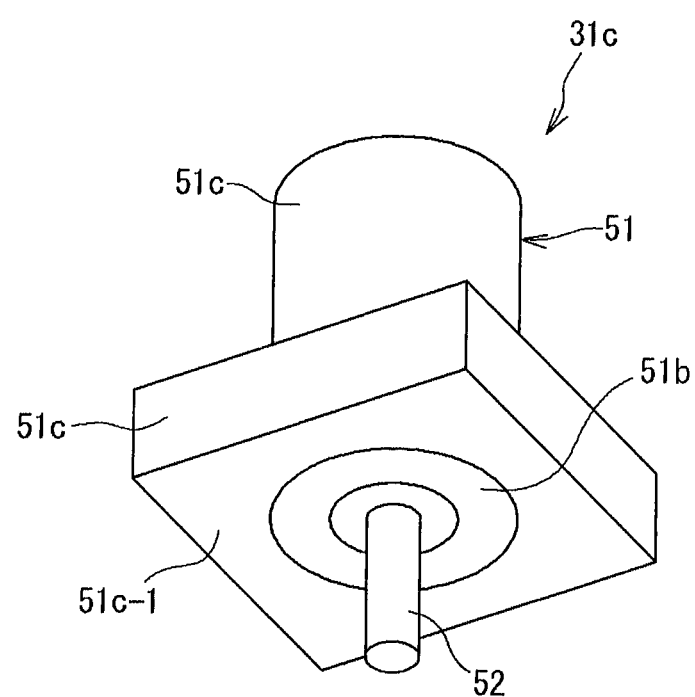
FIG. 33 is a perspective view of a coaxial connector according to a third variant.

As shown in FIG. 33, a coaxial connector 31*c* according to the third variant is such that the ground terminals 53 are removed from the coaxial connector 31*c* shown in FIG. 24. That is, the coaxial connector according to the third variant has a through-hole insertion terminal (signal terminal) 52 extending from an inner conductor 51*a* of a connector main body 51 of a coaxial structure, but does not have through-hole insertion terminals (ground terminals) extending from an outer conductor 51*c* of the connector main body 51. In the coaxial connector 31*c*, the outer conductor 51*c* on a bottom surface of the connector main body 51 is soldered by a reflow soldering process so as to be connected to a circuit pattern (ground pattern 65) on the circuit board. That is, the connector main body 51 is surface-mountable.

Meanwhile, the signal terminal 52 is mounted on a board 31 by a DIP type scheme in which the signal terminal 52 is mounted using a through-hole.

The outer conductor 51*c* of the connector main body 51 has a surface mounting terminal surface 51*c*-1 on the bottom surface side of the connector main body 51. When the connector main body 51 is placed on the side of a first surface 31-1 of the board 31, the surface mounting terminal surface 51*c*-1 faces the first surface 31-1 and serves as a surface to be soldered.

The surface mounting terminal surface 51*c*-1 is formed in a shape surrounding the perimeter of the signal terminal 52 (here, an endless ring shape and the inner peripheral side of the endless ring shape is formed to be circular and the outer periphery is formed to be rectangular). In addition, ground terminals which are inserted into through-holes are not formed on the surface mounting terminal surface 51*c*-1, and the surface mounting terminal surface 51*c*-1 is formed to be flat all around on the bottom surface of the connector main body. Note that an insulator 51*b* is present between the surface mounting terminal surface 51*c*-1 and the signal terminal 52 and thus insulation between the surface mounting terminal surface 51*c*-1 and the signal terminal 52 is ensured.

Figure 34:
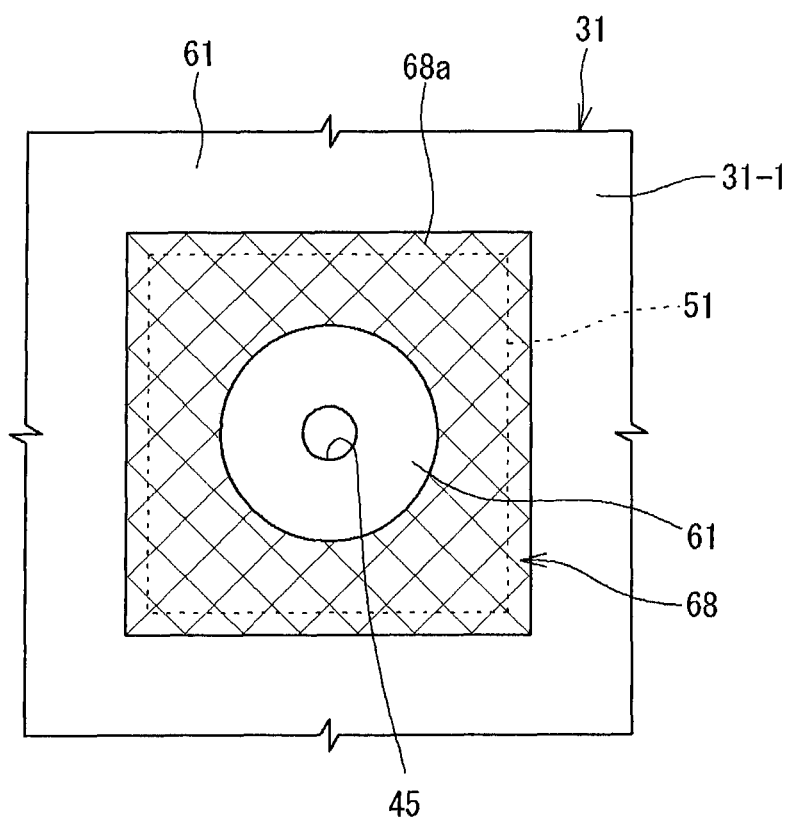
FIG. 34 is a plan view showing a through-hole and a land (a first surface of a board) in the third variant.
Figure 35:
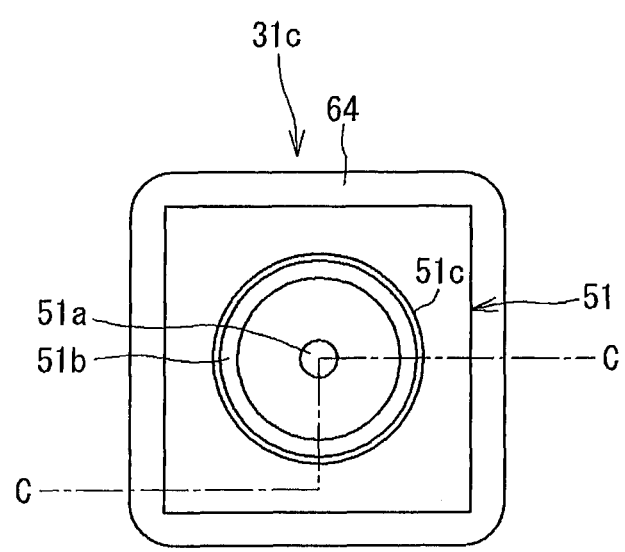
FIG. 35 is a plan view showing a mounting structure of the coaxial connector according to the third variant.
Figure 36:
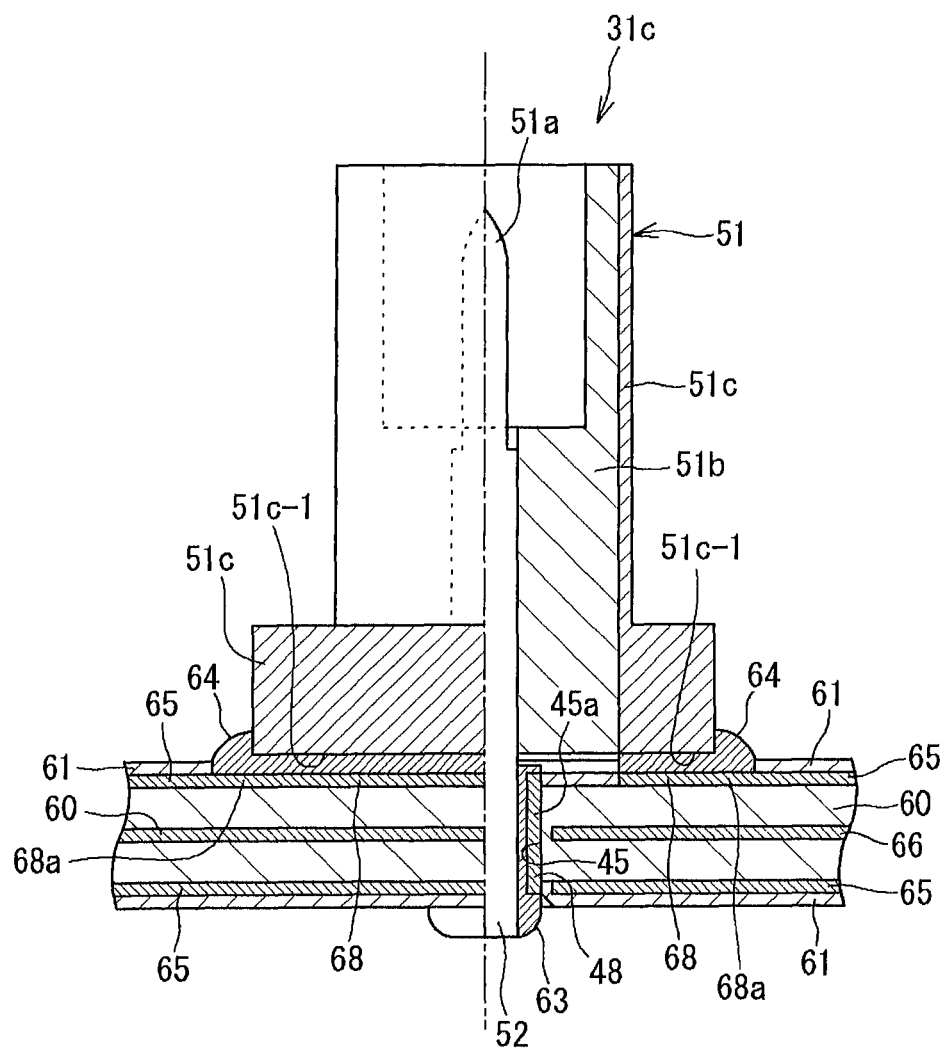
FIG. 36 is a cross-sectional view along line C-C of FIG. 35.

As shown in FIG. 34, a land 68 (an exposed portion of the ground pattern 65) facing the surface mounting terminal surface 51*c*-1 on the bottom surface of the connector main body 51 is formed on the first surface 31-1 of the board 31 on which the connector main body 51 of the coaxial connector 31*c* is surface-mounted.

The land 68 is formed to have substantially the same shape and same size as the surface mounting terminal surface 51*c*-1 on the bottom surface of the connector main body 51. Note, however, that in the present embodiment the land 68 is formed such that the size of its outer periphery is slightly larger than the outer periphery of the rectangular connector main body 51. Note that the land 68 may be formed such that its outer periphery perfectly coincides with the outer periphery of the surface mounting terminal surface 51*c*-1 on the bottom surface of the connector main body 51, or may be formed such that its outer periphery is smaller than the outer periphery of the surface mounting terminal surface 51*c*-1 on the bottom surface of the connector main body 51.

In addition, as with the surface mounting terminal surface 51*c*-1, the land 68 is continuously formed in a circumferential direction and surrounds the perimeter of a through-hole 45 without any gap. Therefore, when the connector main body 51 is placed on the land 68 and the signal terminal 52 is inserted into the through-hole 45, the land 68 surrounds the perimeter of the signal terminal 52.

Surface mounting of the connector main body 51 on the first surface 31-1 of the board 31 is performed by reflow soldering on the first surface 31-1 of the board 31. In reflow soldering, first, solder (cream solder) 64 is adhered (printed) to the portion of the land 68 on the first surface 31-1 of the board 31 (and other portions on the first surface 31-1 that require soldering). The solder is adhered to substantially the entire land 68. Then, the signal terminal 52 extending from the connector main body 51 is inserted into the through-hole 45, whereby the connector main body 51 is placed on the first surface 31-1. Note that at that time other circuit components to be placed on the first surface 31-1 are also placed. Thereafter, the board 31 is heated, melting the solder 64 and thereafter the solder 64 solidifies again, whereby the connector main body 51 is secured to the first surface 31-1. Note that since the land 68 is formed such that its outer peripheral side is larger than that of the connector main body 51, a portion of the solder 64 formed on an outer peripheral side 68*a* of the land 68 is also adhered to the side surface side of the outer conductor 51*c*. As a result, firm securing of the connector main body 51 is achieved.

By the connector main body 51 being soldered in the above-described manner, the solder 64 is present between the surface mounting terminal surface 51*c*-1 and the land 68 and thus the gap between the land 68 and the connector main body 51 is filled. The solder 64 surrounds the perimeter of the signal terminal 62 without any gap, between the land 68 and the connector main body 51 and thus entry of noise can be effectively prevented.

In the third variant, since the land 68 is formed all around the outer peripheral side of the through-hole 45 into which the signal terminal 52 is inserted (with an insulating area by a resist 61 therebetween), the solder 64 can be formed to surround the perimeter of the signal terminal 52 without any gap. Therefore, in the third variant, soldering on the side of the first surface 31-1 can be easily performed using normal surface mounting techniques such as reflow soldering. Note that soldering of the signal terminal 52 is also performed on the side of a second-surface 31-2, but since there are no ground terminals, soldering of ground terminals is not required.

FIGS. 37 to 40 show a fourth variant of the coaxial connector and the solder mounting structure.

Figure 37:
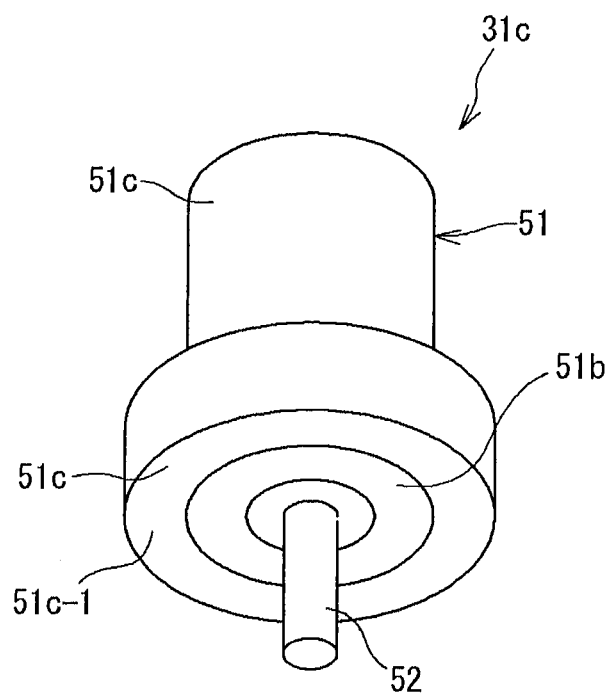
FIG. 37 is a perspective view of a coaxial connector according to a fourth variant.

While the surface mounting terminal surface 51*c*-1 on the bottom surface of the connector main body 51 of the third variant has, as shown in FIG. 33, a ring shape in which the inner peripheral side is formed to be circular and the outer peripheral side is formed to be rectangular, in the fourth variant, as shown in FIG. 37, a surface mounting terminal surface 51*c*-1 has a ring shape in which both the inner and outer peripheries are circular.

As shown in (a) of FIG. 38, a land 68 (an exposed portion of a ground pattern 65) facing the surface mounting terminal surface 51*c*-1 on a bottom surface of a connector main body 51 is formed on a first surface 31-1 of a board 31 on which the connector main body 51 of a coaxial connector 31*c* is surface-mounted, as shown in FIG. 34.

In response to the surface mounting terminal surface 51*c*-1 on the bottom surface of the connector main body 51 having a ring shape in which both the inner and outer peripheries are circular, the land 68 is also formed in a ring shape in which both the inner and outer peripheries are circular.

In addition, as shown in (b) of FIG. 38, an exposed portion (land) 48 where a conductive material 45*a* is exposed to a front surface of a second surface 31-2 of the board 31 (which is not covered with a resist) is formed on the second surface 31-2 of the board 31.

The coaxial connector according to the fourth variant also has a through-hole insertion terminal (signal terminal) 52 extending from an inner conductor 51*a* of the connector main body 51 of a coaxial structure, but does not have through-hole insertion terminals (ground terminals) extending from an outer conductor 51*c* of the connector main body 51. In the coaxial connector 31*c*, the outer conductor 51*c* on the bottom surface of the connector main body 51 is soldered by a reflow soldering process so as to be connected to the circuit pattern (ground pattern 65) on the circuit board. That is, the connector main body 51 of the fourth variant is surface-mountable.

Meanwhile, the signal terminal 52 is mounted on the board 31 by a DIP type scheme in which the signal terminal 52 is mounted using a through-hole.

Surface mounting of the connector main body 51 on the first surface 31-1 of the board 31 is performed by reflow soldering on the first surface 31-1 of the board 31, as in the third variant. By the connector main body 51 being soldered, solder 64 is present between the surface mounting terminal surface 51*c*-1 and the land 68 and thus the gap between the land 68 and the connector main body 51 is filled. The solder 64 surrounds the perimeter of the signal terminal 62 without any gap, between the land 68 and the connector main body 51 and thus entry of noise can be effectively prevented.

Moreover, in the fourth variant, since the outer periphery of the surface mounting terminal surface 51*c*-1 is circular, a soldering process is facilitated and entry of noise can be surely prevented.

Note that soldering of the signal terminal 52 is also performed on the side of the second-surface 31-2, but since there are no ground terminals, soldering of ground terminals is not required.

Note also that the points, the description of which is omitted in the fourth variant are the same as those in the third variant.

[Chapter 3 Shield Structure]

The inventors of the present invention have grasped in the process of development to improve the minimum receive sensitivity of a radio communication apparatus that if receive sensitivity is increased to a required standard, then a harmonic generated from a voltage controlled oscillator for generating a reference clock is included in a receive signal of the radio communication apparatus as noise, and have finally identified that this noise is the cause of not being able to satisfy the minimum receive sensitivity in the required standard.

Specifically, the inventors of the present invention have found out that a harmonic of the voltage controlled oscillator which is not problematic noise in a conventional radio communication apparatus becomes an obstacle to obtaining required receive sensitivity as a result of attempting to further increase receive sensitivity. In the radio communication apparatus, after amplifying a signal by an amplifier, the noise level of a harmonic of the voltage controlled oscillator relatively decreases and thus the harmonic is not problematic. A body of the amplifier which is a low-noise amplifier (LNA) has noise immunity. However, a path up to the point where a very weak receive signal is inputted to the amplifier is vulnerable to noise. Hence, the present invention proposes a configuration for solving a new problem of how to inhibit a harmonic from the voltage controlled oscillator from entering the amplifier.

For a configuration for solving such a problem, a shield for shielding a path up to the point where a receive signal is inputted to the amplifier, from the voltage controlled oscillator may be provided. For more specific and practical configurations, it is considered to:

(a) provide a shield that covers at least the input side of the amplifier; or (b) provide a shield serving as a cover that covers the voltage controlled oscillator. In chapter 3, embodiments showing these configurations will be described.

[3.1 First Embodiment in Chapter 3]

The overall configuration of a radio communication apparatus 1 according to a first embodiment in chapter 3 is the same as that of a radio communication apparatus 1 in chapter 2. Description of FIGS. 17 and 18 made in chapter 2 is incorporated in chapter 3.

FIG. 41 is a diagram showing a part of an internal circuit of a duplexer 33. As described above, the duplexer 33 includes a first connector 33a on the antenna side; a second connector 33b on the transmitting side; and a third connector 33c on the receiving side. An internal transmitting-side circuit includes a band-pass filter 331 between the first connector 33a and the second connector 33b. In a receiving-side circuit, a band-pass filter 332 and an amplifier 37 are provided between the first connector 33a and the third connector 33c. Namely, the configuration is such that the amplifier 37 resides in the duplexer 33 which is essentially a different component.

FIG. 42 is a diagram showing three-side external appearances of the duplexer 33 which is an example of an actual product, and when (a) of FIG. 42 is a front view, (b) of FIG. 42 is a bottom view and (c) of FIG. 42 is a side view. The duplexer 33 has a hermetically sealed case 33d made of a metal (made of a conductive material). Four coaxial connectors (e.g., N-J type) are provided on one end surface of the case 33d and one of them is the above-described first connector 33a. In addition, six coaxial connectors (e.g., SMA-J type) are provided on another end surface of the case 33d and two of them are the above-described second connector 33b and third connector 33c. Each of these connectors has an excellent function of preventing entry of noise by a radio-frequency coaxial structure. In addition, since the connectors are directly mounted on the case 33d which is a metal, to penetrate therethrough, entry of noise from the mounting locations is also prevented. In addition, since the case 33d is hermetically sealed, entry of noise is prevented.

Next, description is made focusing on a receiving system in radio equipment 3 of the radio communication apparatus 1 configured in the above-described manner. As described above, the receiving system is vulnerable to noise up to the point where a very weak radio wave is received and the radio wave is amplified.

FIG. 43 is a diagram showing a circuit configuration of the receiving system of the radio equipment 3. In the drawing, a board 31 of the radio equipment 3 is provided with a receiver (analog signal processing unit) 35 and a clock circuit 36. The clock circuit 36 includes a PLL (Phase Lock Loop) 40 and a Voltage Controlled Oscillator (VCO) 41.

The receiver 35 includes a mixer 38 and an A/D converter (ADC) 39. The amplifier 37 that is supposed to be present on the input side of the mixer 38 is provided in a case of the duplexer 33. The amplifier 37 is configured by a low-noise amplifier (LNA) and amplifies a receive signal. The mixer 38 performs frequency conversion of the receive signal amplified by the amplifier 37. The A/D converter 39 converts the analog receive signal provided from the mixer 38 into a digital signal. The receive signal converted by the A/D converter 39 into the digital signal is outputted to a base station main body 2 (FIG. 1) through a digital signal processing unit (not shown) provided on the board 31.

The A/D converter 39 is connected to the PLL 40, and samples an analog receive signal based on an operation clock provided from the PLL 40 and outputs the receive signal having been converted into a digital signal.

The PLL 40 is to allow free-running oscillation output from the voltage controlled oscillator 41 to achieve phase synchronization with a reference clock (RefCLK). Output from the PLL 40 is supplied to the A/D converter 39, etc., as an operation clock. The voltage controlled oscillator 41 provides a reference clock which serves as a reference operation clock, to the PLL 40.

For the PLL 40, for example, an integer frequency division type PLL can be adopted. The integer frequency division type PLL 40 frequency-divides, by a frequency divider housed in the PLL 40, clock output provided from the voltage controlled oscillator 41 into the same clock frequency as the reference clock, and compares the phase difference between the frequency-divided clock and the reference clock. The PLL 40 provides the phase difference component to the voltage controlled oscillator 41 as a control signal for synchronization. The voltage controlled oscillator 41 has the function of controlling, based on the control signal, a clock oscillated thereby such that the clock and the reference clock have a constant phase difference.

The above-described reference clock is at 30.72 MHz and the oscillation frequency of a clock which is free-running oscillated by the voltage controlled oscillator 41 is 245.76 MHz.

Note that the A/D converter 39 of the present embodiment operates by being provided with an operation clock of 122.88 MHz. Hence, the output from the PLL 40 is frequency-divided into 122.88 MHz by the frequency divider not shown, and is then supplied to the A/D converter 39 as an operation clock.

The voltage controlled oscillator 41 generates, in addition to an oscillation frequency (245.76 MHz) to be outputted essentially, a harmonic that is an integer multiple of the oscillation frequency. The harmonic may become noise. The inventors of the present invention have found that, though the intensity of the harmonic is not so high, as a result of improving receive sensitivity, as viewed from a receive signal with a relatively low intensity, the intensity becomes a non-negligible level. Therefore, if a harmonic generated from the voltage controlled oscillator 41 is in the range of the frequency band of a receive signal, then the harmonic becomes noise, adversely affecting reception.

FIG. 44 shows a state in which an 8× wave of an oscillation frequency (245.76 MHz) outputted from the voltage controlled oscillator 41 is included in the range of 1920 MHz to 1980 MHz which is the frequency band of a receive signal. Note that for harmonics from the voltage controlled oscillator 41, frequencies that are other integer multiples than 8× are also present, but harmonics out of the frequency band of the receive signal do not become noise on a signal. Note that to avoid a harmonic from the voltage controlled oscillator 41 from becoming noise, it is considered to select the oscillation frequency of the voltage controlled oscillator 41 such that all of the harmonics of the oscillation frequency outputted from the voltage controlled oscillator 41 are frequencies out of the frequency band of the receive signal, but in that case, flexibility in the selection of the oscillation frequency of the voltage controlled oscillator 41 decreases.

When a harmonic of the oscillation frequency (245.76 MHz) outputted from the voltage controlled oscillator 41 is included in the range of the frequency band of the receive signal, to reduce the influence of the harmonic on receive sensitivity, there is a need to prevent as much as possible the harmonic from getting on the receive signal.

FIG. 45 is a cross-sectional view showing disposition of main components in a housing 30 of the radio equipment 3 and disposition of circuit components, etc., provided on the board 31. The housing 30 is made of a metal, i.e., made of a conductive material, and shields an internal circuit and components from external noise and prevents internal noise from exiting to the outside. The board 31 is mounted on support portions 43 which protrude from the housing 30 and are integrally formed with the housing 30.

The clock circuit 36 is provided on a first surface 31-1 of the board 31. That is, the voltage controlled oscillator 41 is provided on the first surface 31-1 of the board 31. The voltage controlled oscillator 41 radiates, in addition to its original oscillation frequency, harmonics that are integer multiples of the oscillation frequency, though the intensity of the harmonics is relatively weak.

In addition, a connector 31c of a coaxial structure is also mounted on the first surface 31-1. The connector 31c is mounted on the board 31 such that a signal terminal which is a center conductor is inserted into a through-hole penetrating through the board 31 and is soldered on the side of a second surface 31-2 of the board.

To the connector 31c is connected the coaxial cable 34c that connects the connector 31c to the third connector 33c provided on the case of the duplexer 33. Note that plug connectors (coaxial connectors) 34c-1 and 34c-2 are provided at the respective ends of the cable 34c, and the plug connectors 34c-1 and 34c-2 are respectively connected to the connector 31c on the board 31 and the third connector 33c of the duplexer 33.

The receiver (analog signal processing unit) 35 is provided on the second surface 31-2 of the board 31. In addition, a signal line pattern (not shown) extending from the through-hole into which the signal terminal of the connector 31c is inserted is formed on the second surface 31-2 of the board 31, and the A/D converter 39, etc., are disposed on the signal line pattern.

In FIG. 45, as described above, the amplifier 37 is present in the duplexer 33 and is shielded by the case 33d from the voltage controlled oscillator 41. Since the case 33d is hermetically sealed, the first connector 33a and the third connector 33c also prevent entry of noise. Therefore, harmonic noise radiated from the voltage controlled oscillator 41 does not reach the input side of the amplifier 37. As such, by using the case 33d of the duplexer 33 as a shield, a path up to the point where a receive signal from an antenna 4 is inputted to the amplifier 37 can be shielded from the voltage controlled oscillator 41. Note that since the first connector 33a penetrates through the housing 30 and is secured by a lock nut, a harmonic does not leak outside the housing 30.

According to the above-described structure, a path up to the point where a receive signal is inputted to the amplifier, which is a part vulnerable to noise, has a shield (the case 33d of the duplexer 33) that shields the path from the voltage controlled oscillator 41, whereby a harmonic of a frequency that is an integer multiple of an oscillation frequency radiated from the voltage controlled oscillator 41 can be prevented from entering the input side of the amplifier 37. Accordingly, even when the minimum receive sensitivity is improved in the radio communication apparatus 1, noise can be reduced.

In addition, by providing a shield (case 33d) that covers at least the input side of the amplifier 37, entry of noise can be surely prevented. Namely, entry of noise becomes particularly problematic when noise gets on a path up to the point where a signal is inputted to the amplifier 37. That is, since a receive signal before amplification is very weak, even if noise is very weak, the adverse influence of the noise is relatively great. After amplification by the amplifier 37, the signal level is increased and thus the relative influence of noise is small.

In addition, by the radio communication apparatus 1 having the duplexer 33 including the amplifier 37, a shield (case 33d) is integrated with a component, resulting in a simple configuration. In addition, since the operation of separately providing a shield is not necessary, the manufacturing process is also simple, making it possible to reduce overall cost. Note that since the duplexer 33 is a component present closest to the antenna side, the amplifier 37 is also logically present on the antenna side, and thus, a distance from the voltage controlled oscillator 41 is easily kept, which point is also advantageous to prevent entry of noise.

[3.2 Comparative Example]

FIGS. 46 and 47 are diagrams of a comparative example respectively corresponding to FIGS. 43 and 45 in the above-described embodiment. The difference therebetween is that in the comparative example an amplifier 37 is provided on a board 31 instead of inside a case 33d of a duplexer 33. In this case, as shown in FIG. 47, the amplifier 37 is provided on a second surface 31-2 of the board 31.

In FIG. 47, in a path up to the point where a receive signal is inputted to the amplifier 37, the inside of the case 33d of the duplexer 33 is shielded by the case 33d from a voltage controlled oscillator 41. A cable 34c and its connectors (33c/34c-2 and 31c/34c-1) all have a coaxial structure and have a shield function. Therefore, entry of a harmonic can be prevented. Furthermore, the amplifier 37 is present in a so-called lunchbox-shaped container using a housing 30 as its bottom surface and support portions 43 as its side surfaces. The board 31 has a shield function like a metal plate by ground patterns (not shown) provided on both sides thereof and an intermediate ground pattern 66. Therefore, the amplifier 37 is basically supposed to be shielded from the voltage controlled oscillator 41.

However, resists which are an insulating material are provided on the surfaces of the board 31. Hence, findings that noise enters through, for example, a resist present between the connector 31*c* and the board 31 have been obtained by an experiment conducted by the inventors. Namely, with a structure in which a connector is mounted on a board, even if the connector is a coaxial connector, as much noise sealing effect as that obtained in the case of mounting the connector on a housing or case made of a metal cannot be obtained. In addition, since the voltage controlled oscillator 41 and the connector 31*c* are present on the same surface (first surface 31-1) of the board 31, it invites a situation where noise easily enters through, in particular, a resist present between the connector 31*c* and the board 31.

However, even in such a situation, by providing the amplifier 37 in the case 33*d* of the duplexer 33 as in the above-described first embodiment, a harmonic can be surely prevented from becoming noise without influenced by a vulnerable point at the junction of the board 31 and the connector 31*c*.

[3.3 Second Embodiment in Chapter 3]

Next, FIG. 48 is a cross-sectional view showing disposition of main components in a housing 30 of radio equipment 3 which is a part of a radio communication apparatus according to a second embodiment, and disposition of circuit components, etc., provided on a signal processing circuit board 31.

The difference from FIG. 47 (comparative example) is that a lid-like cover 70 made of a conductive material which completely covers a voltage controlled oscillator 41 is provided.

The cover 70 may simply cover the oscillator 41 but it is preferred that the cover 70 be mounted so as to, for example, come into intimate contact with a ground pattern 65 prepared around the voltage controlled oscillator 41. By this, the cover 70 reaches ground level and shields, together with a ground pattern 66, etc., on the board 31, the voltage controlled oscillator 41 from the outside so that a harmonic radiated from the voltage controlled oscillator 41 does not exit to the outside. In this case, radiation of a harmonic from the voltage controlled oscillator 41 can be directly suppressed (i.e., a noise source is shielded and isolated). By this, when looking at it from the other way around, all other portions than the voltage controlled oscillator 41, such as an amplifier 37, are shielded from the voltage controlled oscillator 41.

According to the structure of the second embodiment, by providing a shield serving as the cover 70 covering the voltage controlled oscillator 41, radiation of a harmonic is suppressed from its source. As a result, a harmonic can be prevented from entering the input side of the amplifier 37.

Accordingly, even when the minimum receive sensitivity is improved in a radio communication apparatus 1, noise can be reduced.

Note that in the case of the second embodiment the operation of placing the cover 70 is required, but the cover 70 itself which is a component can be formed in a simple shape and at low cost.

Note that in the event of a harmonic leaking from somewhere in the circuit on the board 31 instead of being radiated from the voltage controlled oscillator 41 itself, the cover 70 of the second embodiment cannot securely prevent entry of the harmonic into the amplifier 37. However, when, as in the first embodiment, the amplifier 37 is provided in the case 33*d* of the duplexer 33, regardless of where in the circuit on the board 31*a* harmonic leaks from, the harmonic can be securely prevented from entering the amplifier 37. In terms of this function and effect, the first embodiment is superior to the second embodiment.

[3.4 Others]

Note that the configurations of the above-described first and second embodiments may be combined with each other.

Note also that although in the first embodiment the case 33*d* of the duplexer 33 is used as a shield, the component used as a shield is not limited thereto and any other antenna-side component contained in a hermetically sealed container may be used. Basically, the configuration can be any as long as an amplifier is provided closer to the antenna side than the connector 31*c* and a shield covers at least the input side of the amplifier. Namely, the configuration can be any as long as entry of noise can be securely prevented by providing a shield that covers the input side of the amplifier which is a part vulnerable to noise. In that case, since the connector 31*c* is present on the output side of the amplifier, such a low-level harmonic as a harmonic of the voltage controlled oscillator 41 is not particularly problematic as noise.

In addition to a configuration in which, as in the first embodiment, at least the input side of the amplifier 37 which is a portion to be protected is contained in a case or the voltage controlled oscillator 41 which is a harmonic oscillation source is covered by a cover, a configuration is also considered in which a metal plate that partitions between two ((the input side of) the amplifier/the voltage controlled oscillator) in the housing 30 without any gap is provided.

Note that the communication standard to which the radio communication apparatuses of the present invention conform is not limited to LTE and other communication standards may be used.

Note also that although a metal is suitable as a conductive material forming a shield, in addition thereto, a conductive plastic or carbon, etc., can also be used.

[Chapter 4 Additional Notes]

For the present invention, the embodiments disclosed herein are to be considered in all respects as illustrative and not restrictive. The scope of the present invention is intended to include all changes which come within the meanings and range of equivalency of the claims, rather than the foregoing meaning.

In addition, the techniques described in chapters 1, 2, and 3 can be used in combination with one another.

What is claimed is:

1. A radio communication apparatus capable of receiving a radio signal, the radio communication apparatus comprising:
   an oscillator;
   an amplifier that amplifies a received signal,
   the oscillator generating an oscillation frequency that is in a range of a frequency band of the radio signal and a harmonic of the oscillator having at least one of frequency that is an integer multiple of the oscillation frequency;
   a path arranged up to a point where the received signal is inputted to the amplifier such that the harmonic is prevented from getting on the received signal as noise;
   a coaxial connector to which is connected a cable through which the received signal flows; and
   a signal processing circuit board on which the coaxial connector and the amplifier are mounted,
   the coaxial connector including
      a connector main body of a coaxial structure having an inner conductor and an outer conductor; and
      a through-hole insertion terminal extending from the inner conductor of the connector main body, the through-hole insertion terminal extending from the inner conductor of the connector main body is inserted in a through-hole made in the signal processing circuit board, and an outer conductor of the connector main body does not have a through-hole insertion terminal extending from the outer conductor, and is surface-mounted on the circuit board.

2. The radio communication apparatus according to claim 1, wherein
the outer conductor of the connector main body has a surface mounting terminal surface in a shape surrounding a perimeter of the through-hole insertion terminal extending from the inner conductor.

3. A radio communication apparatus capable of receiving a radio signal, the radio communication apparatus comprising:
an oscillator,
an amplifier that amplifies a received signal,
the oscillator generating an oscillation frequency that is in a range of a frequency band of the radio signal and a harmonic of the oscillator having at least one of frequency that is an integer multiple of the oscillation frequency;
a path arranged up to a point where the received signal is inputted to the amplifier such that the harmonic is prevented from getting on the received signal as noise;
a coaxial connector to which is connected a cable through which the received signal flows; and
a signal processing circuit board on which the coaxial connector and the amplifier are mounted,
the coaxial connector including a connector main body having an outer conductor provided on a surface thereof; and a signal terminal extending from the connector main body, and the connector main body being disposed on a first surface of the signal processing circuit board and the signal terminal being inserted into a through-hole made in the signal processing circuit board, and
the outer conductor of the connector main body being connected by solder to a ground that is formed near the connector main body, on the first surface of the signal processing circuit board.

4. The radio communication apparatus according to claim 3, wherein
the oscillator is provided on the first surface of the signal processing circuit board.

5. The radio communication apparatus according to claim 3, wherein
at least a part of the connector main body is disposed on a resist formed on the first surface of the signal processing circuit board.

6. The radio communication apparatus according to claim 3, wherein
the signal terminal is connected to a signal line that is formed on a second surface of the signal processing circuit board, the second surface being a back surface of the first surface.

7. The radio communication apparatus according to claim 6, wherein
the amplifier amplifies the received signal guided through the connector, the amplifier being connected to the signal line that is connected to the signal terminal.

8. The radio communication apparatus according to claim 3, wherein
the solder connects the outer conductor to the ground on the first surface such that the solder surrounds the signal terminal.

9. A radio communication apparatus capable of receiving a radio signal, the radio communication apparatus comprising:
an oscillator
an amplifier that amplifies a received signal,
the oscillator generating an oscillation frequency that is in a range of a frequency band of the radio signal and a harmonic of the oscillator having at least one of frequency that is an integer multiple of the oscillation frequency;
a path arranged up to a point where the received signal is inputted to the amplifier such that the harmonic is prevented from getting on the received signal as noise;
a shield that shields the path up to the point where the received signal is inputted to the amplifier, from the harmonic of the oscillator, the shield covering at least an input side of the amplifier; and
a duplexer for sharing an antenna between transmission and reception, with the amplifier being provided in a case of the duplexer, whereby the case serves as the shield,
the oscillator being mounted on a board, and connected to an antenna-side component by a cable, with a connector of the cable being disposed on the board, and
the connector and the oscillator being provided on a same surface of the board.

10. A radio communication apparatus capable of receiving a radio signal, the radio communication apparatus comprising:
an oscillator;
an amplifier that amplifies a received signal,
the oscillator generating an oscillation frequency that is in a range of a frequency band of the radio signal and a harmonic of the oscillator having at least one of frequency that is an integer multiple of the oscillation frequency;
a path arranged up to a point where the received signal is inputted to the amplifier such that the harmonic is prevented from getting on the received signal as noise;
a board having a first principal surface and a second principal surface that face each other; and
a power supply circuit that supplies a variable power supply voltage to the amplifier for performing drain modulation,
the amplifier being disposed on the first principal surface,
the power supply circuit having an output portion that outputs the power supply voltage,
the amplifier having an input portion to which the power supply voltage is supplied, and
the output portion being located on a side of the second principal surface of the board and being connected to the input portion through a conductor penetrating through the board.

11. The radio communication apparatus according to claim 10, further comprising
a structure having an electromagnetic cut-off function and disposed on the side of the second principal surface of the board,
the output portion being located in a hermetically sealed space defined by the board and the structure.

12. The radio communication apparatus according to claim 10, wherein
the output portion is located immediately below a conductor connected to the input portion with the board interposed therebetween.

13. The radio communication apparatus according to claim 10, further comprising
a distortion compensating unit that corrects, based on an input signal to the amplifier apparatus and an output signal from the amplifier, the input signal.

* * * * *